US012770776B2

(12) United States Patent
Chang et al.

(10) Patent No.: US 12,770,776 B2
(45) Date of Patent: Oct. 20, 2026

(54) POWER SUPPLY UNIT AND DC CONVERSION MODULE

(71) Applicant: DELTA ELECTRONICS, INC., Taoyuan City (TW)

(72) Inventors: Yi-Sheng Chang, Taoyuan City (TW); Cheng-Chan Hsu, Taoyuan City (TW); Chia-Wei Chu, Taoyuan City (TW); Chun-Yu Yang, Taoyuan City (TW); Deng-Cyun Huang, Taoyuan City (TW); Yi-Hsun Chiu, Taoyuan City (TW); Chien-An Lai, Taoyuan City (TW); Yu-Tai Wang, Taoyuan City (TW); Chi-Shou Ho, Taoyuan City (TW); Zhi-Yuan Wu, Taoyuan City (TW); Ko-Wen Lu, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 211 days.

(21) Appl. No.: 18/507,853

(22) Filed: Nov. 13, 2023

(65) Prior Publication Data

US 2024/0162833 A1 May 16, 2024

Related U.S. Application Data

(60) Provisional application No. 63/425,014, filed on Nov. 14, 2022.

(51) Int. Cl.
*H01F 27/28* (2006.01)
*H01F 3/14* (2006.01)
(Continued)

(52) U.S. Cl.
CPC ........... *H01F 27/2804* (2013.01); *H01F 3/14* (2013.01); *H01F 27/24* (2013.01); *H01F 27/29* (2013.01);
(Continued)

(58) Field of Classification Search
CPC ........ H01F 27/2804; H01F 3/14; H01F 27/24; H01F 27/29; H01F 2027/2809;
(Continued)

(56) References Cited

U.S. PATENT DOCUMENTS 6,124,778 A 9/2000 Rowley et al.
6,275,946 B1 8/2001 Meir
(Continued)

FOREIGN PATENT DOCUMENTS

CN 1998128 A 7/2007
CN 101917053 A 12/2010
(Continued)

OTHER PUBLICATIONS

Office Action dated Nov. 29, 2024 of the relating Taiwan patent application No. 112143653.
(Continued)

*Primary Examiner* — Gary L Laxton
(74) *Attorney, Agent, or Firm* — MUNCY, GEISSLER, OLDS & LOWE, P.C.

(57) ABSTRACT

A power supply unit supplies power to a load, and the power supply unit includes a power factor corrector, a DC conversion module, and an isolated conversion module. The power factor corrector is plugged into a first main circuit board and converts an AC power into a DC power. The DC conversion module is plugged into the first main circuit board and converts the DC power into a main power. The isolated conversion module includes a bus capacitor, the bus capacitor is coupled to the DC conversion module through a first power copper bar, and coupled to the power factor corrector through a second power copper bar. The first power copper bar and the second power copper bar are arranged on a side opposite to the first main circuit board, and are arranged in parallel with the first main circuit board.

14 Claims, 69 Drawing Sheets

(51) Int. Cl.

| | |
|---|---|
| ***H01F 27/24*** | (2006.01) |
| ***H01F 27/29*** | (2006.01) |
| ***H02M 3/00*** | (2006.01) |
| ***H02M 3/335*** | (2006.01) |
| ***H02M 7/219*** | (2006.01) |
| ***H02M 7/23*** | (2006.01) |
| ***H05K 1/16*** | (2006.01) |

(52) U.S. Cl.
CPC ......... *H02M 3/01* (2021.05); *H02M 3/33507* (2013.01); *H02M 7/219* (2013.01); *H02M 7/23* (2013.01); *H05K 1/165* (2013.01); *H01F 2027/2809* (2013.01); *H01F 2027/2819* (2013.01)

(58) Field of Classification Search
CPC ............ H01F 2027/2819; H02M 3/01; H02M 3/33507; H02M 7/219; H02M 7/23; H05K 1/165
See application file for complete search history.

(56) References Cited

U.S. PATENT DOCUMENTS

| | | | | |
|---|---|---|---|---|
| 8,243,960 | B2 | 8/2012 | Nussbaum | |
| 8,258,910 | B2 | 9/2012 | Herhold | |
| 10,003,275 | B2 | 6/2018 | Chen | |
| 10,225,935 | B2 | 3/2019 | Chen et al. | |
| 10,381,914 | B2 | 8/2019 | Chen et al. | |
| 10,516,339 | B2 | 12/2019 | Chen | |
| 11,323,042 | B2 | 5/2022 | Hano et al. | |
| 11,456,549 | B2 | 9/2022 | Tsai et al. | |
| 11,569,031 | B2 | 1/2023 | Wang et al. | |
| 2004/0130318 | A1 | 7/2004 | Saltsov et al. | |
| 2005/0270745 | A1 | 12/2005 | Chen et al. | |
| 2014/0218144 | A1 | 8/2014 | Park et al. | |
| 2015/0124489 | A1 | 5/2015 | Dai et al. | |
| 2015/0131353 | A1 | 5/2015 | Nakajima | |
| 2016/0134195 | A1 | 5/2016 | Song et al. | |
| 2017/0345756 | A1 | 11/2017 | Yin et al. | |
| 2019/0059179 | A1* | 2/2019 | Liu | H05K 7/1492 |
| 2019/0122814 | A1 | 4/2019 | Hung | |
| 2020/0211756 | A1 | 7/2020 | Wu et al. | |
| 2020/0337169 | A1 | 10/2020 | Jank | |
| 2020/0395164 | A1 | 12/2020 | Ahmed et al. | |
| 2021/0050142 | A1* | 2/2021 | Zhang | H02M 3/155 |
| 2021/0166858 | A1 | 6/2021 | Saito et al. | |
| 2021/0351709 | A1* | 11/2021 | Uematsu | H02M 1/0012 |
| 2022/0029649 | A1 | 1/2022 | Epstein | |
| 2022/0172880 | A1 | 6/2022 | Khaligh et al. | |
| 2022/0230797 | A1 | 7/2022 | Afsharian et al. | |
| 2022/0361353 | A1* | 11/2022 | Lohan | H02M 7/003 |
| 2023/0005659 | A1 | 1/2023 | Huang et al. | |
| 2023/0162905 | A1 | 5/2023 | Huang | |

FOREIGN PATENT DOCUMENTS

| | | | |
|---|---|---|---|
| CN | 103797550 | A | 5/2014 |
| CN | 102792584 | B | 8/2016 |
| CN | 205789421 | U | 12/2016 |
| CN | 106484045 | A | 3/2017 |
| CN | 106655721 | A | 5/2017 |
| CN | 106876101 | A | 6/2017 |
| CN | 206370781 | U | 8/2017 |
| CN | 107437885 | A | 12/2017 |
| CN | 109546872 | A | 3/2019 |
| CN | 107818865 | B | 5/2019 |
| CN | 210534679 | U | 5/2020 |
| CN | 112908606 | A | 6/2021 |
| CN | 114724846 | A | 7/2022 |
| CN | 114914071 | A | 8/2022 |
| CN | 111373645 | B | 9/2022 |
| CN | 115347794 | A | 11/2022 |
| CN | 217820500 | U | 11/2022 |
| CN | 218123152 | U | 12/2022 |
| CN | 115588550 | A | 1/2023 |
| EP | 0886911 | B1 | 9/2004 |
| EP | 3629463 | A1 | 4/2020 |
| JP | 2011077328 | A | 4/2011 |
| TW | 201917745 | A | 5/2019 |
| WO | 2004055739 | A1 | 7/2004 |
| WO | 2024077528 | A1 | 4/2024 |

OTHER PUBLICATIONS

M. Z. Hossain et al: "Recent progress and development on power DC-DC converter topology, control, design and applications: A review" Renewable and Sustainable Energy Reviews, vol. 81, Oct. 3, 2017 (Oct. 3, 2017), pp. 205-230, Subsection 3.1 Bridge/multiphase bridge converter; Subsection 3.5 Other PDDC topologies; Subsection 4.1: Recent progress in modulation and control techniques; Subsection 4.2 Other control techniques; Subsections 7.1-7.4; Figs. 2, 5, 9, 34, 35-37, 39, 41, 43.

Search Report dated Mar. 4, 2024 of the corresponding European patent application No. 23209486.2.

Search Report dated Mar. 22, 2024 of the related European patent application No. 23209566.1.

Office Action dated Jun. 12, 2024 of the related Taiwan patent application No. 112143640.

Search Report dated Mar. 22, 2024 of the related European patent application No. 23209485.4.

Saijuan Zhu et al "Research on a High-Efficiency Half-Turn Matrix Planar Transformer Structure for LLC Resonant Converter," 2020 21st International Conference on Electronic Packaging Technology (ICEPT), IEEE, Aug. 12, 2020, pp. 1-6.

Zhaotian Yan et al "Optimized Design of Integrated Planar Matrix Transformer for LLC Converter in Consumer Electronics," IEEE Journal of Emerging and Selected Topics in Power Electronics, IEEE, Piscataway, NJ, USA, vol. 10, No. 2, Oct. 26, 2021, pp. 2254-2264.

Yinsong Cai et al, "Optimized Design of Integrated PCB-Winding Transformer for MHz LLC Converter," 2019 IEEE Applied Power Electronics Conference and Exposition (APEC), IEEE, Mar. 17, 2019, pp. 1452-1458.

Search Report dated Apr. 4, 2024 of the related European patent application No. 23209562.0.

Search Report dated Jun. 10, 2024 of the related European patent application No. 23209405.2.

Gadelrab Rimon et al: "LLC Resonant Converter with 99% Efficiency for Data Center Server", 2021 IEEE Applied Power Electronics Conference and Exposition (APEC), Jun. 14, 2021 (Jun. 14, 2021), pp. 310-319, XP093403297, DOI: 10.1109/apec42165.2021.9487423.

Nabih Ahmed et al: "Dimensional Effects of Core Loss and Design Considerations for High Frequency Magnetics", 2021 IEEE Energy Conversion Congress and Exposition (ECCE), Oct. 10, 2021 (Oct. 10, 2021), pp. 5488-5495, XP093403290, DOI: 10.1109/ecce47101.2021.9595465.

Jphn Wanes : "A novel integrated packaging technique for high density DC-DC converters providing enhanced efficiency and thermal management", 2004 IEEE Applied Power Electronics Conference and Exposition, APEC 04 IEEE, Anaheim, CA, USA, vol. 2, Feb. 22, 2004 (Feb. 22, 2004), pp. 1229-1235, XP010705306, DOI: 10.1109/APEC2004.1295979, ISBN: 9780780382695; abstract; figures 2,7, 11, 16.

Office Action dated Jun. 10, 2026 of the relating European patent application No. 23209562.0.

Office Action dated Jun. 29, 2026 of the relating U.S. Appl. No. 18/507,694.

Search Report dated Aug. 11, 2026 of the relating European divisional patent application No. 26174196.1.

* cited by examiner

CR_AUX

PFC+CR_SU+CR_M

POWER SUPPLY UNIT AND DC CONVERSION MODULE

CROSS-REFERENCE TO RELATED APPLICATION

This patent application claims the benefit of U.S. Provisional Patent Application No. 63/425,014, filed Nov. 14, 2022, which is incorporated by reference herein.

BACKGROUND

Technical Field

The present disclosure relates to a power supply, and more particularly to a universal redundant power supply.

Description of Related Art

The statements in this section merely provide background information related to the present disclosure and do not necessarily constitute prior art.

With the rapid development of the information industry, power supplies have played an indispensable role. The input voltage of information and household appliances is divided into AC voltage and DC voltage, and power supplies can generally be divided into two levels. In general, the front stage is usually an AC-to-DC converter, a power factor corrector or a DC-to-DC converter, and the rear stage usually includes a main converter and an auxiliary converter. The main converter and the auxiliary converter are usually DC-to-DC power converters, and the main converter usually needs to be equipped with high output power and high conversion efficiency functions. The main converter and auxiliary converter also usually need to have the function of isolating the primary side and the secondary side to electrically isolate the high voltage/low voltage.

However, in the power supplies of the prior art, the front-end AC-to-DC converter and the subsequent main converter and auxiliary converter are usually designed on a single motherboard, or are stacked by multiple circuit boards, and are connected by flying wires to couple each other. Therefore, it is inevitable that the power density of the power supply cannot be reduced, and the size of the power supply cannot be effectively reduced, resulting in the problem that the power supply is bulky and has poor power density.

Therefore, how to design a power supply and a DC conversion module to significantly reduce the circuit size of the power supply and the DC conversion module through special circuit structures to solve the problems and technical bottlenecks in the existing technology has become a critical topic in this field.

SUMMARY

An objective of the present disclosure is to provide a direct-current (DC) conversion module to solve the existing problems. The DC conversion module includes a first main circuit and two first circuit boards. The first main circuit board includes a first plug port and a second plug port. The two first circuit boards are respectively plugged into the first plug port and the second plug port. Each first circuit board includes a first switch bridge arm and a first controller. The first controller is coupled to the first switch bridge arm, and provides a first control signal to control the first switch bridge arm. A phase difference between the first control signals is 180 degrees, and the two first circuit boards are coupled to each other through the first plug port and the second plug port to form an interleaved DC conversion module.

Another objective of the present disclosure is to provide a direct-current (DC) conversion module to solve the existing problems. The DC conversion module includes a first main circuit board and three first circuit boards. The first main circuit board includes a first plug port, a second plug port, and a third plug port. The three first circuit boards are respectively plugged into the first plug port, the second plug port, and the third plug port. Each first circuit board includes a first transformer. The first transformer includes a first primary-side trace, a first secondary-side trace, and a first iron core. The first primary-side trace is formed on the first circuit board to serve as a first primary-side coil, and the first secondary-side trace is formed on the first circuit board to serve as a first secondary-side coil. The first iron core is sleeved on the first primary-side trace and the first secondary-side trace to serve as the first transformer. The first circuit boards are plugged into the first plug port, the second plug port, and the third plug port so that the first primary-side traces of the first circuit boards form a primary-side delta connection, and the first circuit boards are plugged into the first plug port, the second plug port, and the third plug port so that the first secondary-side traces of the first circuit boards form a secondary-side delta connection.

Another further objective of the present disclosure is to provide a power supply to solve the existing problems. The power supply includes a power factor corrector, a direct current (DC) conversion module, and an isolated conversion module. The power factor corrector is plugged into a first main circuit board, and converts an alternating current (AC) power source into a DC power source. The DC conversion module is plugged into first main circuit board, and converts the DC power source into a main power source. The isolated conversion module includes a bus capacitor, and the bus capacitor is coupled to the DC conversion module through a first power copper bar and is coupled to the power factor corrector through a second power copper bar. The first power copper bar and the second power copper bar are arranged on a side opposite to the first main circuit board, and are arranged parallel to the first main circuit board.

The main purpose and effect of the present disclosure is that the power supply saves circuit volume by plugging the power factor corrector, the DC conversion module, and the isolated conversion module into the main circuit board. Therefore, the space utilization of the power supply system can be greatly increased to meet high power density requirements.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
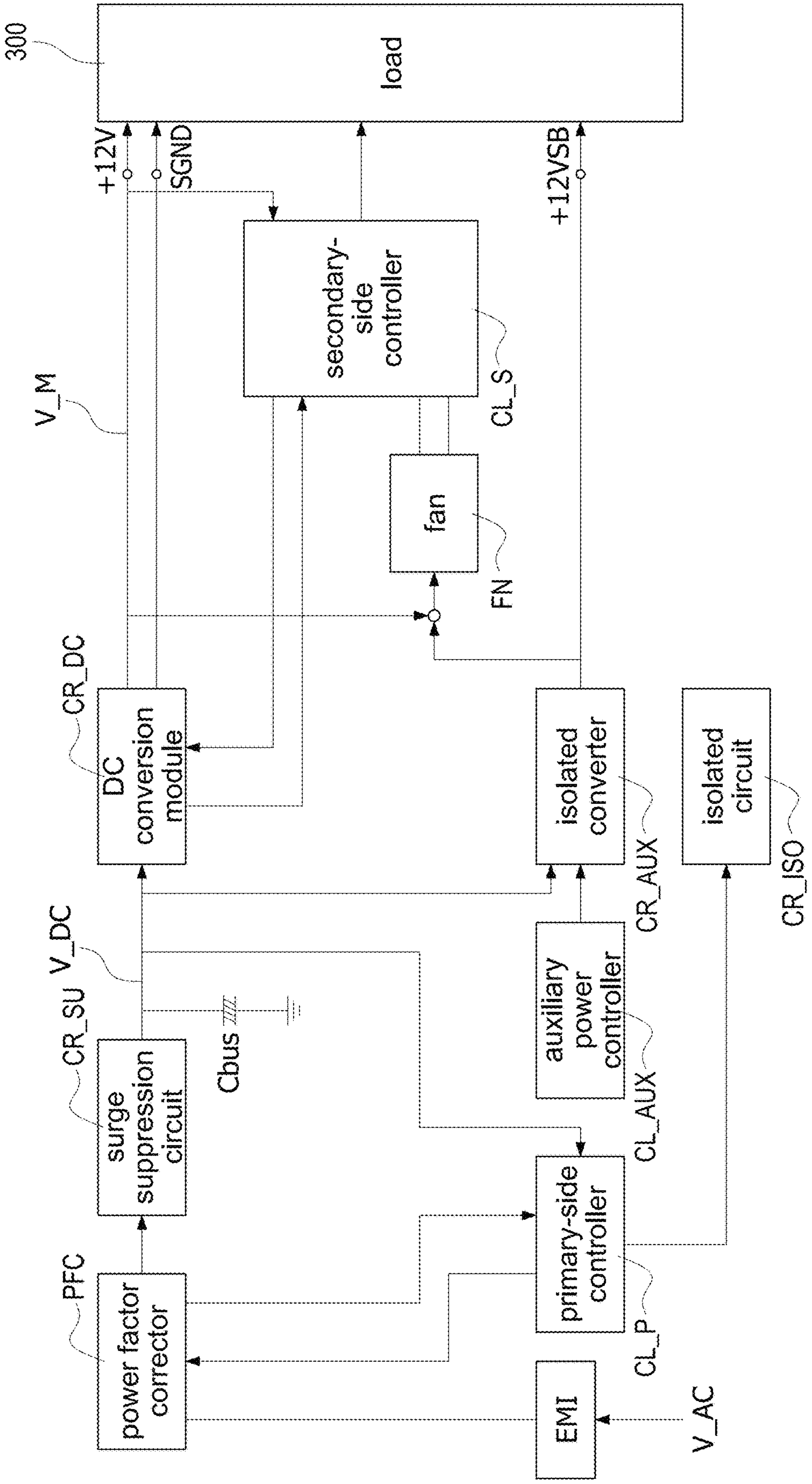
FIG. 1 is a block circuit diagram of a power supply of the present disclosure.

Reference will now be made to the drawing figures to describe the present disclosure in detail. It will be understood that the drawing figures and exemplified embodiments of present disclosure are not limited to the details thereof.

Reference will now be made to the drawing figures to describe the present disclosure in detail. It will be understood that the drawing figures and exemplified embodiments of present disclosure are not limited to the details thereof.

A. POWER SYSTEM Please refer to FIG. 1, which shows a block circuit diagram of a power supply of the present disclosure. The power supply PSU is coupled to a load 300, and provides a main power source V_M and an auxiliary power source V_AUX to supply power to the load 300. The load 300 may be, for example, but not limited to, a system device (such as a server, a power management device) with a central processor. In addition to being supplied to the load 300, the auxiliary power source V_AUX may also be used by internal devices (such as, but not limited to, controller fans, etc.) of the power supply PSU. The power supply PSU includes an electromagnetic interference suppression circuit EMI, a power factor corrector PFC, a bus capacitor Cbus, a DC conversion module CR_DC and an isolated converter CR_AUX. A first terminal of the power factor corrector PFC is coupled to the electromagnetic interference suppression circuit EMI, and a second terminal of the power factor corrector PFC is coupled to the DC conversion module CR_DC and the isolated converter CR_AUX through the bus capacitor Cbus. In particular, the power supply PSU of the present disclosure is a redundant power supply that complies with the CRPS (Common Redundant Power Supply) specification and is suitable for use as the main power source of the server.

The power supply PSU is divided into a primary side and a secondary side through electrical isolation components (such as, but not limited to, transformers, etc.) inside the DC conversion module CR_DC and the isolated converter CR_AUX. The power supply PSU further includes a primary-side controller CL_P, a secondary-side controller CL_S, and an auxiliary power controller CL_AUX. The primary-side controller CL_P, the secondary-side controller CL_S, and the auxiliary power controller CL_AUX are respectively coupled to the power factor corrector PFC, the DC conversion module CR_DC, and the isolated converter CR_AUX to control the power conversions of the respective circuits.

Moreover, the electromagnetic interference suppression circuit EMI is used to suppress the electromagnetic interference from an AC power source V_AC. The primary-side controller CL_P controls the power factor corrector PFC to convert the AC power source V_AC into a DC power source V_DC to store the DC power source V_DC in the bus capacitor Cbus. The secondary-side controller CL_S controls the DC conversion module CR_DC to convert the DC power source V_DC into the main power source V_M. The auxiliary power controller CL_AUX controls the isolated converter CR_AUX to convert the DC power source V_DC into the auxiliary power source V_AUX, so that the power supply PSU can receive the AC power source V_AC and provide the main power source V_M and the auxiliary power source V_AUX. In one embodiment, for example, but not limited to, the power factor corrector PFC may preferably be a bridgeless Totem-Pole interleaved converter; the DC conversion module CR_DC may preferably be a resonant converter (such as an LLC converter); the isolated converter CR_AUX may preferably be a flyback converter; the bus capacitor Cbus may preferably be a large-capacity (Bulk) capacitor, which is generally an electrolytic capacitor with large volume and capacity.

On the other hand, a path from the power factor corrector PFC to the bus capacitor Cbus may also include a surge suppression circuit CR_SU. The surge suppression circuit CR_SU is used to suppress the instantaneous large current caused by charging the bus capacitor Cbus by the DC power source V_DC when the bus capacitor Cbus is out of power. In addition, the secondary-side controller CL_S can communicate with the primary-side controller CL_P through the isolated circuit CR ISO, so as to realize each other's status and control the power conversion of their respective circuits. Moreover, the secondary-side controller CL_S may be coupled to an external device (such as, but not limited to, the load 300) through wires to communicate with the external device, so that the external device can control the power supply PSU by communicating with the secondary-side controller CL_S. Also, the secondary-side controller CL_S may be coupled to an auxiliary equipment (such as, but not limited to, a fan FN, etc.) inside the power supply PSU. Taking the fan FN as an example, the fan FN can receive the main power source V_M or the auxiliary power source V_AUX to operate, and the secondary-side controller CL_S provides control signals to control the rotation speed and/or the rotation direction of the fan FN.

Figure 2:
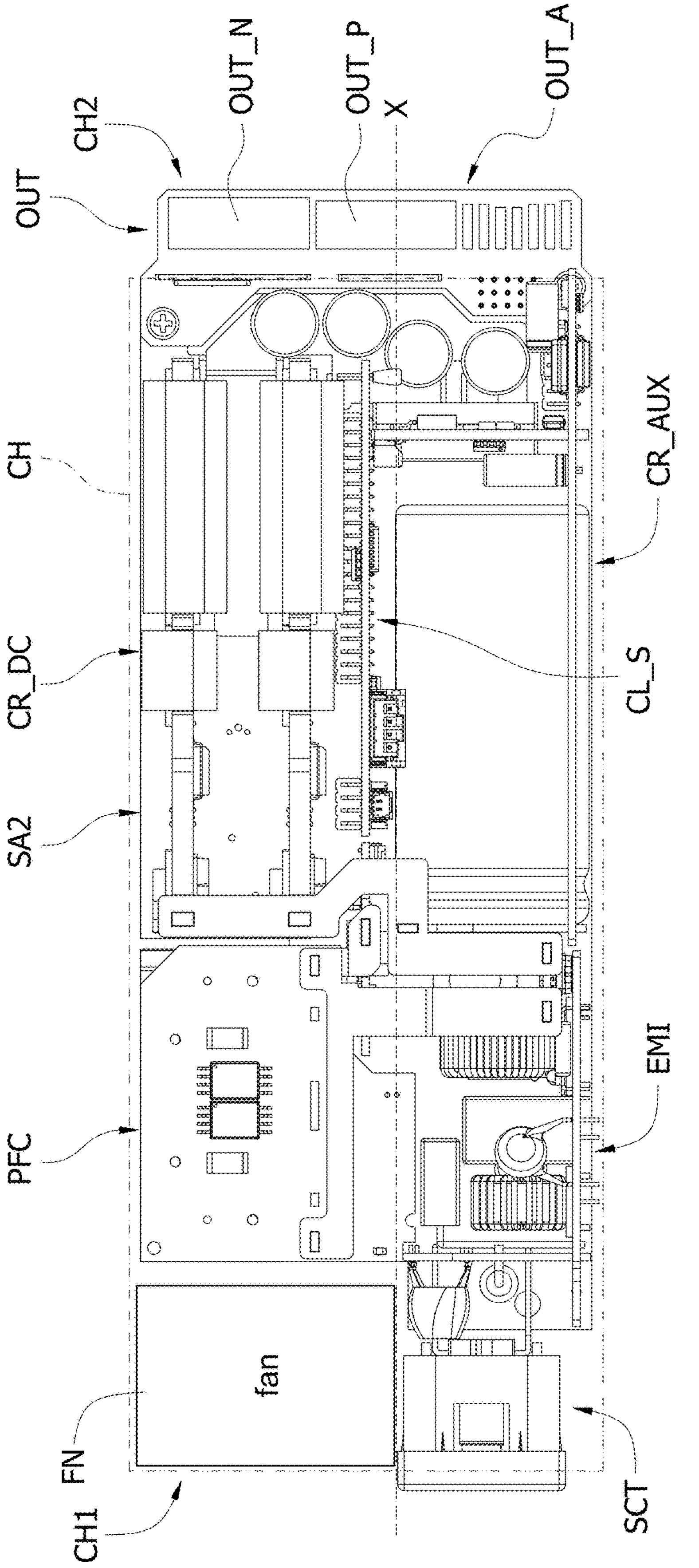
FIG. 2 is a schematic structural diagram of the power supply of the present disclosure.

Please refer to FIG. 2, which shows a schematic structural diagram of the power supply of the present disclosure, and also refer to FIG. 1. In FIG. 2, the power supply PSU further includes a casing CH, a socket part SCT, and an output port OUT. The casing CH has a first casing side CH1 and a second casing side CH2 opposite to the first casing side CH1. The casing CH includes a second accommodation space SA2, and the second accommodation space SA2 is used to accommodate the circuits shown in FIG. 1 (i.e., the power factor corrector PFC, the DC conversion module CR_DC, the isolated converter CR_AUX, and other circuits). The socket part SCT is disposed on a first side of the first casing side CH1 (i.e., one side of an axis X, shown below the axis X), and the fan FN is disposed on a second side of the first casing side CH1 (i.e., the other side of the axis X, shown above the axis X). The output port OUT forms a golden-finger structure, and the output port OUT is disposed on the second casing side CH2.

In particular, the fan FN is used to dissipate heat from circuit components inside the power supply PSU, especially high-power components such as power switches and rectification switches that are prone to heat generation and heat accumulation. On the other hand, the socket part SCT may be coupled to a plug (not shown) that provides the AC power source V_AC, and the output port OUT includes a positive connection terminal OUT_P, a negative connection terminal OUT_N, and an auxiliary terminal OUT_A. The positive connection terminal OUT_P and the negative connection terminal OUT_N are used to transmit the main power source V_M to the load 300, and the auxiliary terminal OUT_A is used to provide the auxiliary power source V_AUX and other control signals, such as the secondary-side controller CL_S shown in FIG. 1 (i.e., the plugged circuit board shown in FIG. 2) is used to communicate with external devices. In one embodiment, the configuration of the fan FN has the function of effectively increasing the heat dissipation efficiency of the power supply PSU. This will be further explained later and will not be described in detail here.

In FIG. 2, the power supply PSU is divided into several blocks, and each block is configured with the circuit shown in FIG. 1 and FIG. 2. In particular, in order to increase the heat dissipation efficiency, the power supply PSU uses a more special configuration. Specifically, since the power factor corrector PFC and the DC conversion module CR_DC have high-power output, and they are prone to generate and accumulate a large amount of heat during operation, the power factor corrector PFC and the DC conversion module CR_DC both with high power output are disposed on the second side (shown above the axis X) and the fan FN is also disposed above the axis X, so that the air sucked in/blown out by the fan FN passes through a cooling air channel formed by the power factor corrector PFC and the DC conversion module CR_DC for heat dissipation. Therefore, the heat accumulated in the high-power components that easily generate heat can be effectively dissipated, thereby providing better heat dissipation efficiency. On the other hand, since the electromagnetic interference suppression circuit EMI and the isolated converter CR_AUX are low-power circuit modules, and they are not easy to generate a large amount of heat during operation, they can be disposed on the first side (shown below the axis X). The circuit structure and characteristics of each block will be further described as follows.

B. Dc Conversion Module

B-1. DC Conversion Module Circuit Topology

Figure 3A:
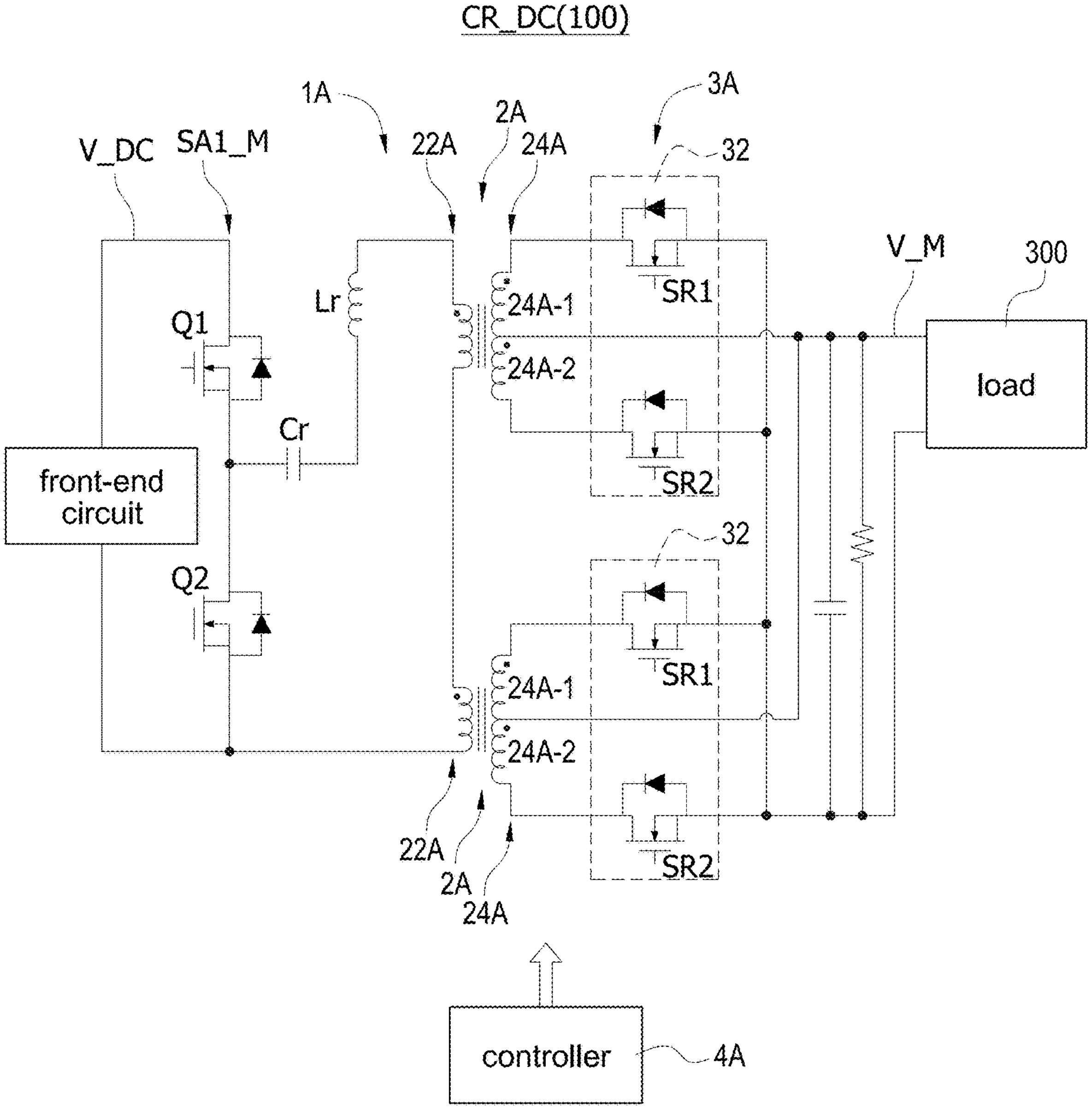
FIG. 3A is a circuit diagram of a DC conversion module according to a first embodiment of the present disclosure.

Please refer to FIG. 3A, which shows a circuit diagram of a DC conversion module according to a first embodiment of the present disclosure, and also refer to FIG. 1 to FIG. 2. In FIG. 3A, the DC conversion module CR_DC includes a single resonant converter 100 (here shown as a half-bridge LLC converter), and the resonant converter 100 may be coupled to a front-end circuit (that is, coupled to the power factor corrector PFC through the bus capacitor Cbus) and the load 300. The resonant converter 100 includes a first primary-side circuit 1A, at least one first transformer 2A (two transformers are shown as an example), at least one first secondary-side circuit 3A (two first secondary-side circuits are shown as an example), and a first controller 4A. Each first transformer 2A includes a first primary-side coil 22A and a first secondary-side coil 24A. Taking FIG. 3A as an example, the first primary-side circuit 1A is a half-bridge architecture, including one first switch bridge arm SA1_M and one resonant tank (i.e., a resonant inductor Lr and a resonant capacitor Cr connected in series, but not limited to this, and the first switch bridge arm SA1_M includes two power switches Q1,Q2 connected in series. Therefore, the switch bridge arm SA1_M and the first primary-side coil 22A are coupled with the resonant tank to form a primary side topology. The first secondary-side circuit 3A includes one rectification circuit 32, and the rectification circuit 32 includes rectification switches SR1,SR2. The first secondary-side coil 24A of the first transformer 2A includes a first winding 24A-1 and a second winding 24A-2, and the first winding 24A-1 and the second winding 24A-2 are center-tapped windings. Therefore, the first secondary-side coil 24A is coupled with the rectification circuit 32 to form a secondary side topology, and the resonant converter 100 can control the turning on/turning off of the rectification switches SR1,SR2 by the first controller 4A, so that the first winding 24A-1 and the second winding 24A-2 are respectively coupled to the first primary-side coil 22A.

In general, the first controller 4A controls the first switch bridge arm SA1_M and the rectification switches SR1,SR2 of the rectification circuit 32 to operate the resonant tank and the first transformer 2A storing energy and releasing energy so as to convert the DC power source V_DC received by the resonant converter 100 into the main power source V_M. Incidentally, the circuit structures of the first primary-side circuit 1A and the first secondary-side circuit 3A are only illustrative examples. As long as the first primary-side circuit 1A (such as, but not limited to, a full-bridge structure, two resonant tanks, etc.) and the first secondary-side circuit 3A (such as, but not limited to, a half-bridge rectification circuit, one rectification circuit, etc.) can form the structure of the resonant converter 100, should be included in the scope of this embodiment. In one embodiment, the number of the first transformers 2A is not limited to two as shown in FIG. 3A, i.e., the number of the first transformer 2A may be one or more than one. When the number of the transformer 2A is one, the resonant converter 100 includes one first primary-side coil 22A, one first winding 24A-1, and one second winding 24-2, and so on.

B-2. Power Input Terminal and Power Output Terminal of DC Conversion Module

Figure 3B:
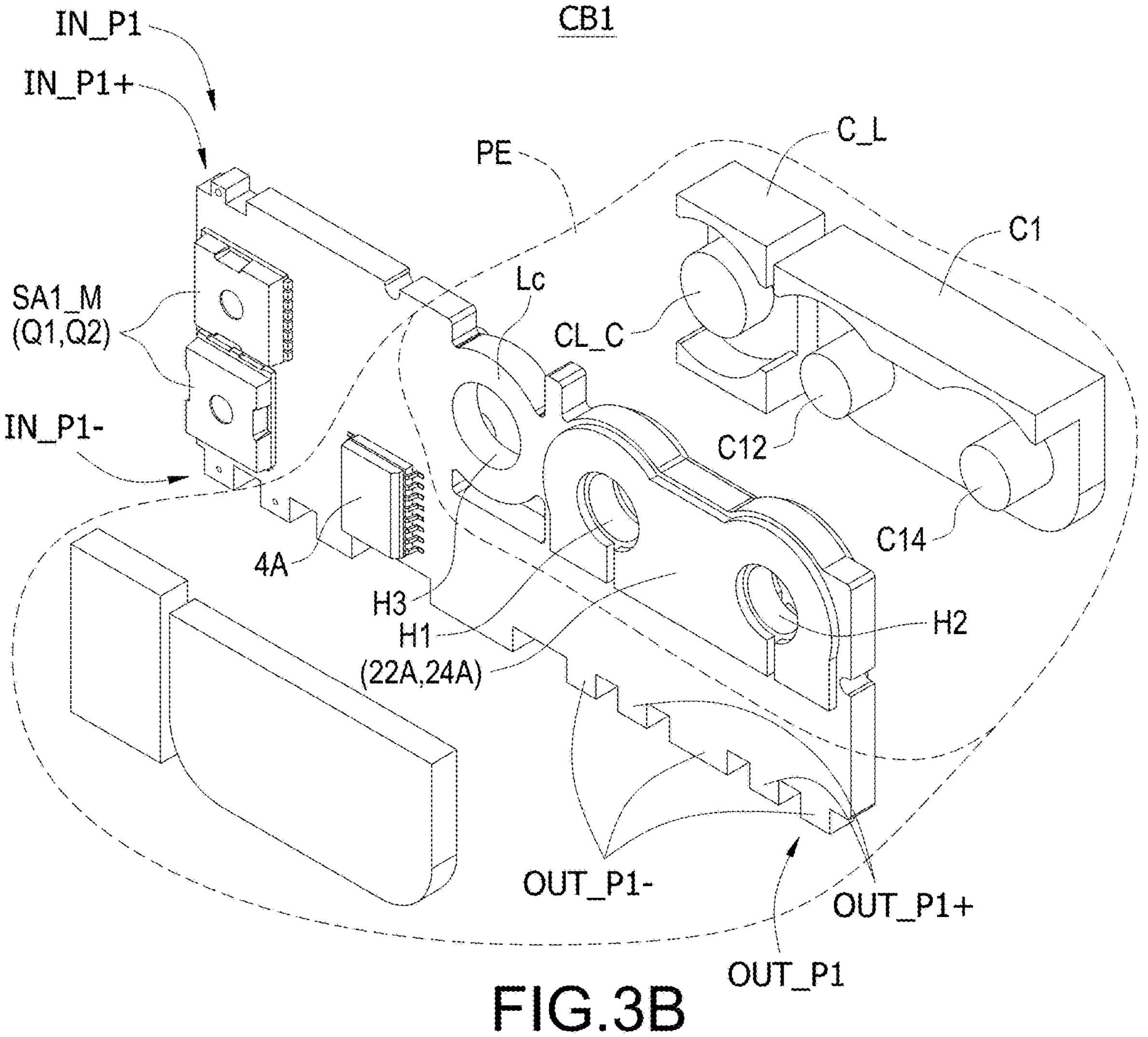
FIG. 3B is an exploded perspective view of the DC conversion module according to the first embodiment of the present disclosure.
Figure 3C:
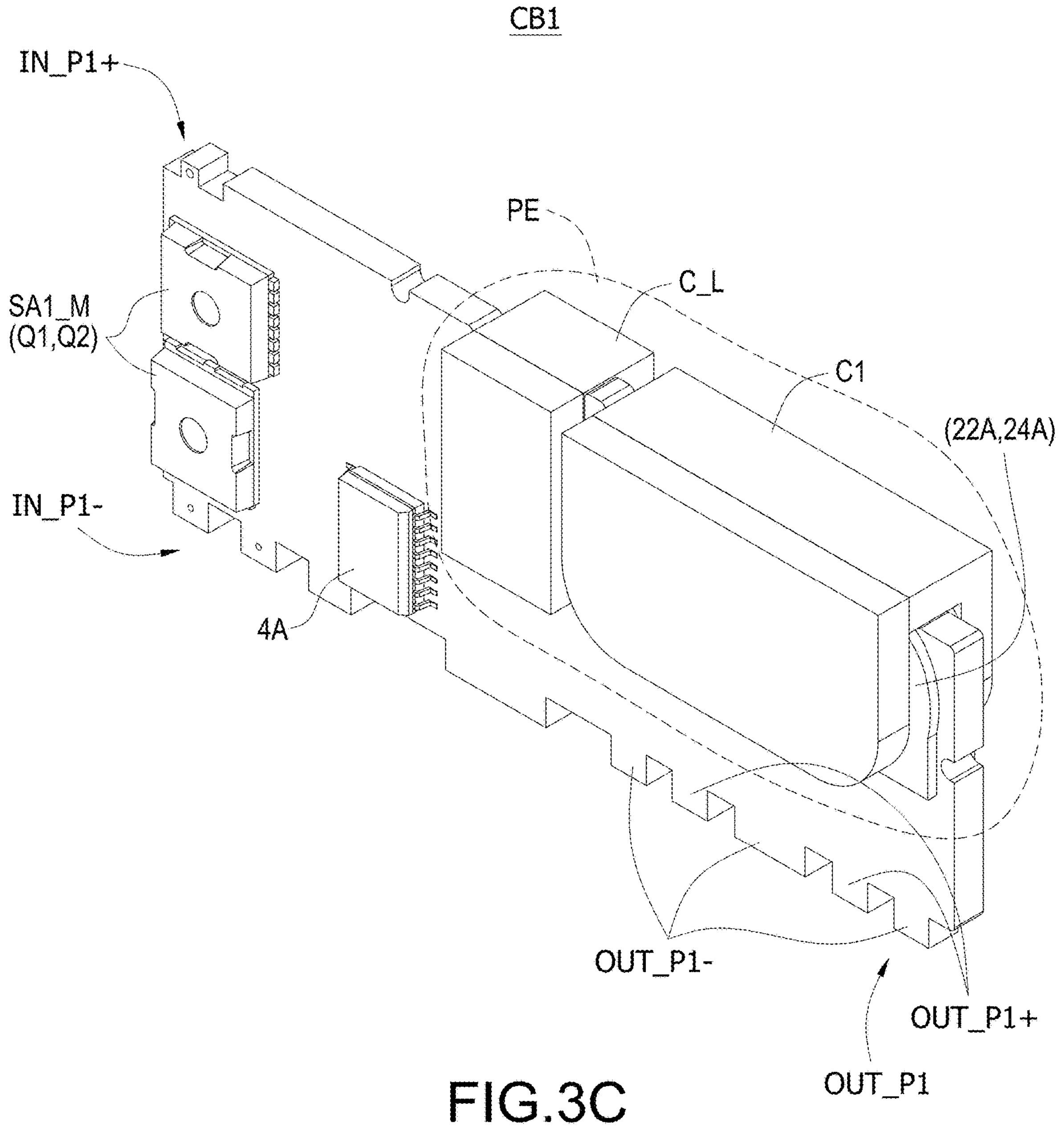
FIG. 3C is an assembled perspective view of the DC conversion module according to the first embodiment of the present disclosure.

Please refer to FIG. 3B, which shows an exploded perspective view of the DC conversion module according to the first embodiment of the present disclosure; please refer to FIG. 3C, which shows an assembled perspective view of the DC conversion module according to the first embodiment of the present disclosure. In FIG. 3B, a circuit board CB1 includes a first power input terminal IN_P1 and a first power output terminal OUT_P1, and the first power input terminal IN_P1 includes a positive input terminal IN_P1+ and a negative input terminal IN_P1−. The positive input terminal IN_P1+ is formed on a first side of the first circuit board CB1 (shown above the first circuit board CB1), and the negative input terminal IN_P1− is formed on a second side opposite to the first side (shown below the first circuit board CB1). In particular, the positions of the two may be reversed, or the positive input terminal IN_P1+ and the negative input terminal IN_P1− are formed on the left and right sides of the first circuit board CB1 respectively, which will not be described again here. The first power output terminal OUT_P1 is formed on either the first side or the second side (i.e., above or below the first circuit board CB1) to be in parallel with either the positive input terminal IN_P1+ or the negative input terminal IN_P1−.

Moreover, one of the positive input terminal IN_P1+ and the negative input terminal IN_P1− (i.e., the upper terminal above the first circuit board CB1) can be coupled to the bus capacitor Cbus through a first power copper bar, and the other one (i.e., the lower terminal below the first circuit board CB1) is coupled to the bus capacitor Cbus through a first main circuit board. The first power copper bar will be further explained later and will not be described in detail here. Since the DC conversion module CR_DC is used for high-power power conversion, its input/output current is relatively high. If no larger copper foil is used to allow large current to flow through it, the DC conversion module CR_DC will generate a large amount of heat where a large current flows (usually at the input/output terminals), thereby resulting in low efficiency of the DC conversion module CR_DC. However, if the power density of the power supply PSU needs to be considered, when large areas of the copper foil are used at the positive and negative terminals, it will easily affect the design of low-voltage circuits (such as but not limited to signal wirings). Therefore, the DC conversion module CR_DC is provided to design the positive input terminal IN_P1+ and the negative input terminal IN_P1− at the upper and lower sides of the first circuit board CB1 respectively so as to utilize a large copper bar disposed above and a large copper foil disposed below to receive larger power, thereby increasing power density and reducing occupied volume by effectively utilizing the space above the power supply PSU.

Please refer to FIG. 3B to FIG. 3C again, the first power output terminal OUT_P1 includes a plurality of positive output terminals OUT_P1+ and a plurality of negative output terminals OUT_P1−. The positive output terminals OUT_P1+ and the negative output terminals OUT_P1− are formed on the same side, and the positive output terminals OUT_P1+ and the negative output terminals OUT_P1− are arranged in a staggered manner. Since the first power output terminal OUT_P1 of the DC conversion module CR_DC provides a high-current output, the AC loss can be reduced and the power can be increased through the staggered design of the positive output terminals OUT_P1+ and the negative output terminals OUT_P1−.

B-3. Power Switch Drive Circuit of DC Conversion Module

Figure 3D:
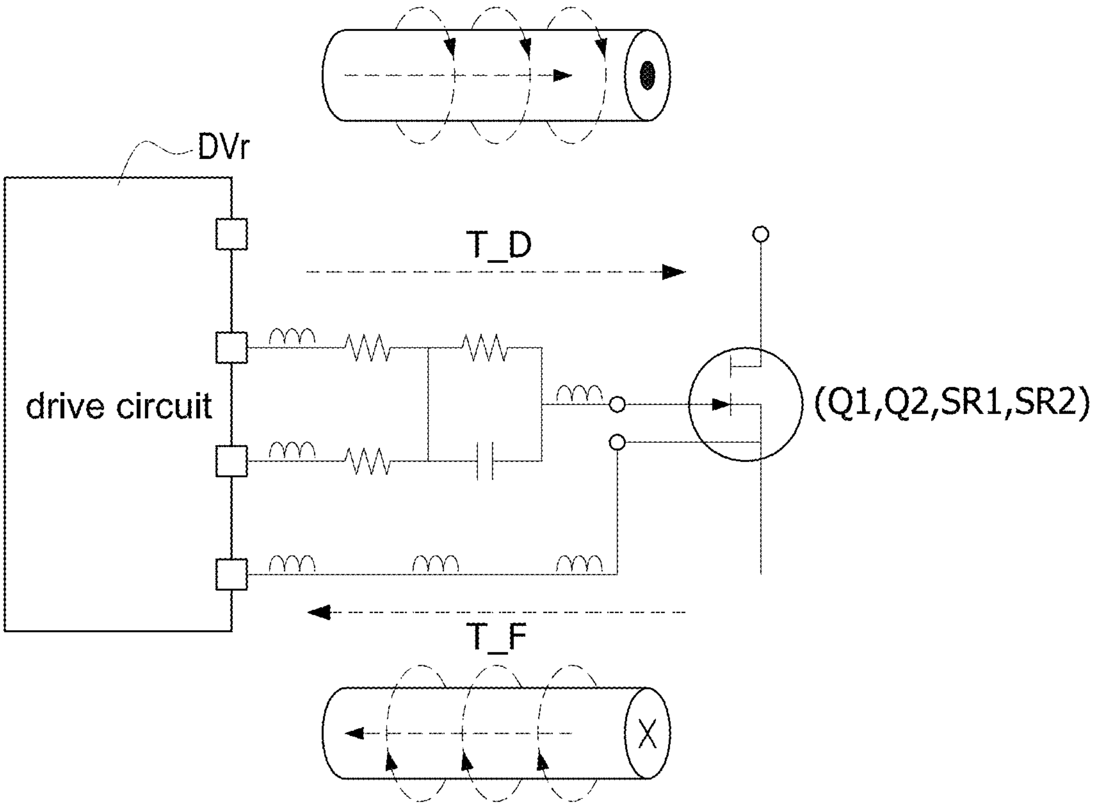
FIG. 3D is a circuit diagram of a switch drive circuit of the present disclosure.
Figure 3E:
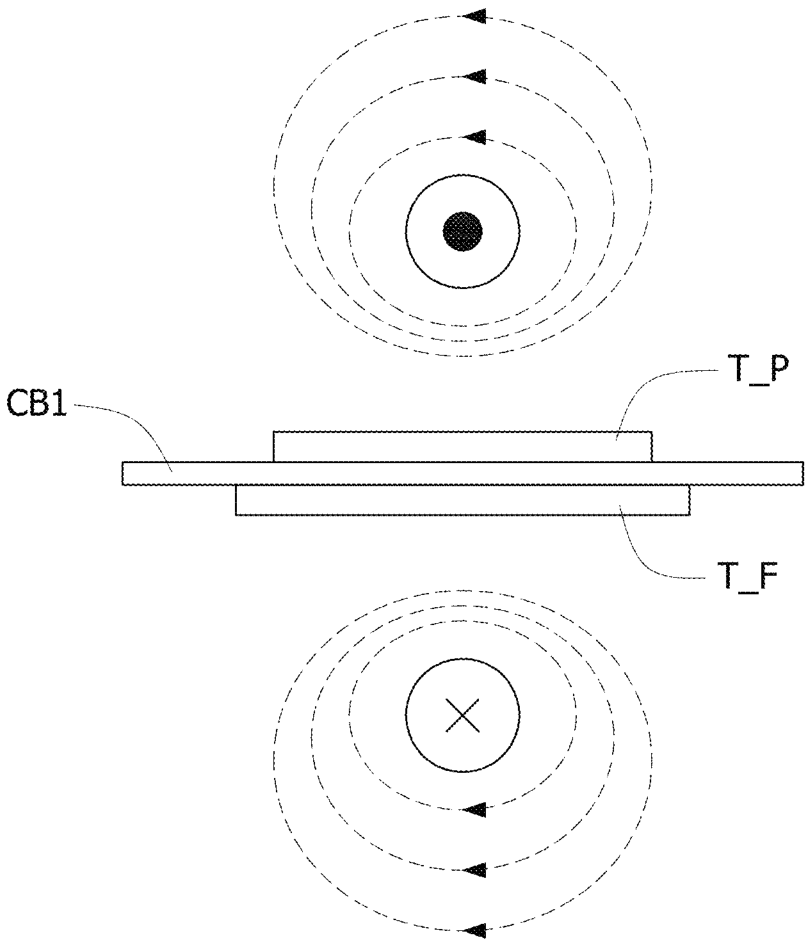
FIG. 3E is a schematic diagram of the trace configuration of the switch drive circuit of the present disclosure.

Please refer to FIG. 3D, which shows a circuit diagram of a switch drive circuit of the present disclosure; please refer to FIG. 3E, which shows a schematic diagram of the trace configuration of the switch drive circuit of the present disclosure, and also refer to FIG. 3A to FIG. 3C. Since the large power input/output of the DC conversion module CR_DC relies on the first power input terminal IN_P1 and the first power output terminal OUT_P1 on the upper and lower sides of the first circuit board CB1, the signal wiring configuration of the DC conversion module CR_DC may be farther away from the location of large power input/output to avoid the signal transmission being affected by the coupling of large currents. In addition, since the power switches Q1,Q2 of the DC conversion module CR_DC may use third-generation semiconductor components such as the wide bandgap (WBG), and are used in high-frequency switching (such as but not limited to 300 kHz), it is necessary to use a signal transmission method that suppresses noise to avoid noise interference. Therefore, the drive circuits of the power switches Q1,Q2 of the present disclosure use the principle of overlapping magnetic flux cancellation between the upper and lower layers of the first circuit board CB1 to reduce the parasitic inductance on the path, thereby reducing noise interference due to the high-frequency noise cancellation under the high-speed switching condition.

Specifically, as shown in FIG. 3D, the first circuit board CB1 further includes a drive circuit DVR providing a plurality of signal-supplying wires T_P (shown in circuit diagram form) and a plurality of signal-returning wires T_F (shown in circuit diagram form). The signal-supplying wires T_P and the signal-returning wires T_F are respectively coupled to the power switches Q1,Q2 of the first switch bride arm SA1_M and the rectification switches SR1,SR2 of the rectification circuit 32 so as to respectively form a plurality of signal transmission loops from the signal-supplying wires T_P, the power switches Q1,Q2 to the signal-returning wires T_F, or from the signal-supplying wires T_P, the rectification switches SR1, SR2 to the signal-returning wires T_F. In FIG. 3E, the signal-supplying wires T_P are respectively configured on one of the top board or the bottom board of the first circuit board CM, and the signal-returning wires T_F are respectively configured on the other one of the top board or the bottom board, thereby reducing the parasitic inductance on the path by the overlapping magnetic flux cancellation between the upper and lower layers of the first circuit board CB1. Although the signal-supplying wires T_P and the signal-returning wires T_F are respectively arranged on the top board or the bottom board, and the effect of overlapping magnetic flux cancellation between the upper and lower layers can be achieved, if the signal-supplying wires T_P and the signal-returning wires T_F of each signal transmission loop can be configured to overlap each other (that is, the copper foils of the upper and lower wires overlap at least partially, i.e., it means that the entire path overlaps, or that there is a certain proportion of overlap on the path), thereby significantly increasing the effect of overlapping magnetic flux cancellation between the upper and lower layers.

B-4. Magnetic Component of DC Conversion Module

Please refer to FIG. 1 to FIG. 3A again. The circuit components of the resonant converter 100 are configured on the first circuit board CB1, and the first switch bridge arm SA1_M and the first controller 4A are arranged in positions as shown in FIG. 2. In particular, the resonant inductor Lr and the (at least one) first transformer 2A form a planar magnetic component PE. Specifically, an inductor coil Lc of the resonant inductor Lr and the first primary-side coil 22A and the first secondary-side coil 24A of the first transformer 2A are all planar structures, and the inductor coil Lc, the first primary-side coil 22A and the first secondary-side coil 24A are formed on PCB traces of the first circuit board CB1. An iron core assembly includes a first iron core C1 and an inductor iron core C_L. The (at least one) first transformer 2A is formed by directly setting (sleeving) the first iron core C1 on the first primary-side coil 22A and the first secondary-side coil 24A of the first circuit board CM, and the resonant inductor Lr is formed by directly setting (sleeving) the inductor iron core C_L on the inductor coil Lc of the first circuit board CB1.

Therefore, the structure of the resonant converter 100 of the present disclosure mainly forms the inductor coil Lc of the resonant inductor Lr and the first primary-side coil 22A and the first secondary-side coil 24A of the first transformer 2A on the first circuit board CB1, so that the planar magnetic component PE can be planarized to significantly increase the space utilization of the resonant converter 100 and meet the requirement of the high power density. Since the planar magnetic component PE is integrated in the first circuit board CB1, the contact resistance is effectively reduced, the power transmission loss is reduced, and the power transmission efficiency is increased. In addition, the design of the integration of the planar magnetic component PE and the circuit board, which replaces the originally larger coil-wound transformer/inductor, thereby significantly eliminating the component configuration space required by the traditional transformer, and significantly increasing the power density of DC conversion module CR_DC. In addition, due to the small size of the planar magnetic component PE, the operating frequency of the resonant converter 100 can be significantly increased. Therefore, the power switches of the first switch bridge arm SA1_M and the rectification circuit 32 can use third-generation semiconductor components such as the wide bandgap (WBG) as the main power switch, so that the resonant converter 100 has the advantages of higher efficiency, significantly reduced power switch size, lighter weight, and increased heat dissipation performance.

Figure 4A:
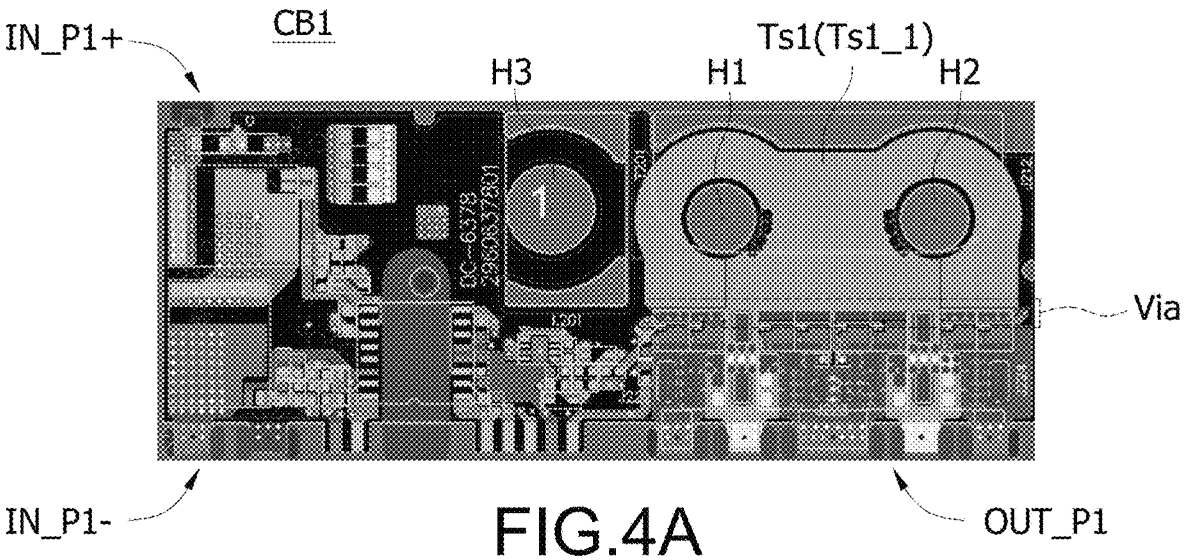
FIG. 4A to FIG. 4L are schematic diagrams of the trace of the coil of the planar magnetic component in each layer of the first circuit board of the present disclosure.
Figure 4B:
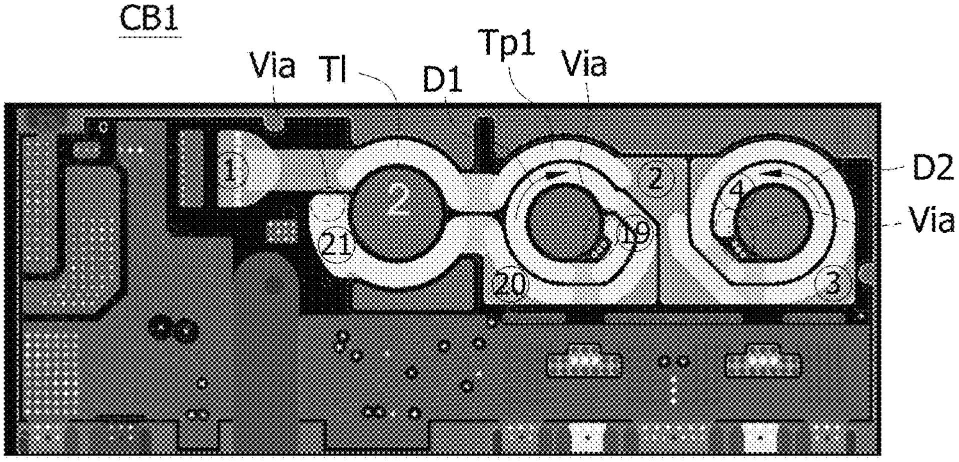
Figure 4C:
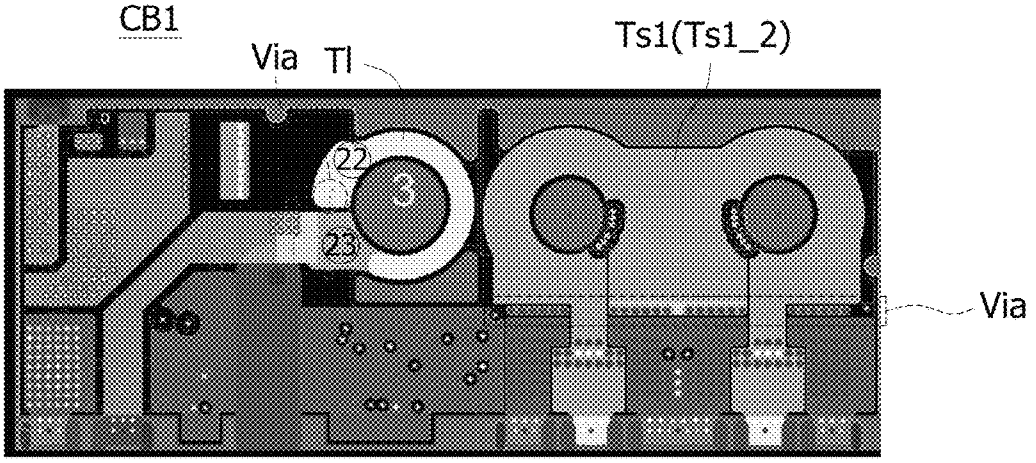
Figure 4D:
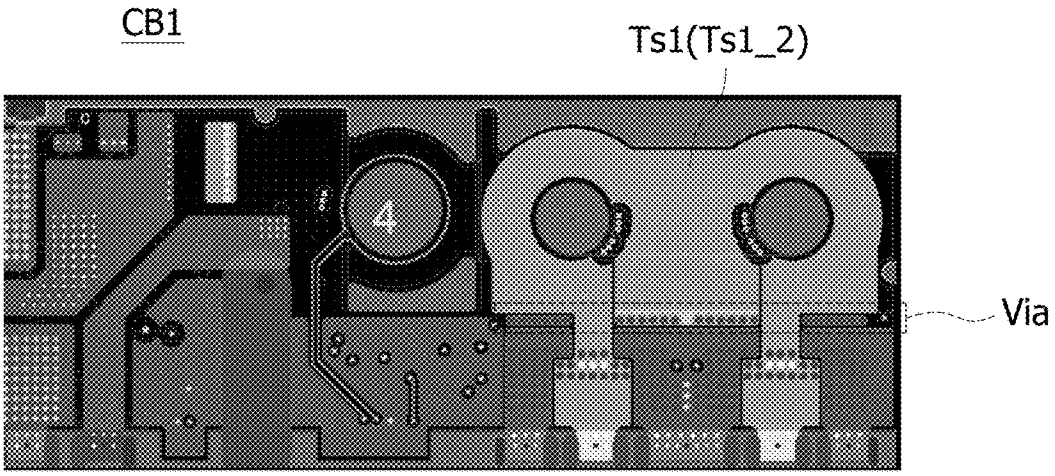
Figure 4E:
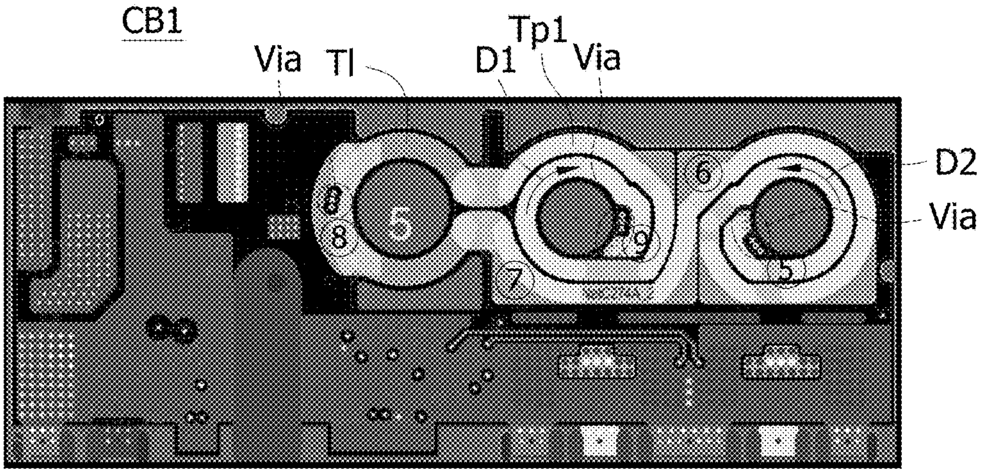
Figure 4F:
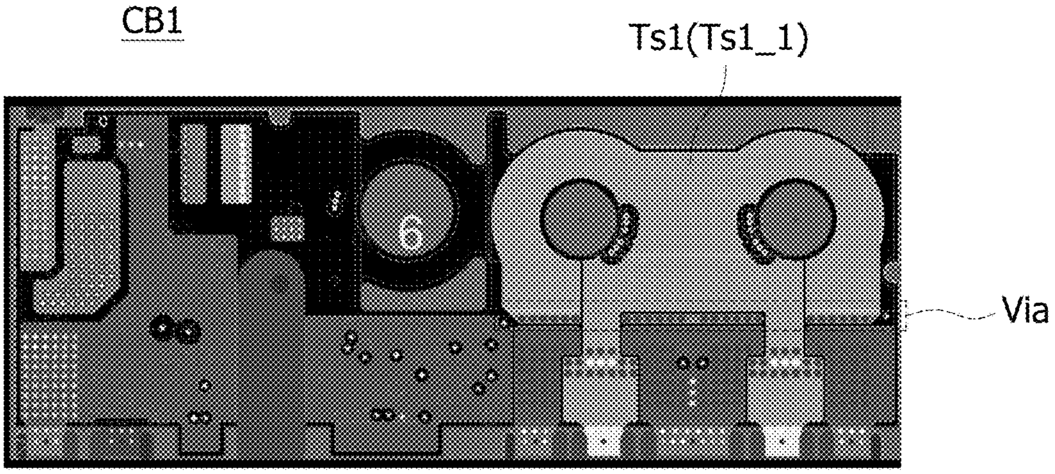
Figure 4G:
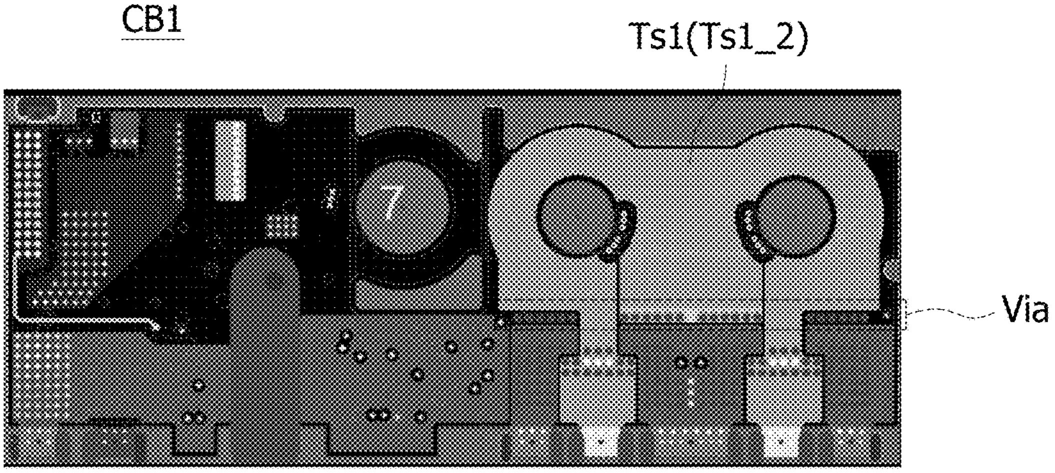
Figure 4H:
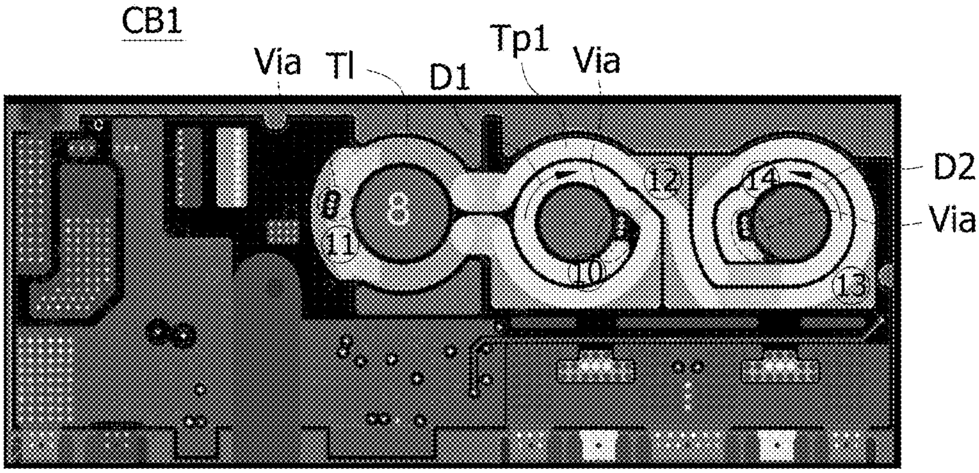
Figure 4I:
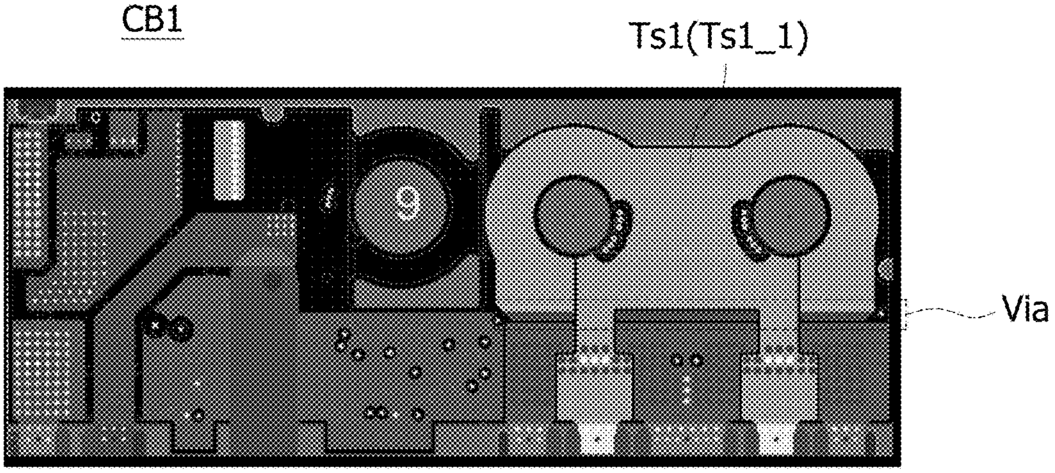
Figure 4J:
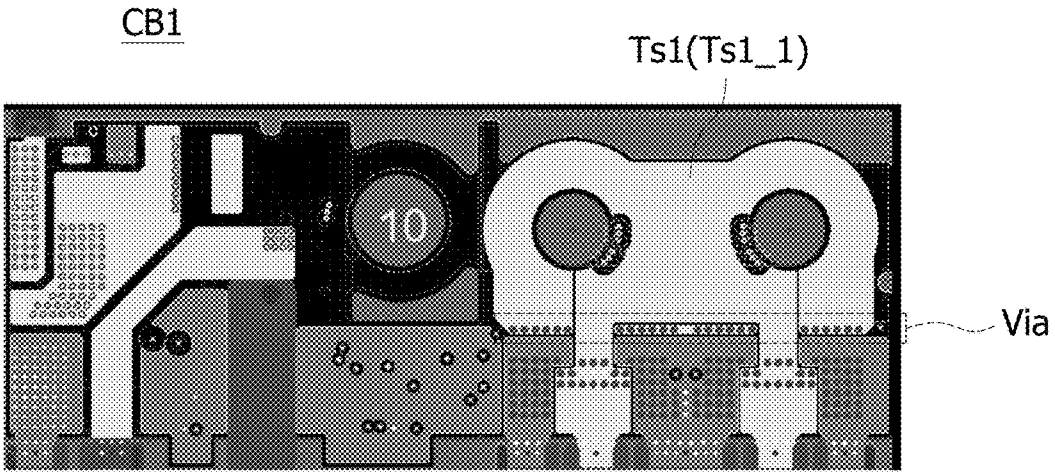
Figure 4K:
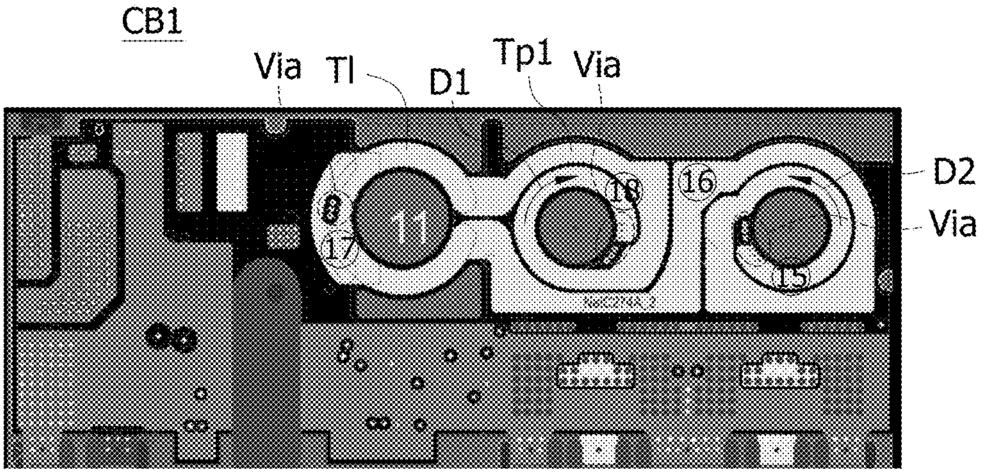
Figure 4L:
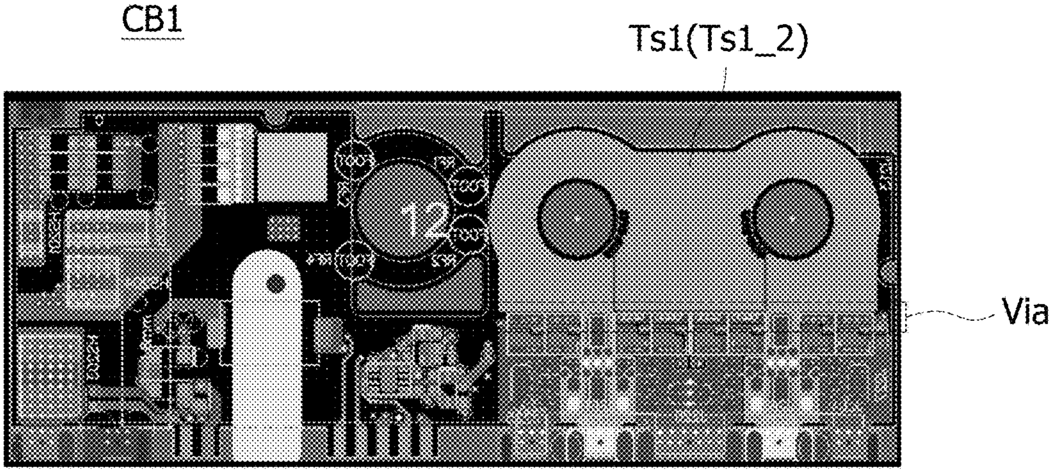
Figure 4M:
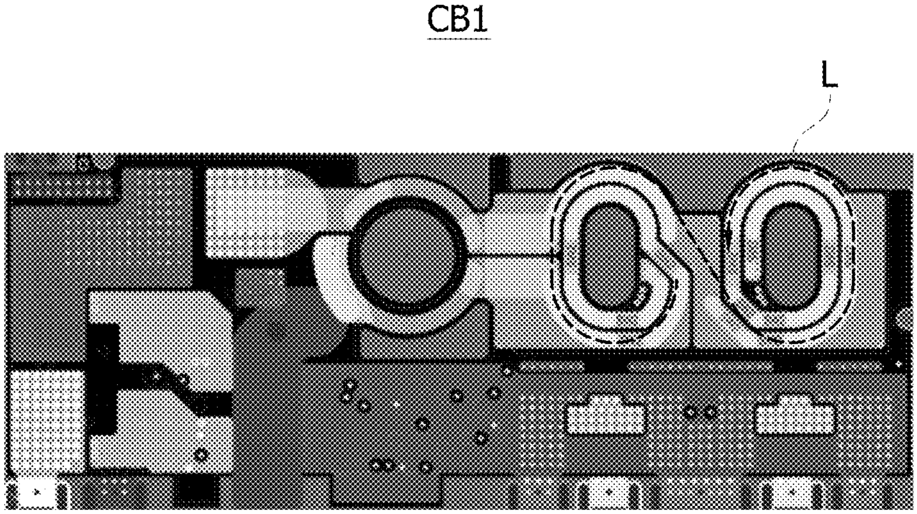
FIG. 4M is a schematic diagram of ∞-shaped trace of the coil of the planar magnetic component of the present disclosure.

Please refer to FIG. 4A to FIG. 4L, which show schematic diagrams of the trace of the coil of the planar magnetic component in each layer of the first circuit board of the present disclosure; please refer to FIG. 4M, which shows a schematic diagram of ∞-shaped trace of the coil of the planar magnetic component of the present disclosure, and also refer to FIG. 2 to FIG. 3B. The first circuit board CB1 is a multi-layer board (a 12-layer board is used as an example, but is not limited thereto), and FIG. 4A shows the top board, and FIG. 4L shows the bottom board. In particular, an inductor trace T1 serves as the inductor coil Lc, and a first primary-side trace Tp1 serves as the first primary-side coil 22A. The inductor trace T1 and the first primary-side trace Tp1 are respectively formed on layer boards of FIG. 4B, FIG. 4E, FIG. 4H, and FIG. 4K (i.e., referred to as primary-side layer boards). That is, the inductor traces T1 of each layer are connected to each other to form the inductor coil Lc, and the first primary-side traces Tp1 of each layer are connected to each other to form the first primary-side coil 22A. The first secondary-side traces Ts1 are formed on layer boards of FIG. 4A, FIG. 4C, FIG. 4D, FIG. 4F, FIG. 4G, FIG. 4I, FIG. 4J, and FIG. 4L (i.e., referred to as secondary-side layer boards).

Please refer to FIG. 3A to FIG. 3C, the first iron core C1 includes a first core pillar C12 and a second core pillar C14. The first core pillar C12 penetrates a first through hole H1 of the first circuit board CB1, and the second core pillar C14 penetrates a second through hole H2 of the first circuit board CB1. The first primary-side traces Tp1 surround the first through hole H1 and the second through hole H2, and the first secondary-side traces Ts1 also surround the first through hole H1 and the second through hole H2, so that after the first iron core C1 is sleeved on the first primary-side traces Tp1 and the first secondary-side traces Ts1, closed magnetic paths can be formed in the first transformer 2A. Similarly, the inductor iron core C_L includes a core pillar C_LC. The core pillar C_LC penetrates a third through hole H3 of the first circuit board CB1. The inductor traces T1 surround the third through hole H3, so that after the inductor iron core C_L is sleeved on the inductor traces T1, closed magnetic paths can be formed in the resonant inductor Lr. In particular, the material of the traces formed by each layer board may be copper foil, but it does not exclude the use of other metal foils that are easy to conduct electricity (such as, but not limited to, gold, silver, etc.).

On the other hand, the inductor traces T1 are coupled to the first primary-side traces Tp1. The first switch bridge arm SA1_M is coupled to the first power input terminal IN_P, and the first secondary-side circuit 3A is coupled to the first secondary-side traces Ts1 and the first power output terminal OUT_P1 (as shown in FIG. 3A, two terminals of the front-end circuit are the first power input terminal IN_P and the first power output terminal OUT_P1 respectively). Therefore, the resonant converter 100 can be formed by sleeving the first iron core C1 on the inductor iron core C_L. Accordingly, by being plugged into the power supply unit PSU, the first circuit board CB1 can be used as the DC conversion module CR_DC to convert the DC power source V_DC into the main power source V_M. In addition, based on the planar design of the first circuit board CB1, the first circuit board CB1 can be plugged into any circuit that requires to convert the DC power source V_DC and needs to increase power density. Therefore, in addition to providing the power conversion function, the plug-in design can also significantly reduce the occupied volume of the device.

In FIG. 4B, FIG. 4E, FIG. 4H, and FIG. 4K, the first primary-side traces Tp1 surround the first through hole H1 in a first direction D1 (clockwise direction/counterclockwise direction), and surround the second through hole H2 in a second direction D2 (counterclockwise direction/clockwise direction) opposite to the first direction D1 to form ∞-shaped traces, so that staggered traces are formed by different circuit board layers crossing each other. That is, when the first primary-side traces Tp1 surround the first through hole H1 in the clockwise direction, they will surround the second through hole H2 in the counterclockwise direction. On the contrary, when the first primary-side traces Tp1 surround the first through hole H1 in the counterclockwise direction, they will surround the second through hole H2 in the clockwise direction. In one embodiment, the first primary-side traces Tp1 shown in FIG. 4B, FIG. 4E, FIG. 4H, and FIG. 4K form two first primary-side coils 22A as shown in FIG. 3A. It can be inferred similarly that depending on the circuit configuration of the resonant converter 100, the first primary-side traces Tp1 may form one or more than one first primary-side coils 22A. The number of the first primary-side coils 22A may be added depending on the number of layers of the first circuit board CB1 and the number of turns of the first primary-side traces Tp1, which will not be described again here.

In particular, a plurality of via holes via are formed on one side of the first through hole H1 and the second through hole H2 respectively. These via holes via are filled with conductive materials (such as, but not limited to, solder paste and other conductive materials), so that the first primary-side traces Tp1 of the primary-side layer boards in FIG. 4B, FIG. 4E, FIG. 4H, and FIG. 4K can be electrically connected to each other through the via holes via. That is, the first primary-side traces Tp1 of the primary-side layer boards in FIG. 4B, FIG. 4E, FIG. 4H, and FIG. 4K are connected in series through the via holes via to form the primary-side coils 22A.

Specifically, in FIG. 4B, FIG. 4C, FIG. 4E, FIG. 4H, and FIG. 4K, numbers 1 to 23 are marked respectively. The sequence of numbers increasing from 1 to 23 corresponds to the path of the primary-side current flowing from the inductor traces T1 to the resonant capacitor Cr, and at the terminal of the traces, it will be connected to the traces on another layer through the via holes via. On the contrary, if the primary-side current flows through the path from the resonant capacitor Cr to the inductor traces T1, the number will decrease from 23 to 1. In particular, the inductor traces T1 on the second layer board and the third layer board of FIG. 4B and FIG. 4C respectively form the input terminal (position marked 1) and the output terminal (position marked 23) of the planar magnetic component PE. Therefore, it can be clearly seen that on adjacent primary-side layer boards (for example, but not limited to, FIG. 4B and FIG. 4E), the surrounding direction of the first primary-side traces Tp1 will be the same (referring to the flow direction of the primary-side current). For example, in FIG. 4B, taking the condition that the first rectification switch SR1 is turned on as an example, the first primary-side traces Tp1 start from the first through hole H1 in a clockwise direction (i.e., the first direction D1), and approach the second through hole H2 in a counterclockwise direction (i.e., the second direction D2). Similarly, the current path adjacent to the first primary-side traces Tp1 (FIG. 4E) is opposite, that is, the first primary-side traces Tp1 approach the first through hole H1 in the clockwise direction (i.e., the first direction D1), and start from the second through hole H2 in the counterclockwise direction (i.e., the second direction D2). The rest may be deduced by analogy, and no further details will be given.

In FIG. 4B, when the second rectification switch SR2 is turned on, the situation is exactly the opposite, that is, the first primary-side traces Tp1 start from the first through hole H1 in the counterclockwise direction (i.e., the first direction D1), and approach the second through hole H2 in the clockwise direction (i.e., the second direction D2). The rest may be deduced by analogy, and no further details will be given. The first direction D1 and the second direction D2 refer to the current directions surrounding the first through hole H1 and the second through hole H2 as two different current directions, and are not limited to a clockwise direction or a counterclockwise direction. Therefore, the first primary-side traces Tp1 surround the first through-hole H1 and the second through-hole H2 for at least two turns respectively, and similarly forms an ∞-shaped pattern (as shown by the line L in FIG. 4M), which is referred to as an ∞-character trace.

On the other hand, the first primary-side traces Tp1 of the present disclosure further integrates the inductor traces T1, and the inductor traces T1 surround the third through hole H3. Furthermore, as shown in FIG. 3A, although the resonant inductor Lr is a different circuit component from the first transformer 2A, in fact the two can be configured separately (that is, the two may include other circuit components, such as but not limited to, the resonant capacitor Cr), the circuit components of the two are similar in type and will also have a coil structure. Therefore, in the present disclosure, it is a preferred embodiment to integrate the inductor coil Lc of the resonant inductor Lr and the first primary-side coils 22A to form the planar magnetic component PE, but it is not limited to this in practice. On the other hand, the first iron core C1 and the inductor core C_L can also be configured separately, so that the height of the core pillar C_LC of the inductor core C_L can be easily processed (adjusting the air gap) and its parameters can be controlled relatively accurately. The separate configuration also allows the first iron core C1 and the inductor core C_L to easily adjust their own parameters (such as but not limited to, inductance value, etc.). Alternatively, the first iron core C1 and the inductor core C_L can be integrated into an integrated magnetic component.

Specifically, the metal foil of the inductor trace T1 of the present disclosure is directly connected to the metal foil of the first primary-side trace Tp1 to form a common trace structure. A plurality of via holes via are also formed on one side of the third through hole H3, and these via holes via are also filled with conductive materials so that the first primary-side traces Tp1 and the inductor traces T1 of the primary-side layer boards in FIG. 4B, FIG. 4E, FIG. 4H, and FIG. 4K can be electrically connected through the via holes via. That is, the first primary-side traces Tp1 and the inductor traces T1 of the primary-side layer boards in FIG. 4B, FIG. 4E, FIG. 4H, and FIG. 4K are connected in series through the via holes via respectively, and by sleeving the first iron core C1 on the inductor iron core C_L, the first primary-side coil 22A and the inductor iron core C_L can be respectively formed. In other words, the entire metal foil in FIG. 4B, FIG. 4E, FIG. 4H, and FIG. 4K is an integrally formed structure, and part of the integrally formed metal foil belongs to the inductor trace T1, and the other part of the integrally formed metal foil belongs to the first primary-side trace Tp1.

On the other hand, in FIG. 4B, FIG. 4E, FIG. 4H, and FIG. 4K, although the metal foils of the inductor trace T1 and the first primary-side trace Tp1 are located on the same layer and they are an integrally formed structure, the inductor trace T1 and the first primary-side trace Tp1 can also be on different layers and coupled through via holes via. Therefore, the metal foil of the inductor trace T1 can be coupled to the first primary-side trace Tp1 through coupling manner to form the same path. For example, but not limited to the via holes via, or other circuit components such as the resonant capacitor Cr between the two. Therefore, although the metal foil of the inductor trace T1 and the first primary-side trace Tp1 is an integrally formed structure as shown in FIG. 4B, FIG. 4E, FIG. 4H, and FIG. 4K, the inductor trace T1 and the metal foil of the first primary-side trace Tp1 can be configured separately, that is, the inductor trace T1 and the metal foil of the first primary-side trace Tp1 in FIG. 4B, FIG. 4E, FIG. 4H, and FIG. 4K are disconnected, and coupled through via holes via or other circuit components that can be connected in series on this path.

In one embodiment, although the inductor trace T1 and the first primary-side trace Tp1 can be directly connected by their trace sides (in the ∞-shaped traces), the preferred implementation is as shown in FIG. 4E, FIG. 4H, and FIG. 4K where the first primary-side trace Tp1 and the inductor trace T1 form a single path. In particular, although the inductor trace T1 in FIG. 4B is interrupted, it is actually coupled to the switch bridge arm SA1_M or the resonant capacitor Cr according to different circuit configurations of the first circuit board CB1 as shown in FIG. 3A. Therefore, in addition to being coupled to other circuit components, the inductor trace T1 will not be interrupted and can form a single path. That is, as shown in FIG. 3A, FIG. 3B, and FIG. 4A to FIG. 4M, the input terminal and the output terminal of the entire planar magnetic component PE are formed on a layer equipped with the inductor trace T1, and the two ends of the inductor trace T1 (see FIG. 4C) form the input terminal and the output terminal of the planar magnetic component PE, so that a structure is formed in which the planar magnetic component PE is connected in parallel to the power switch Q2 (taking the circuit structure of FIG. 3A as an example). Therefore, in the present disclosure, the first primary-side trace Tp1 uses the 0°-shaped trace design, and the inductor trace T1 of the resonant inductor Lr is integrated to form a large-area metal foil that integrates circuit components into one. Therefore, the magnetic fluxes of the first iron core C1 (the same as the inductor core C_L) can cancel each other out, so that in addition to reducing the DC contact loss, significantly reducing the loss caused by the AC eddy current, and reducing the loss of the first iron core C1 (the inductor core C_L).

On the other hand, as shown in FIG. 4C, in addition to being disposed on the primary-side layer board (that is, the layer boards in FIG. 4B, FIG. 4E, FIG. 4H, and FIG. 4K), the inductor trace T1 can also be disposed on the secondary-side layer board. The main reason is that the inductance value of the inductor trace T1 can be adjusted by adjusting the number of layers of the inductor trace T1. Therefore, the inductor trace T1 can be configured on any layer board of the primary-side layer boards and the secondary-side layer boards, and is not limited to being configured only on the primary-side layer boards of FIG. 4B, FIG. 4E, FIG. 4H, and FIG. 4K.

In addition, due to the design of the first primary-side trace Tp1 and the inductor trace T1, the number of via holes via on the first circuit board CB1 can be reduced to connect each primary-side layer board. Specifically, as shown in FIG. 4B, FIG. 4E, FIG. 4H, and FIG. 4K, six via holes via are respectively included on one side of the first through hole H1 and the second through hole H2, i.e., the total number is 12. Through these via holes via, the first primary-side traces Tp1 in FIG. 4B, FIG. 4E, FIG. 4H, and FIG. 4K with different trace directions (i.e., the first direction D1 and the second direction D2) can be connected in series. On the other hand, the first primary-side trace Tp1 can pass through the three via holes via that integrate with the inductor trace T1, so that the inductor traces T1 in FIG. 4B, FIG. 4E, FIG. 4H, and FIG. 4K can be connected in series. Therefore, the number of via holes via used to connect each primary-side layer board can be limited to less than or equal to 15.

Please refer to the secondary-side layer boards shown in FIG. 4A, FIG. 4C, FIG. 4D, FIG. 4F, FIG. 4G, FIG. 4I, FIG. 4L, and FIG. 4L, and also refer to FIG. 3A. Since the first secondary-side coil 24A has a center-tapped winding structure, in FIG. 4A, FIG. 4C, FIG. 4D, FIG. 4F, FIG. 4G, FIG. 4I, FIG. 4J, and FIG. 4L, the first secondary-side trace Ts1 and the first through hole H1 and the second through hole H2 form an m-shaped trace. Moreover, the current flowing through the first secondary-side trace Ts1 can flow out from the center point of the m-shape trace to two terminals respectively, or flow from the two terminals of the m-shape trace to the center point according to the actions of the rectification switches SR1,SR2, there will be further explanations later. The bottom of m-shape trace may include a plurality of via holes via. These via holes via are filled with conductive material inside, so that the first secondary-side traces Ts1 of the secondary-side layer boards in FIG. 4A, FIG. 4C, FIG. 4D, FIG. 4F, FIG. 4G, FIG. 4I, FIG. 4J, and FIG. 4L can be electrically connected to each other through the via holes via.

Moreover, the first traces Ts1_1 surround the first through hole H1 and the second through hole H2 to form an m-shaped trace. Similarly, the second traces Ts1_2 also surround the first through hole H1 and the second through hole H2 to form an m-shaped trace. The difference between the two is that the current direction of the first trace Ts1_1 in FIG. 4A, FIG. 4F, FIG. 4I, and FIG. 4J flows from the two terminals of the m-shaped trace to the center point, and further to the first power output terminal OUT_P_1 of the first circuit board CB1. On the contrary, the current direction of the second trace Ts1_2 in FIG. 4C, FIG. 4D, FIG. 4G, and FIG. 4L is exactly opposite to that of the first trace Ts1_1, that is, the current direction flows from the center point of the m-shaped trace to the two terminals, and further to the first power output terminal OUT_P1 of the first circuit board CB1.

Specifically, since the first secondary-side coil 24A has a center-tapped winding structure, the first secondary-side traces Ts1 respectively include at least one first trace Ts1_1 (as shown in FIG. 4A, FIG. 4F, FIG. 4I, and FIG. 4J) and at least one second trace Ts1_2 (as shown in FIG. 4C, FIG. 4D, FIG. 4G, and FIG. 4L). Therefore, the number of layers of the multi-layer first circuit board CB1 may be at least three or more, so that the top layer, the middle layer, and the bottom layer can separately form one first trace Ts1_1, one second trace Ts1_2, and one trace integrating the first primary-side trace Tp1 with the inductor trace T1. When the number of layers increases, the number of the first trace Ts1_1, the second trace Ts1_2, the first primary-side trace Tp1, and the inductor trace T1 can be selectively increased (based on circuit requirements).

In particular, the first secondary-side traces Ts1 of the secondary-side layer boards in FIG. 4A, FIG. 4F, FIG. 4I, and FIG. 4J can be connected through via holes via respectively to form two first coils 24A-1 (as shown in FIG. 3A). The first secondary-side traces Ts1 of the secondary-side layer boards in FIG. 4C, FIG. 4D, FIG. 4G, and FIG. 4L can be connected through via holes via respectively to form two second coils 24A-2 (as shown in FIG. 3A). Similarly, the first secondary-side traces Ts1 shown in FIG. 4A, FIG. 4C, FIG. 4D, FIG. 4F, FIG. 4G, FIG. 4I, FIG. 4J, and FIG. 4L can form two first secondary-side coils 24A as shown in FIG. 3A. It can be inferred similarly that depending on the circuit configuration of the resonant converter 100, the first secondary-side traces Ts1 may form one or more than one first secondary-side coils 24A. The number of the first secondary-side coils 24A may be added depending on the number of layers of the first circuit board CB1 and the number of turns of the first secondary-side traces Tp1, which will not be described again here.

Specifically, since the first secondary-side coil 24A has a center-tapped winding structure, the first secondary-side traces Ts1 respectively include a plurality of first traces Ts1_1 (as shown in FIG. 4A, FIG. 4F, FIG. 4I, and FIG. 4J) and a plurality of second traces Ts1_2 (as shown in FIG. 4C, FIG. 4D, FIG. 4G, and FIG. 4L). In particular, the first traces Ts1_1 of the secondary-side layer boards in FIG. 4A, FIG. 4F, FIG. 4I, and FIG. 4J can be connected to each other through via holes via respectively to form two first coils 24A-1 (as shown in FIG. 3A). The second traces Ts1_2 of the secondary-side layer boards in FIG. 4C, FIG. 4D, FIG. 4G, and FIG. 4L can be connected to each other through via holes via respectively to form two second coils 24A-2 (as shown in FIG. 3A).

In addition, the first circuit board CB1 of the present disclosure has a trace structure that forms the inductor trace T1, the first primary-side trace Tp1, and the first secondary-side trace Ts1, and its preferred number of layers may be three or more. In particular, one layer forms the inductor trace T1 and the first primary-side trace Tp1, and the other two layers form the first trace Ts1_1 and the second trace Ts1_2 respectively. The two layers (the first trace Ts1_1 and the second trace Ts1_2) can also form an additional inductor trace T1, or the inductor trace T1 can also be formed on an independent layer board. That is, the inductor trace T1 may be independently configured on a layer without the first primary-side trace Tp1 and the first secondary-side trace Ts1. For example, in one embodiment, the first circuit board CB1 may only be composed of the layer boards in FIG. 4A to FIG. 4C, or the first circuit board CB1 may be composed of the layer boards in FIG. 4A to FIG. 4F. The rest may be deduced by analogy, and no further details will be given.

Figure 5A:
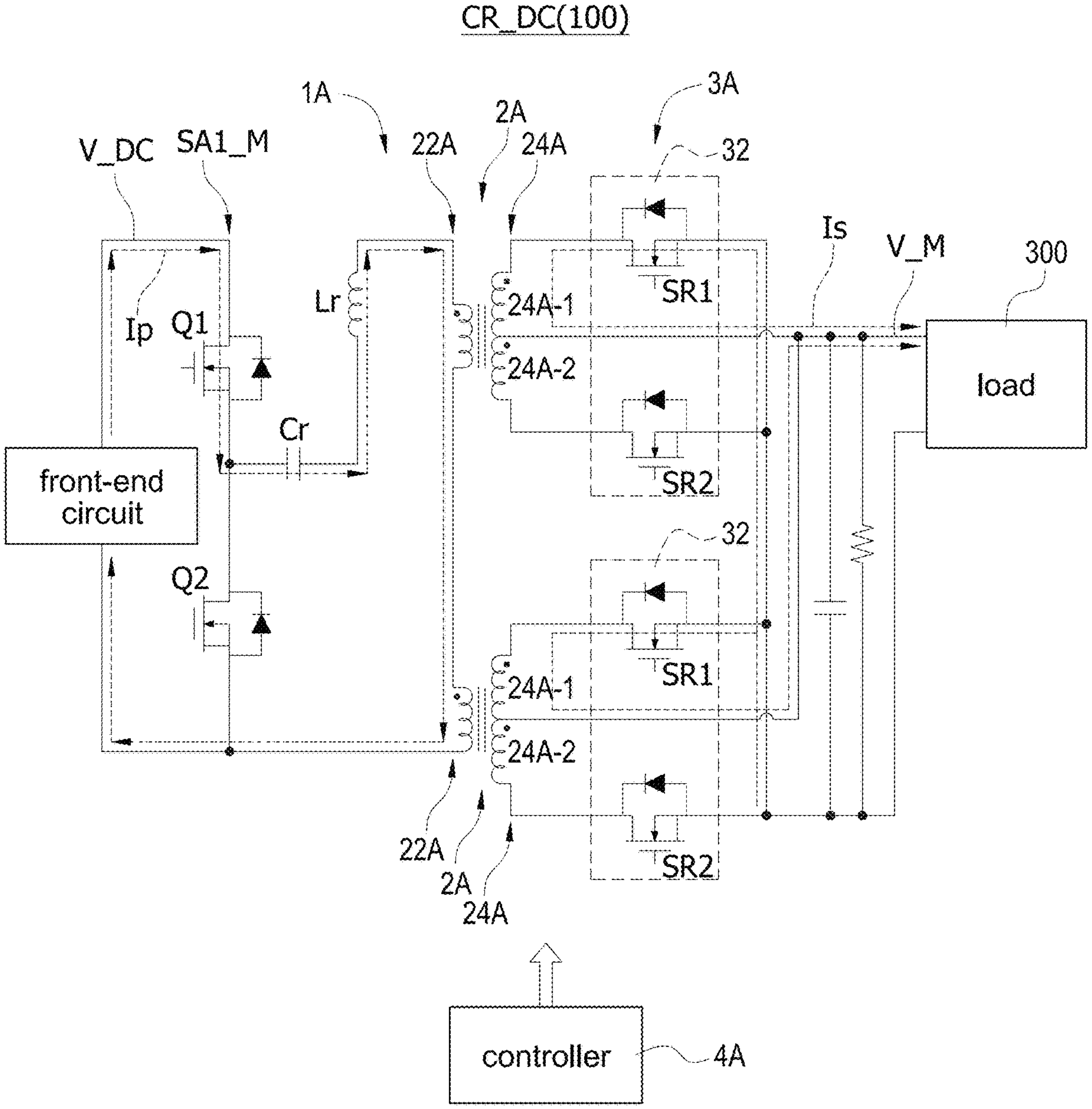
FIG. 5A is a current path diagram of a resonant converter when a first rectification switch is turned on of the present disclosure.
Figure 5B:
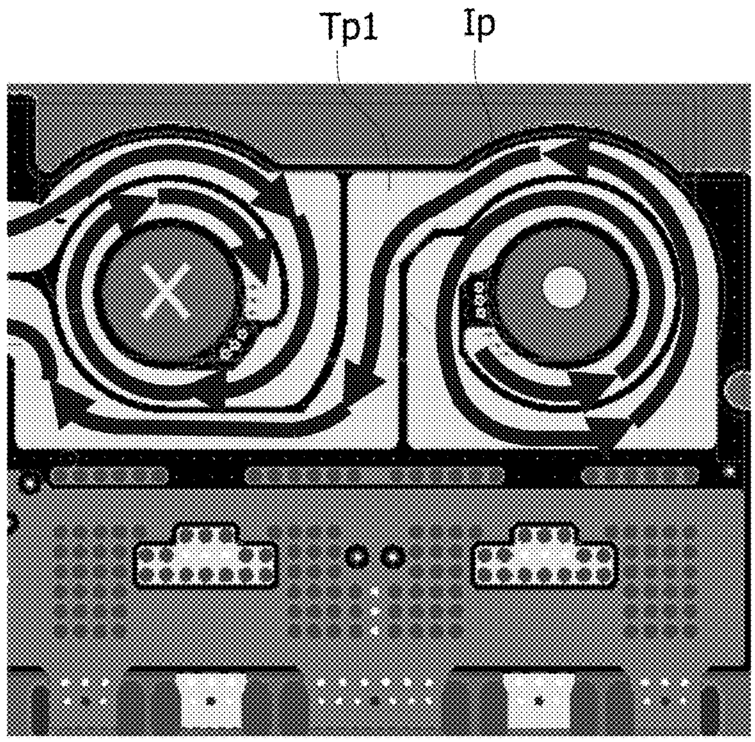
FIG. 5B is a current path diagram of a first primary-side trace when the first rectification switch is turned on of the present disclosure.
Figure 5C:
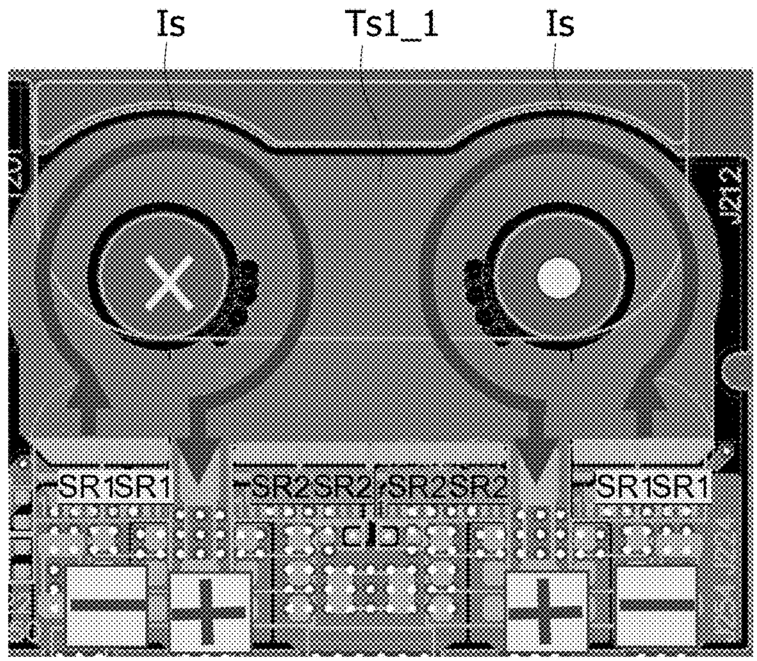
FIG. 5C is a current path diagram of a first secondary-side trace when the first rectification switch is turned on of the present disclosure.

Please refer to FIG. 5A, which shows a current path diagram of a resonant converter when a first rectification switch is turned on of the present disclosure; please refer to FIG. 5B, which shows a current path diagram of a first primary-side trace when the first rectification switch is turned on of the present disclosure; please refer to FIG. 5C, which shows a current path diagram of a first secondary-side trace when the first rectification switch is turned on of the present disclosure, and also refer to FIG. 3A to FIG. 4M. In FIG. 5A, when the first controller 4A controls the first power switch Q1 to be turned on, the primary-side current Ip flows through the path of the first power switch Q1 and the first primary-side coil 22A. In this condition, the first controller 4A also controls the first rectification switch SR1 to be turned on to generate a path for the secondary-side current Is to flow from the first trace Ts1_1 (i.e., the first coil 24A-1) to the output terminal of the resonant converter 100. Since the first coil 24A-1 and the second coil 24A-2 are center-tapped coils, and only the first rectification switch SR1 or the second rectification switch SR2 operates in the same half cycle, the second rectification switch SR2 is not turned on and does not form a path from the second trace Ts1_2 (i.e., the second coil 24A-2) to the output terminal of the resonant converter 100.

Please refer to FIG. 5B, since the traces surrounding the first through hole H1 are exactly opposite to the traces surrounding the second through hole H2, the current direction of the primary-side current Ip is also opposite so that the polarity of the first core pillar C12 and the second core pillar C14 are reversed (indicated by a dot and a mark X). Please refer to FIG. 5C, since the first rectification switch SR1 and the second rectification switch SR2 must be arranged on the surface layer of the first circuit board CB1 (i.e., the top layer of FIG. 4A or the bottom layer of FIG. 4L), when the first rectification switches SR1 and the second rectification switches SR2 of the two first secondary-side circuits 3A operate, they have a parallel structure. Therefore, the current direction of the secondary-side current Is is the same as the direction of the primary-side current Ip, so that the polarity of the first core pillar C12 and the polarity of the second core pillar C14 are also opposite, and the primary-side current Ip and the secondary-side current Is make the polarity formed by the first core pillar C12 be the same (the same is true for the second core pillar C14).

Figure 6A:
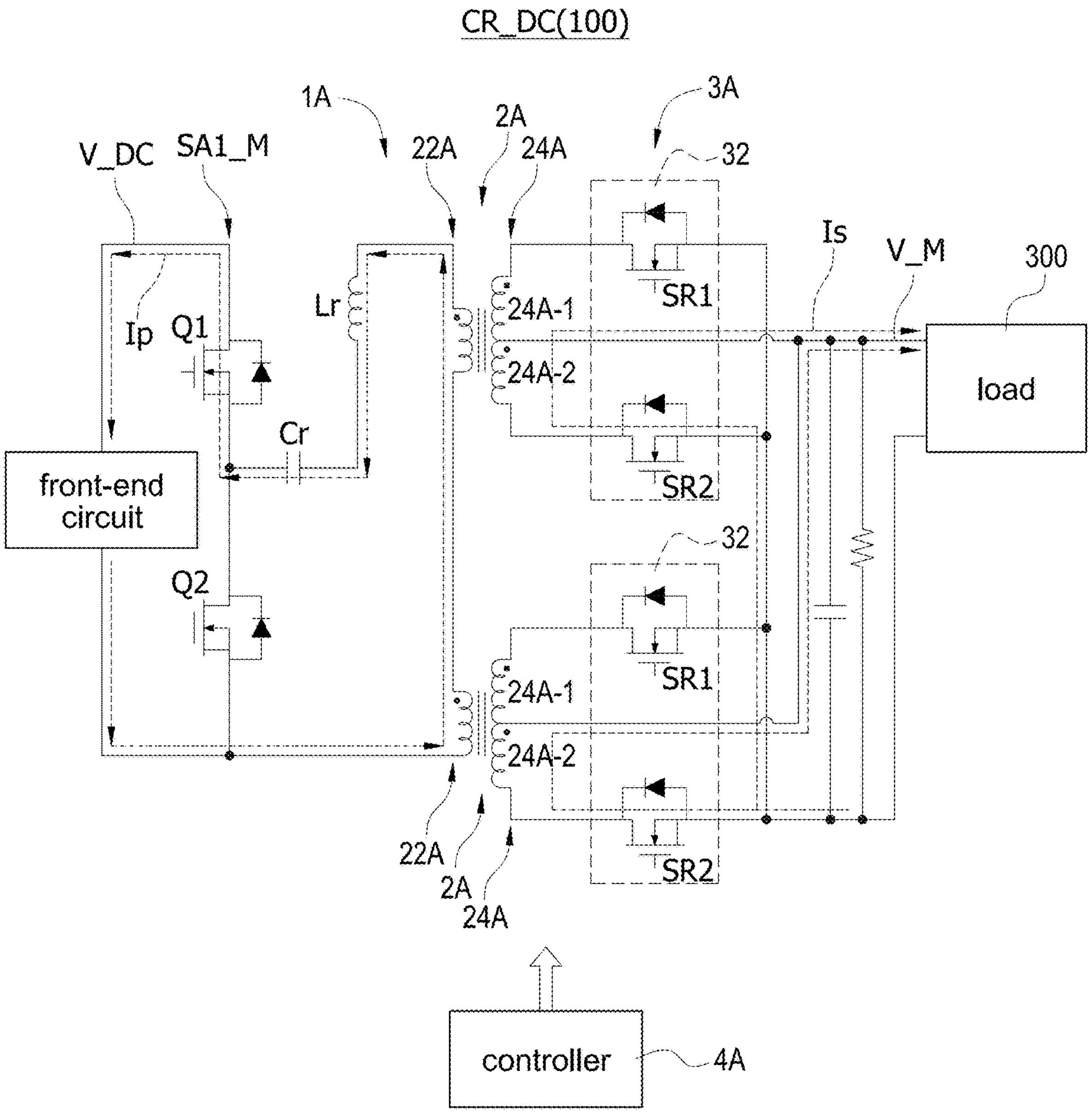
FIG. 6A is a current path diagram of the resonant converter when a second rectification switch is turned on of the present disclosure.
Figure 6B:
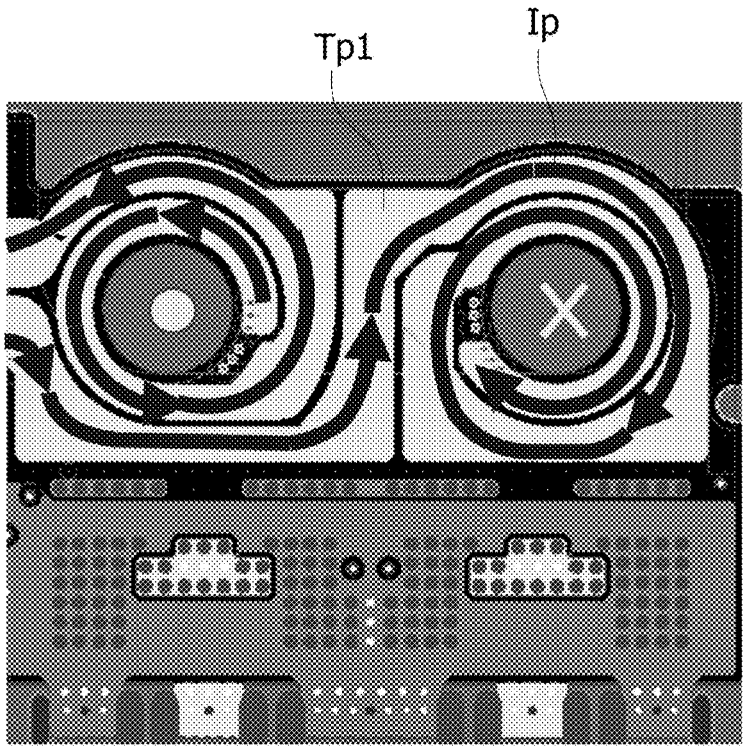
FIG. 6B is a current path diagram of the first primary-side trace when the second rectification switch is turned on of the present disclosure.
Figure 6C:
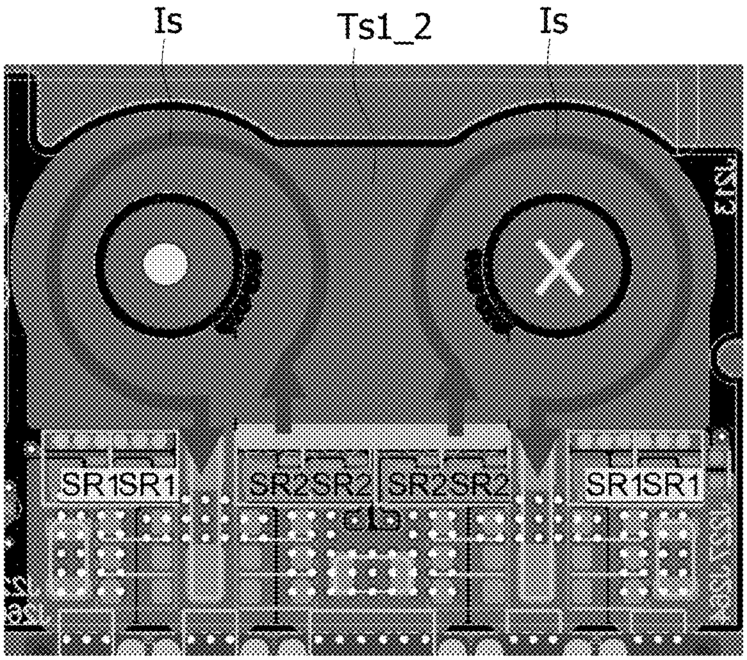
FIG. 6C is a current path diagram of the first secondary-side trace when the second rectification switch is turned on of the present disclosure.

Please refer to FIG. 6A, which shows a current path diagram of the resonant converter when a second rectification switch is turned on of the present disclosure; please refer to FIG. 6B, which shows a current path diagram of the first primary-side trace when the second rectification switch is turned on of the present disclosure; please refer to FIG. 6C, which shows a current path diagram of the first secondary-side trace when the second rectification switch is turned on of the present disclosure, and also refer to FIG. 3A to FIG. 5C. The difference between FIG. 6A to FIG. 6C and FIG. 5A to FIG. 5C is that the first controller 4A controls the second power switch Q2 to be turned on, and controls the first rectification switch SR1 to be turned off and the second rectification switch SR2 to be turned on. Therefore, the directions of the primary-side current Ip and the secondary-side current Is are exactly opposite to those shown in FIG. 5A to FIG. 5C, and the polarity of the first core pillar C12 and the polarity of the second core pillar C14 are also exactly opposite to those shown in FIG. 5A to FIG. 5C, which will not be described again here.

Figure 7A:
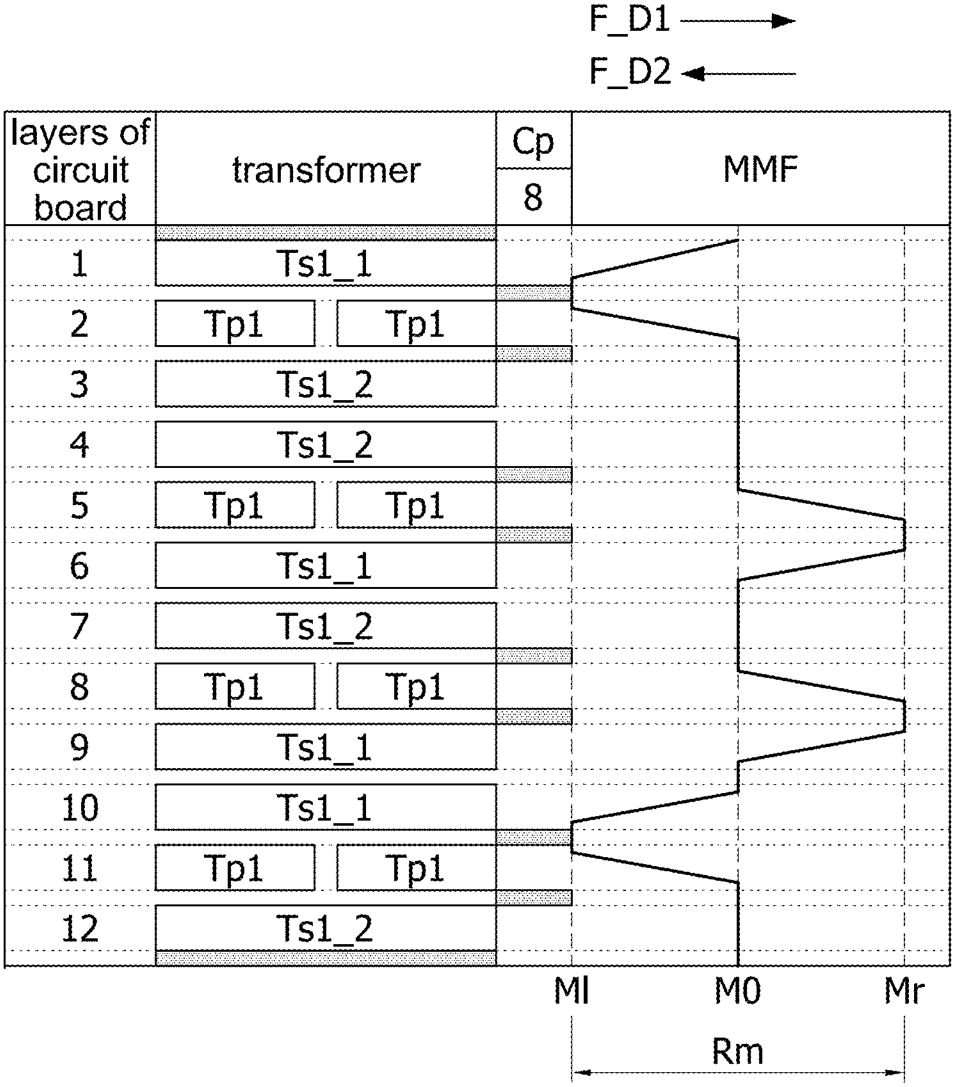
FIG. 7A is a stacked structure of the planar first transformer on each layer of the first circuit board according to the first embodiment of the present disclosure, and a magnetomotive force curve diagram when the planar first transformer is operated on the first trace.
Figure 7B:
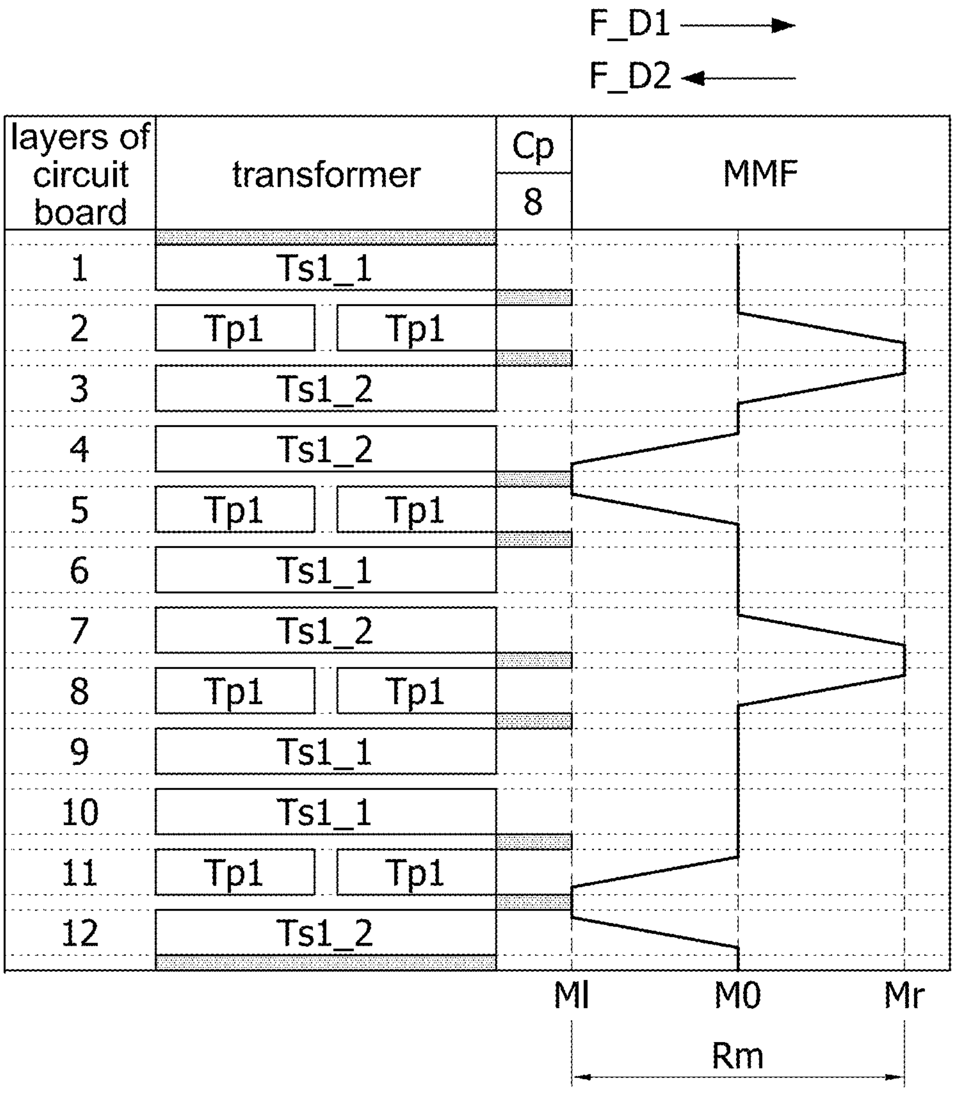
FIG. 7B is a stacked structure of the planar first transformer on each layer of the first circuit board according to the first embodiment of the present disclosure, and a magnetomotive force curve diagram when the planar first transformer is operated on the second trace.
Figure 7C:
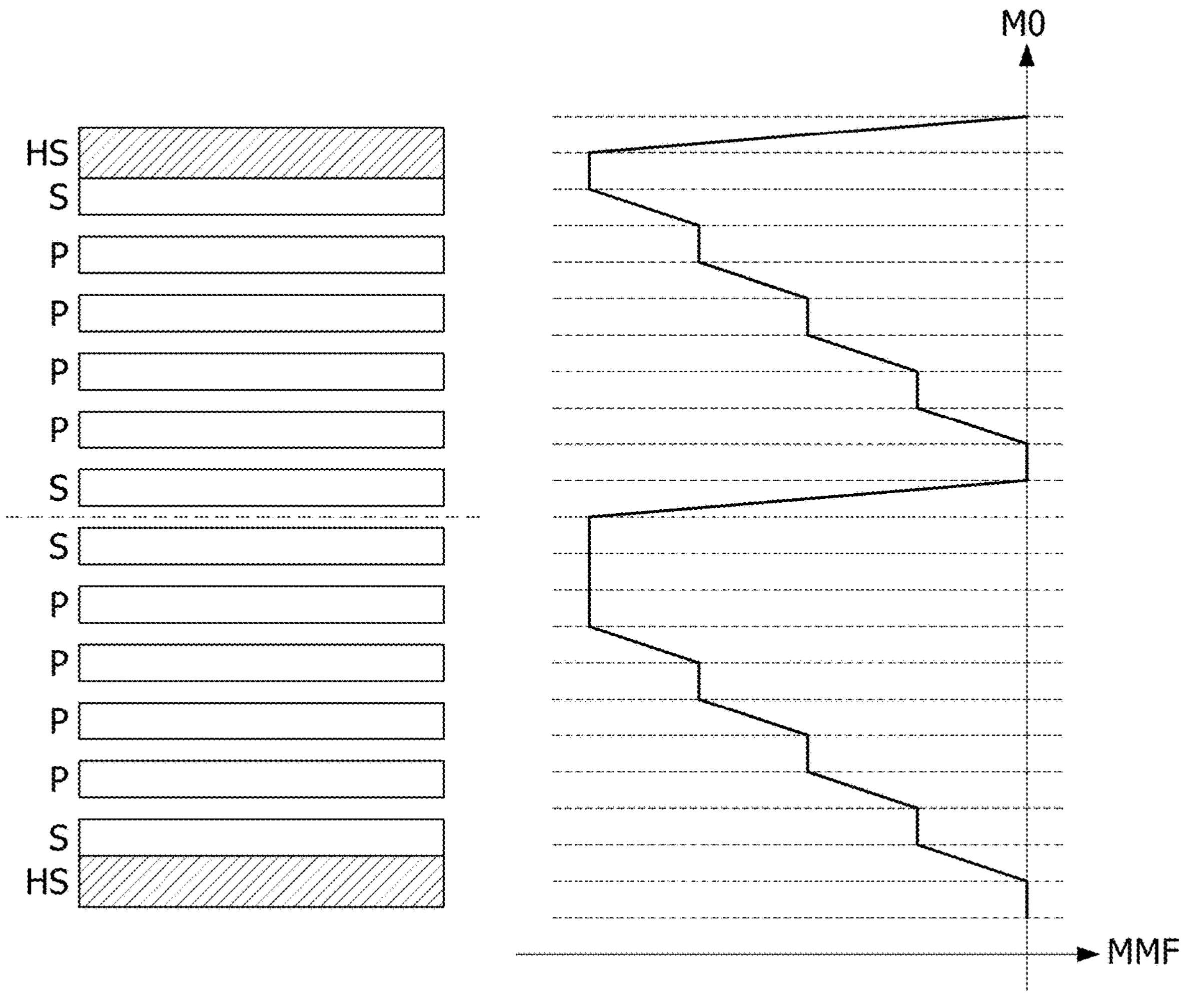
FIG. 7C is a conventional magnetomotive force curve diagram of a transformer used in a conventional resonant converter.

Please refer to FIG. 7A, which shows a stacked structure of the planar first transformer on each layer of the first circuit board according to the first embodiment of the present disclosure, and a magnetomotive force curve diagram when the planar first transformer is operated on the first trace; please refer to FIG. 7B, which shows a stacked structure of the planar first transformer on each layer of the first circuit board according to the first embodiment of the present disclosure, and a magnetomotive force curve diagram when the planar first transformer is operated on the second trace; please refer to FIG. 7C, which shows a conventional magnetomotive force curve diagram of a transformer used in a conventional resonant converter, and also refer to FIG. 3A to FIG. 6C. In FIG. 7C, the structure arranged from top to bottom on the left side of the figure includes the primary-side coil P, the secondary-side coil S, and the heat sink HS, and the right side of the figure is the magnetomotive force curve formed corresponding to the stacked structure on the left side of the figure. Since the transformer coil arrangement structure on the left side of the figure is not specially designed, the magnetomotive force MMF on the right side of the figure will be biased to one side (from the magnetic flux origin M0). This will increase the AC impedance on the coil and cause the line loss to increase, and it will cause the heat generated by the transformer to be excessively concentrated, which is not conducive to heat dissipation.

In FIG. 7A, the trace stack structure of FIG. 4A to FIG. 4L is used as a schematic example. In which, Ts1_1 represents the first trace, Ts1_2 represents the second trace, Tp1 represents the first primary-side trace, and HS represents the heat sinks of the upper layer board and the lower layer board of the circuit board. In FIG. 7A, one cube represents that the layer board forms one turn of traces with the core hole as the center, and two cubes represents that the layer board forms two turns of traces with the core hole as the center. The spacing between each trace may be regarded as the thickness between two layer boards. Therefore, the first primary-side trace Tp1 forms two turns of traces, and the first trace Ts1_1 and the second trace Ts1_2 form one turn of traces respectively (see FIG. 4A to FIG. 4L). On the other hand, in FIG. 7A, the horizontal axis of the magnetomotive force graph is the magnetomotive force (MMF), and the vertical axis is the position. The origin of the vertical axis is the magnetic flux origin M0, and the left side and the right side of the magnetic flux origin M0 include a first predetermined offset M1 and a second predetermined offset Mr respectively.

In particular, the first predetermined offset M1 and the second predetermined offset Mr are predetermined offsets acquired by calculating the parameters of the first transformer 2A. When the first transformer 2A actually operates, the actual offset will not be completely equal to the first predetermined offset M1 and the second predetermined offset Mr, however, the actual offset may still be within the error range of the first predetermined offset M1 and the second predetermined offset Mr. In order to clearly explain the characteristics of this embodiment, the subsequent magnetic flux curves in the present disclosure are illustrated under ideal conditions.

Please refer to FIG. 7A again, in the planar first transformer 2A, the formation of the first primary-side trace Tp1 causes the first primary-side trace Tp1 to generate a first direction magnetic flux F D1 (for example, but not limited to, it can be regarded that the direction of the magnetic flux shifts to the right) when the first primary-side circuit 1A operates. The formation of the first secondary-side trace Ts1 causes the first secondary-side trace Ts1 to generate a second direction magnetic flux F_D2 (for example, but not limited to, it can be regarded that the direction of the magnetic flux shifts to the left) when the first secondary-side circuit 3A operates. However, the direction of the magnetic flux mentioned above is only for illustration, since the polarity and current direction of the first transformer 2A will determine the direction of the magnetic flux deviation. Therefore, the present disclosure does not limit the corresponding relationship between the left and right deviations of the first primary-side trace Tp1 and the first secondary-side trace Ts1, and the positions of the first predetermined offset M1 and the second predetermined offset Mr may be reversed according to the polarity and current direction of the first transformer 2A.

The main purpose and effect of the present disclosure is that since the first primary-side trace Tp1 and the first secondary-side trace Ts1 are configured as, for example, but not limited to, the specific stacked structure of FIG. 7A, when the first primary-side circuit 1A operates to cause the first primary-side trace Tp1 to generate the first direction magnetic flux F D1 and cause the magnetic flux to shift, the second direction magnetic flux F_D2 generated by the first secondary-side trace Ts1 shifts the magnetomotive force MMF in the opposite direction. Therefore, the first direction magnetic flux F D1 and the second direction magnetic flux F_D2 can be maintained within a specific range Rm formed by the magnetic flux origin M0 and the first predetermined offset M1 and the second predetermined offset Mr, so that the magnetomotive force MMF of the planar first transformer 2A maintains balance. As shown in FIG. 7, the configuration of the stacked structure from the top to the bottom of the first circuit board CB1 is the first trace Ts1_1, the first primary-side trace Tp1, the second trace Ts1_2, the second trace Ts1_2, the first primary-side trace Tp1, the first trace Ts1_1, the second trace Ts1_2, the first primary-side trace Tp1, the first trace Ts1_1, the first trace Ts1_1, the first primary-side trace Tp1, and the second trace Ts1_2.

Specifically, when the first primary-side trace Tp1 generates the first direction magnetic flux F D1 from the magnetic flux origin M0 to the first predetermined offset M1 or to the second predetermined offset Mr (taking the first direction magnetic flux F D1 shifts to the right as an example), the magnetomotive force MMF will reach the second predetermined offset Mr. Therefore, by using a specific stacked structure of the first transformer 2A, the secondary-side trace Ts1 adjacent to the first primary-side trace Tp1 operates to generate the second direction magnetic flux F_D2 to offset the first direction magnetic flux F D1, thereby adjusting the magnetomotive force MMF to the magnetic flux origin M0. On the contrary, when the first secondary-side trace Tp1 generates the second direction magnetic flux F_D2 from the magnetic flux origin M0 to the first predetermined offset M1 or to the second predetermined offset Mr (taking the second direction magnetic flux F_D2 shifts to the left as an example), the magnetomotive force MMF will reach the first predetermined offset Mr. Therefore, by using a specific stacked structure of the first transformer 2A, the primary-side trace Tp1 adjacent to the first secondary-side trace Ts1 operates to generate the first direction magnetic flux F D1 to offset the second direction magnetic flux F_D2, thereby adjusting the magnetomotive force MMF to the magnetic flux origin M0.

Since in the center-tapped structure of the first secondary-side coil 24A, only the rectification switch SR1 or the rectification switch SR2 operates in the same half cycle, when the path formed by the first trace Ts1_1 and the rectification switch SR1 (or a diode) of the first secondary-side circuit 3A is forward biased, the magnetomotive force MMF will form a first magnetomotive force curve C1 as shown in FIG. 7A. On the contrary, when the path formed by the second trace Ts1_2 and the rectification switch SR2 (or a diode) of the first secondary-side circuit 3A is forward biased, the magnetomotive force MMF will form a second magnetomotive force curve C2 as shown in FIG. 7B. In the first magnetomotive force curve C1 of FIG. 7A, since the rectification switch SR2 is turned off so that the second coil 24A-2 and the rectification switch SR2 do not form a current path, the magnetomotive force MMF of the second trace Ts1_2 is horizontally maintained. On the contrary, in the second magnetomotive force curve C2 of FIG. 7A, since the rectification switch SR1 is turned off so that the first coil 24A-1 and the rectification switch SR1 do not form a current path, the magnetomotive force MMF of the first trace Ts1_1 is horizontally maintained. Therefore, the present disclosure uses a specific stacked structure of the first transformer 2A, so that the first transformer 2A can maintain the balance of the magnetomotive force MMF under various operations, and the maximum magnetic flux is reduced by half (compared to the related art). Therefore, the AC eddy current losses can be reduced, efficiency can be increased, and line losses and leakage inductance can be effectively reduced under the corresponding large current.

On the other hand, since in the center-tapped structure of the first secondary-side coil 24A, only the rectification switch SR1 or the rectification switch SR2 operates in the same half cycle, when the path formed by the first trace Ts1_1 and the rectification switch SR1 (or a diode) of the first secondary-side circuit 3A is forward biased, the “adjacent” refers to the first trace Ts1_1 closest to the first primary-side trace Tp1, or the first primary-side trace Tp1 closest to the first trace Ts1_1 in FIG. 7A. On the contrary, in FIG. 7B, the “adjacent” refers to the second trace Ts1_2 closest to the first primary-side trace Tp1, or the first primary-side trace Tp1 closest to the second trace Ts1_2.

Figure 8A:
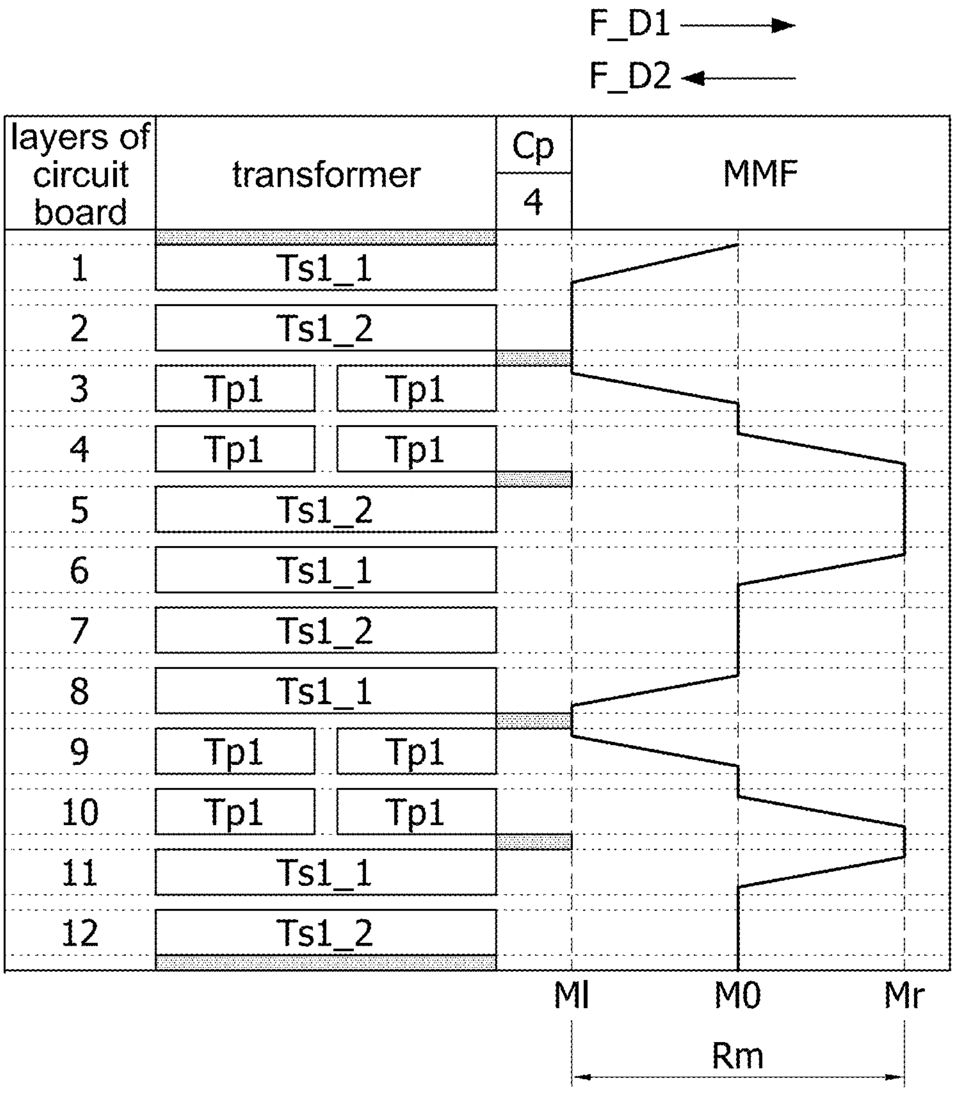
FIG. 8A is a stacked structure of the planar first transformer on each layer of the first circuit board according to the second embodiment of the present disclosure, and a magnetomotive force curve diagram when the planar first transformer is operated on the first trace.
Figure 8B:
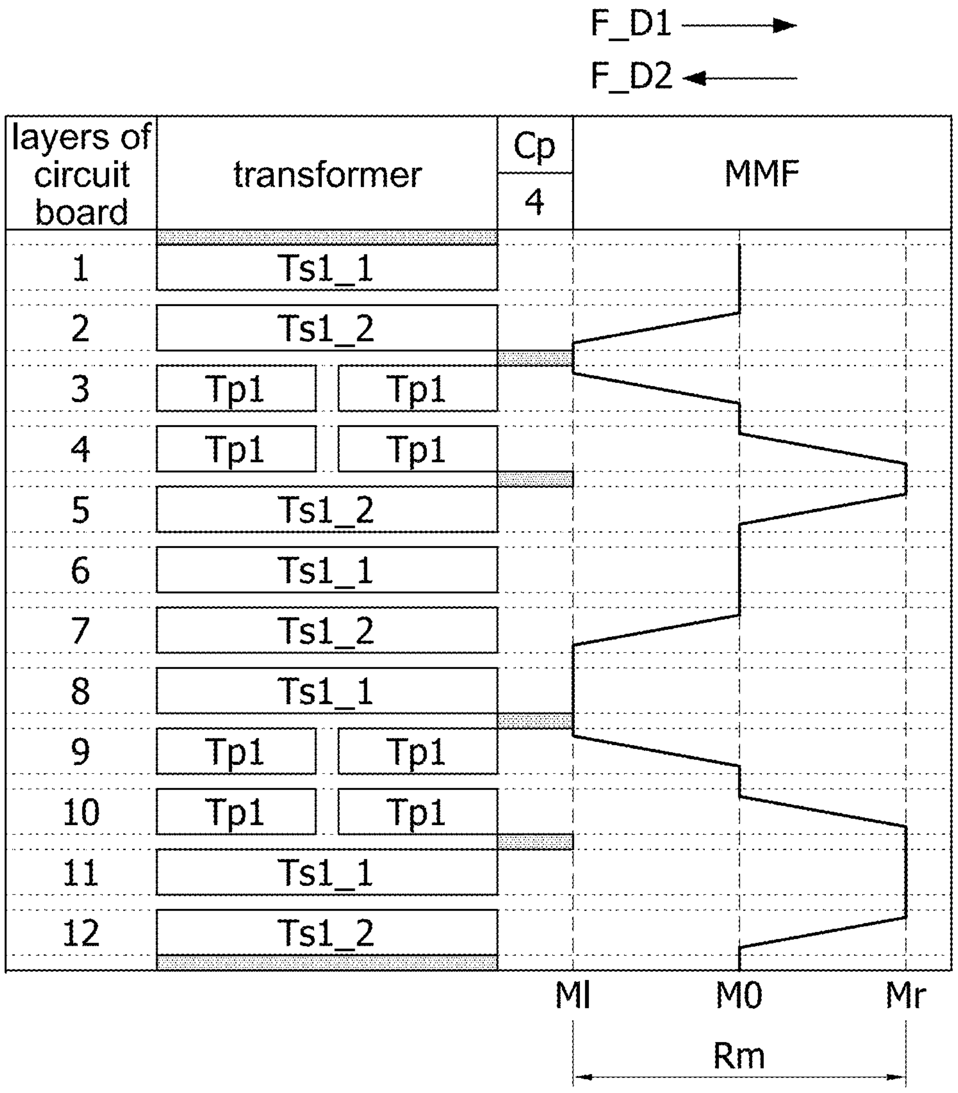
FIG. 8B is a stacked structure of the planar first transformer on each layer of the first circuit board according to the second embodiment of the present disclosure, and a magnetomotive force curve diagram when the planar first transformer is operated on the second trace.

Please refer to FIG. 8A, which shows a stacked structure of the planar first transformer on each layer of the first circuit board according to the second embodiment of the present disclosure, and a magnetomotive force curve diagram when the planar first transformer is operated on the first trace; please refer to FIG. 8B, which shows a stacked structure of the planar first transformer on each layer of the first circuit board according to the second embodiment of the present disclosure, and a magnetomotive force curve diagram when the planar first transformer is operated on the second trace, and also refer to FIG. 3A to FIG. 7B. Although the stacked structure and magnetomotive force curve in FIG. 8A and FIG. 8B are different from those in FIG. 7A and FIG. 7B, they can achieve the same effect as FIG. 7A and FIG. 7B. Specifically, as shown in FIG. 8A, the configuration of the stacked structure from the top to the bottom of the first circuit board CB1 is the first trace Ts1_1, the second trace Ts1_2, the first primary-side trace Tp1, the first primary-side trace Tp1, the second trace Ts1_2, the first trace Ts1_1, the second trace Ts1_2, the first trace Ts1_1, the first primary-side trace Tp1, the first primary-side trace Tp1, the first trace Ts1_1, and the second trace Ts1_2.

In FIG. 8A and FIG. 8B, when the first primary-side circuit 1A operates to cause the first primary-side trace Tp1 to generate the first direction magnetic flux F D1 and cause the magnetic flux to shift, the second direction magnetic flux F_D2 generated by the first secondary-side trace Ts1 shifts the magnetomotive force MMF in the opposite direction, and vice versa. In FIG. 7A, the layer between the first primary-side trace Tp1 and the first secondary-side trace Ts1 may form a sensing layer Cp. When the number of sensing layers Cp is greater, the coupling effect between the primary-side trace Tp1 and the secondary-side trace Ts1 is better (eight sensing layers Cp are shown in FIG. 7A). On the contrary, when the number of sensing layers Cp is smaller, the common mode noise will be smaller, so that the effect of suppressing electromagnetic interference is better (four sensing layers Cp are shown in FIG. 8A).

Figure 9A:
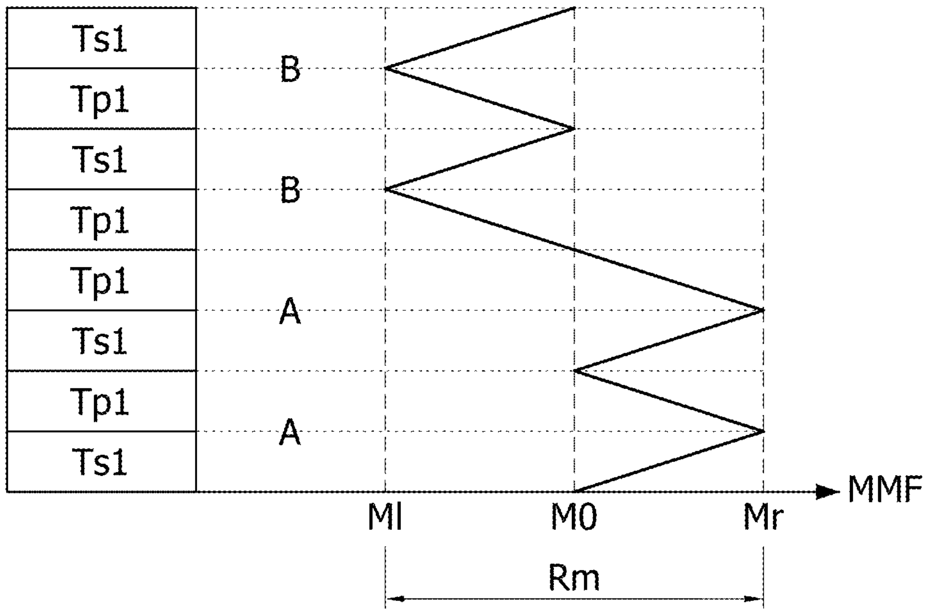
FIG. 9A to FIG. 9H are stacked structures and magnetomotive force curves on each layer of the first circuit board of the planar first transformer according to the third to tenth embodiments of the present disclosure.
Figure 9B:
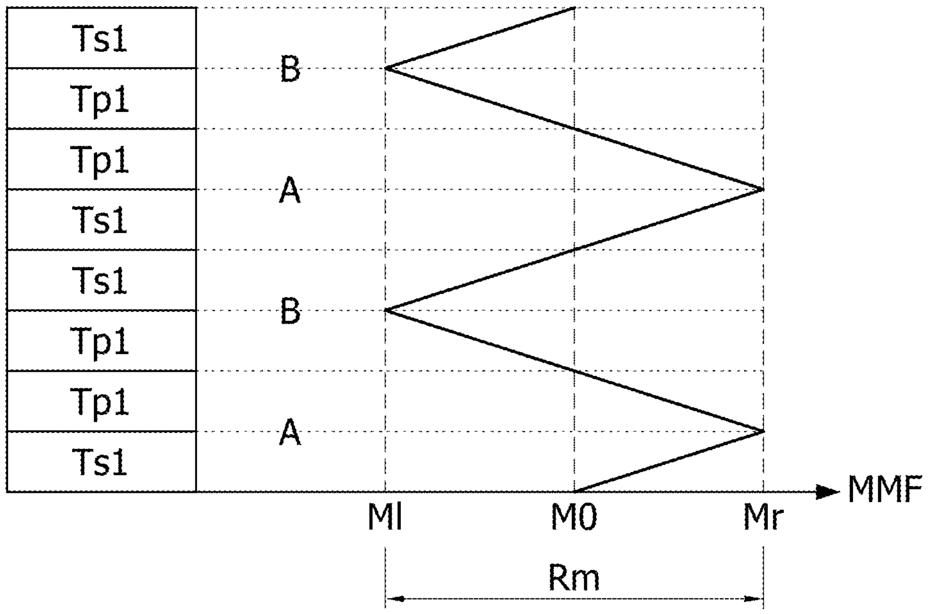
Figure 9C:
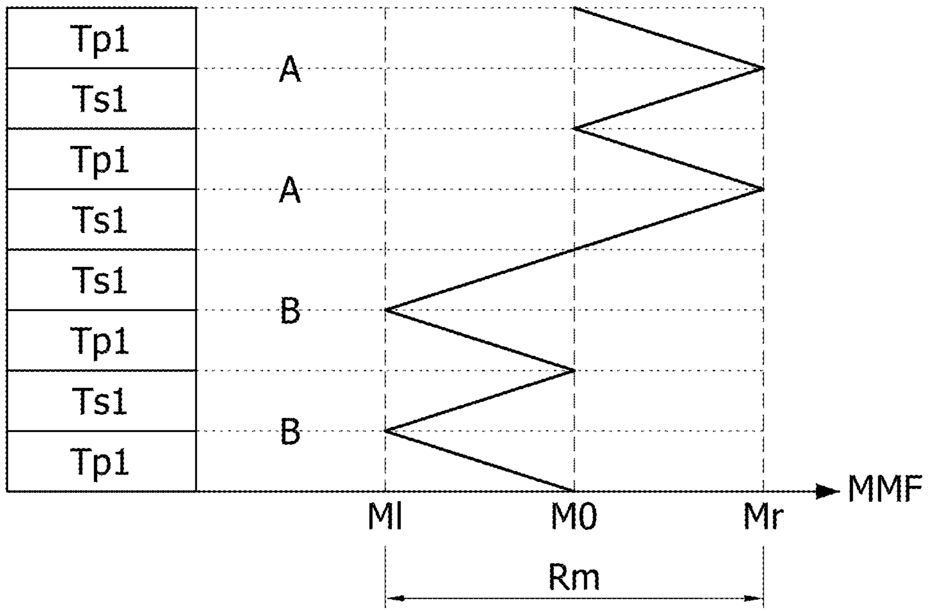
Figure 9D:
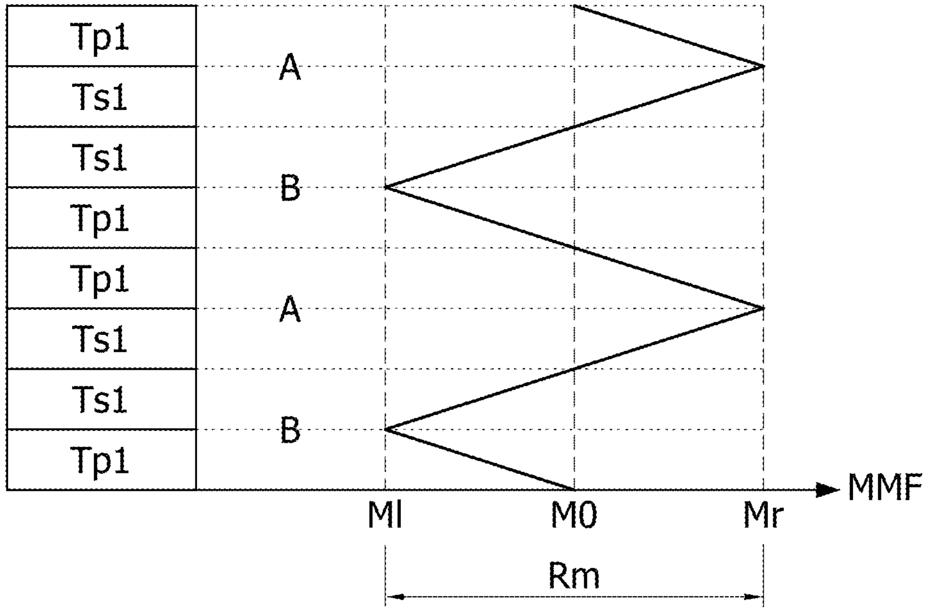
Figure 9E:
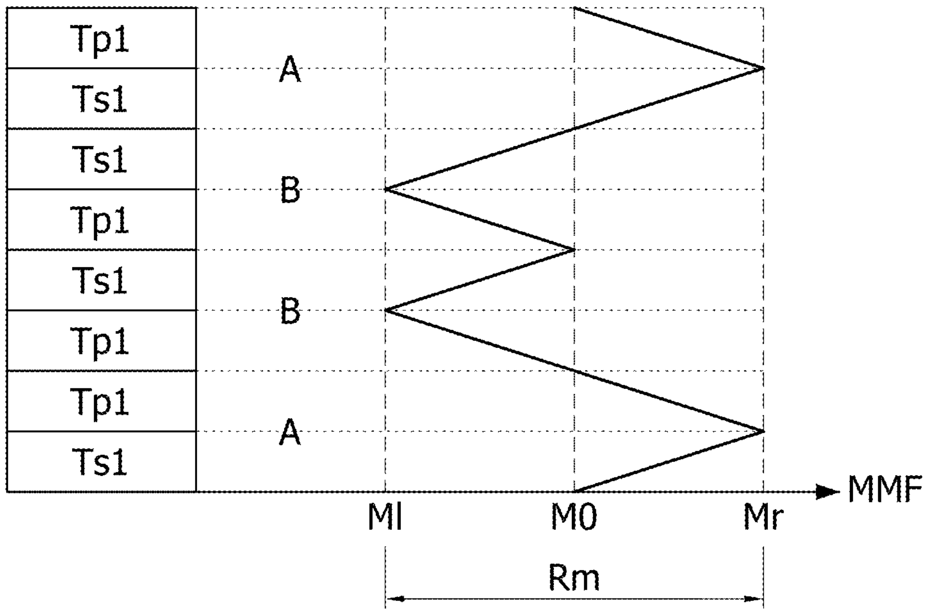
Figure 9F:
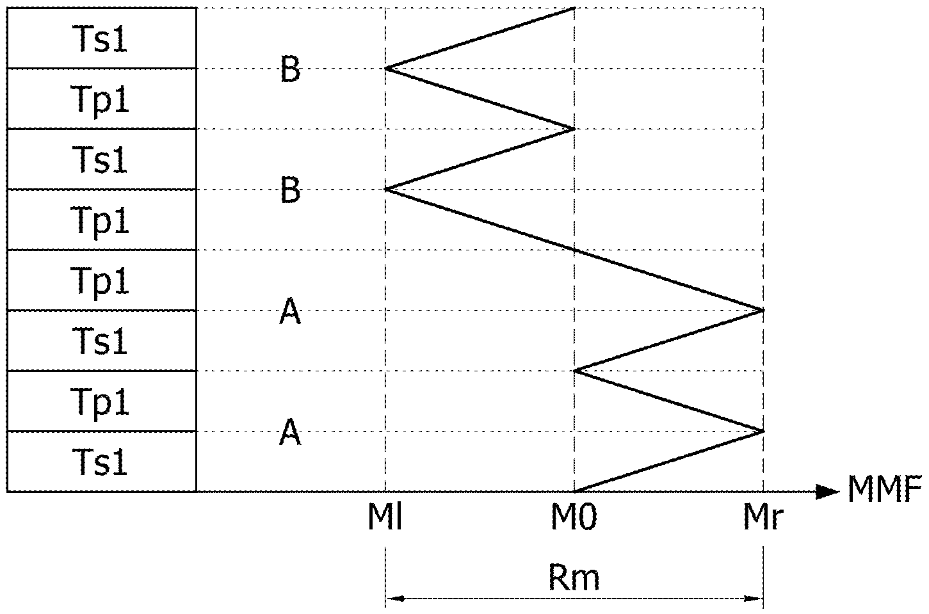
Figure 9G:
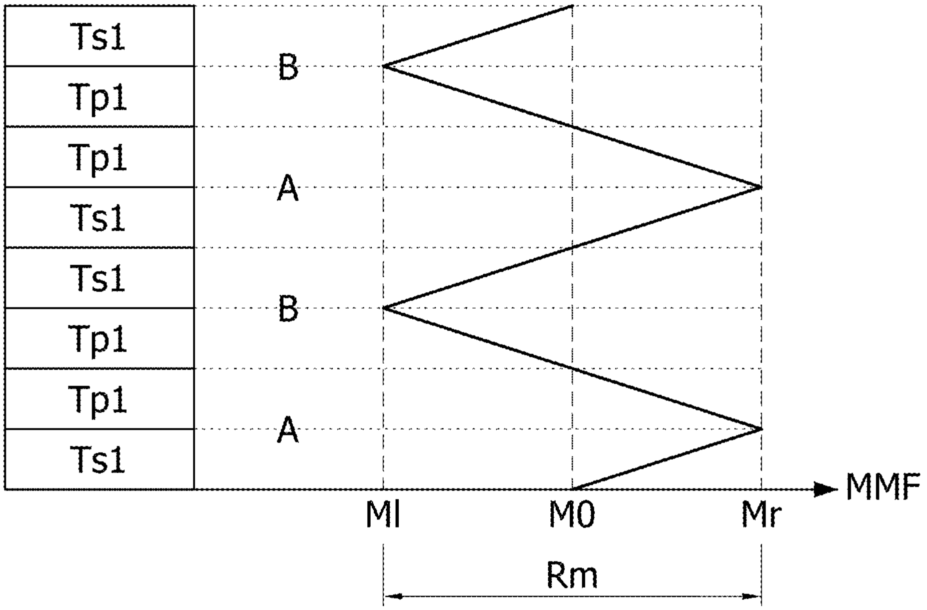
Figure 9H:
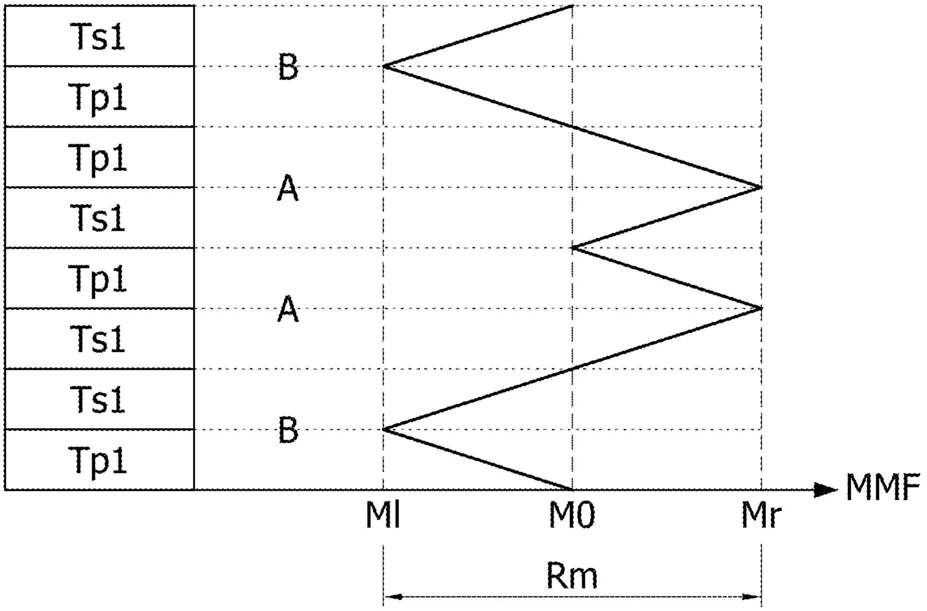

Please refer to FIG. 9A to FIG. 9H, which respectively show stacked structures and magnetomotive force curves on each layer of the first circuit board of the planar first transformer according to the third to tenth embodiments of the present disclosure, and also refer to FIG. 3A to FIG. 8B. In FIG. 9A and FIG. 9H, the first circuit board CB1 is a 12-layer board, and the first secondary-side trace Ts1 includes the first trace Ts1_1 and the second trace Ts1_2 (the first trace Ts1_1 and the second trace Ts1_2 are simplified to only one layer). In particular, the stacked structure of the first circuit board CB1 is shown in FIG. 9A and FIG. 9H and will not be described again here. The stacked structure of each layer of the first circuit board CB1 of the present disclosure enables the arrangement of the primary-side traces and the secondary-side traces to form a magnetomotive force MMF that is distributed in the thickness direction of the circuit board to form a consistent number of peaks on the left and right sides. Furthermore, the following commonalities can be summarized from the magnetomotive force curves shown in FIG. 7A to FIG. 9H:

1. After the magnetomotive force MMF shifts to one side, it will not shift in the same direction subsequently. The magnetomotive force MMF will definitely be pulled back to the magnetic flux origin M0 by the magnetic flux in the opposite direction (it is not excluded that it will first pass through the horizontal magnetic flux).
2. The number of times the magnetomotive force MMF reaches the first predetermined offset M1 is equal to the number of times it reaches the second predetermined offset Mr.
3. The number B of the (closed) waveforms of the triangle (or trapezoid) formed by the magnetomotive force MMF between the magnetic flux origin M0 and the first predetermined offset M1 is preferably equal to the number A of the (closed) waveform of the triangle (or trapezoid) formed by the magnetomotive force MMF between the magnetic flux origin M0 and the second predetermined offset Mr so as to provide good magnetic flux distribution (that is, the distribution to the left and right of the magnetic flux origin M0 is relatively even).
4. The magnetomotive force MMF starts from the magnetic flux origin M0 and finally returns to the magnetic flux origin M0 to achieve the effect of magnetic flux balance. The magnetomotive force MMF takes the magnetic flux origin M0 as the midpoint and presents a symmetrical and complementary curve on the left and right.

Figure 10A:
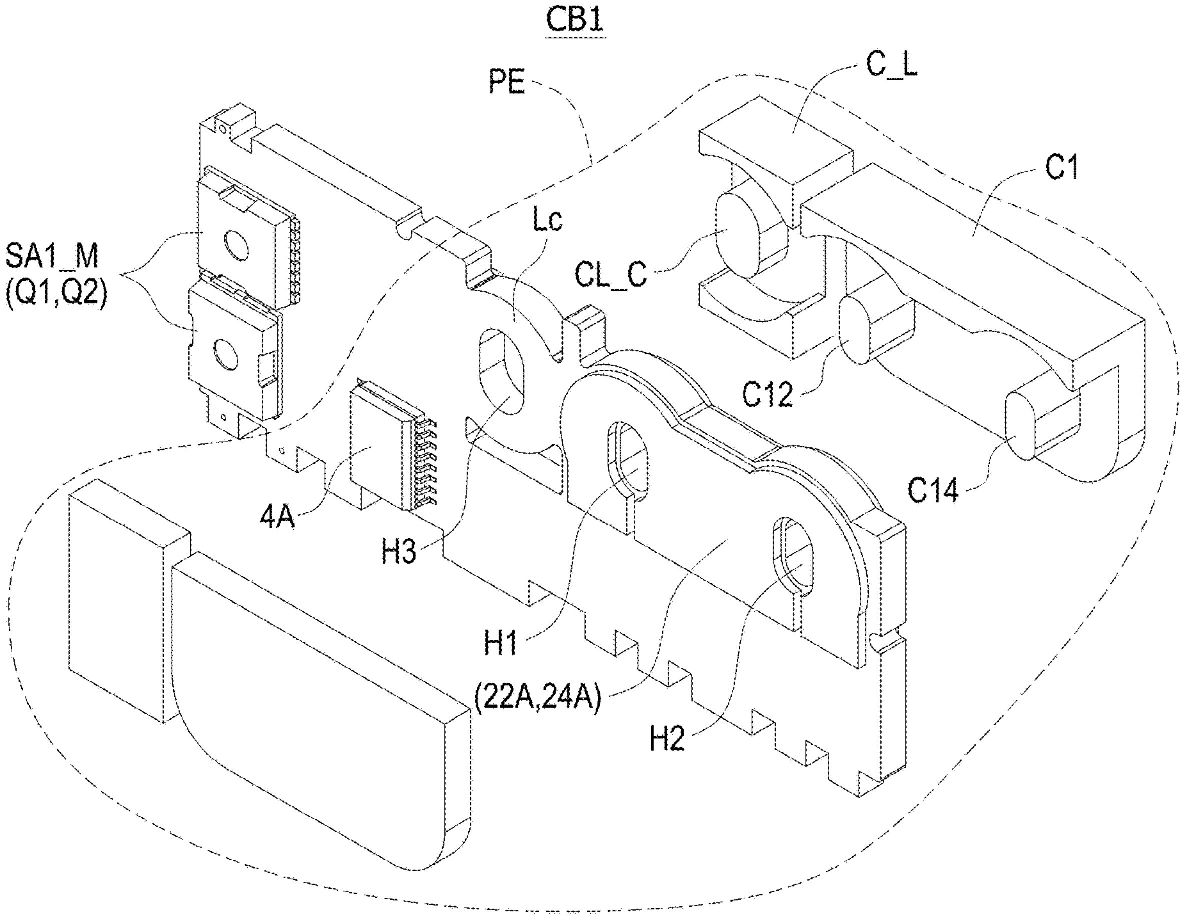
FIG. 10A is a schematic structural diagram of the disclosed inductor core and the first iron core with the first through hole, the second through hole and the third through hole.
Figure 10B:
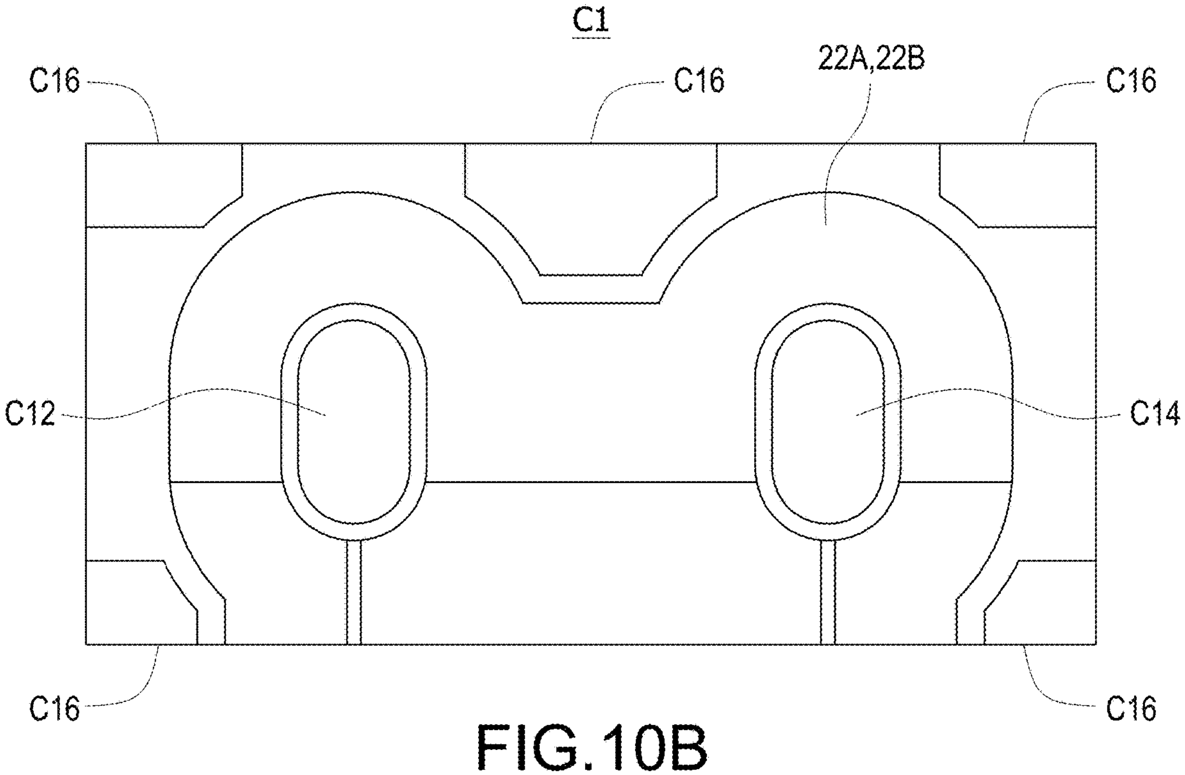
FIG. 10B is a schematic structural diagram of another embodiment of the first iron core of the present disclosure.

Please refer to FIG. 10A, which shows a schematic structural diagram of the disclosed inductor core and the first iron core with the first through hole, the second through hole and the third through hole; please refer to FIG. 10B, which shows a schematic structural diagram of another embodiment of the first iron core of the present disclosure, and also refer to FIG. 3A to FIG. 9H. In FIG. 3B, FIG. 3C, and FIG. 4A to FIG. 4L, the first core pillar C12 and the second core pillar C14 of the first transformer 2A may both be circular pillars. However, since the magnetic field lines must complete the circuit in the shortest path, the circular cylinder (circular pillar) structure will cause the magnetic field lines to gather at a circular point, which may cause uneven distribution of the magnetic field. Therefore, in FIG. 10A, the cylinder shapes of the first core pillar C12 and the second core pillar C14 of the first transformer 2A can be changed to elliptical cylinders with straight sides. Moreover, the hole shapes of the first through hole H1 and the second through hole H2 may also be elliptical through holes for the first core pillar C12 and the second core pillar C14 to penetrate. Furthermore, since the adjacent sides of the two core pillars C12,C14 are substantially parallel straight lines, the shortest distances between them are the same. That is, the cylinder shape of the first core pillar C12 and the cylinder shape of the second core pillar C14 are respectively elliptical cylinders, and the arcs of the two adjacent sides can be relatively gentle, or preferably can be parallel straight lines, thereby increasing the magnetic field distribution between traces and increasing efficiency.

In addition, please refer to another embodiment of the first iron core C1 shown in FIG. 10B. In FIG. 10B, in addition to the first core pillar C12 and the second core pillar C14, the first iron core C1 further includes a plurality of side pillars C16. The side pillars C16 are respectively formed on the sides of the first iron core C1 and surround the first core pillar C12 and the second core pillar C14 respectively. The first circuit board CB1 has a plurality of side through holes for the penetration of side pillars C16 to meet the needs of penetrating these side pillars. By the design of the side pillars C16 in FIG. 10B, the magnetic flux can not only pass through the first core pillar C12 and the second core pillar C14, but also can pass through the side pillars C16 to make the magnetomotive force MMF more balanced so that the current of the first transformer 2A on each layer of the traces of the first circuit board CB1 can be made more even. Therefore, it is avoided that most of the current flows through the traces of certain layers, resulting in uneven current distribution, which causes the heat sources to be concentrated on the traces of certain layers and reduces the conversion efficiency of the DC conversion module CR_DC. In addition, the materials of the first iron core C1 and the inductor core C_L of the present disclosure may be, for example, but not limited to, ferrite, but are not limited thereto. All magnetically permeable materials that can be used as iron core materials should be included in the scope of this embodiment.

On the other hand, although not shown in FIG. 10A, the core pillar C_LC of the inductor core C_L may also be an elliptical cylinder (elliptical pillar), and the hole shape of the third through hole H3 may also be an elliptical through hole. Specifically, the two core pillars C12,C14 of the first transformer 2A are designed in an elliptical shape, mainly to achieve an even distribution of the magnetic field lines. However, the design of the core pillar C_LC of the resonant inductor Lr is not mainly based on the distribution of the magnetic field lines, but the distribution of magnetomotive force MMF caused by the distribution of traces. Therefore, when the core pillar C_LC is circular, the wiring area of the inductor trace T1 is average and the current path is short. On the contrary, if an elliptical shape is used, the trace of the inductor trace T1 is thicker at the arc and thinner at the straight line, and the current path is longer. Therefore, the circular or elliptical shape can be selected based on the requirements of the resonant inductor Lr. On the other hand, in the resonant inductance Lr, due to the distribution of magnetomotive force MMF, the more turns of the inductor coil Lc, there will be a disproportionately high loss. Therefore, by using an EE-type or EI-type iron core through the inductor core C_L, the mutual inductance coupling between the two pillars can be used to achieve the effect of one plus one more than two and a smaller number of turns can be used to achieve the desired inductance. Therefore, as shown in FIG. 10A, the inductor core C_L may also include two side pillars, and the corresponding side through holes are also provided on the first circuit board CB1 to be penetrated by the two side pillars of the inductor core C_L. Similarly, in addition to the iron core shown in FIG. 10B, the first iron core C1 may also use an EE-type or EI-type iron core. The functions are similar to those mentioned above and will not be described again here.

Please refer to FIG. 3A to FIG. 3C, the inductor core C_L may include an air gap (not shown). Since the number of layers of the inductor trace T1 is a specific number, the inductance value of the resonant inductor Lr can be controlled by adjusting the air gap of the inductor core C_L. On the other hand, since the resonant inductor Lr is separated from the first iron core C1 of the first transformer 2A, the air gap of the inductor core C_L can be accurately controlled. In particular, the air gap of the inductor core C_L may usually be formed in the core pillar C_LC, but is not limited to this. Any position where the inductance value of the resonant inductor Lr can be adjusted is formed and should be included in the scope of this embodiment. In addition, the first iron core C1 may also include an air gap (not shown) to increase the magnetic resistance of the first transformer 2A and reduce the probability of magnetic saturation of the first transformer 2A. A similar air gap of the first iron core C1 can usually be formed in the first core pillar C12 and/or the second core pillar C14, but is not limited thereto. Any formation position that can increase the magnetic resistance of the first transformer 2A should be included in the scope of this embodiment. In addition, the size of air gap of the inductor core C_L and the first iron core C1 may be different to meet the needs of individual parameter adjustment.

In addition, in FIG. 10A, the first iron core C1 and the inductor core C_L are in separate configurations. The main reason is that individual parameters (such as but not limited to, inductance value, mutual inductance value, etc.) of the first transformer 2A and the resonant inductor Lr can be easily fine-tuned. Moreover, the advantage of the separate configuration is that the core production at the factory is relatively simple and the materials are easy to acquire. However, if a modular design is considered, the first iron core C1 and the inductor core C_L can also be configured to be integrally formed to facilitate the installation of the DC conversion module CR_DC. Therefore, by the component modular design of the first iron core C1 and the inductor core C_L in FIG. 10A and FIG. 10B, the planar transformer can increase the space utilization to effectively reduce the contact impedance and increase efficiency, and increase power density. In addition, by the effective distribution of the first primary-side coil 22A and the first secondary-side coil 24A, the AC eddy current loss can be reduced and the efficiency can be increased. Moreover, changing the first iron core C1 from a circular shape to an elliptical shape can increase the magnetic field distribution between coils and increase efficiency.

Figure 11A:
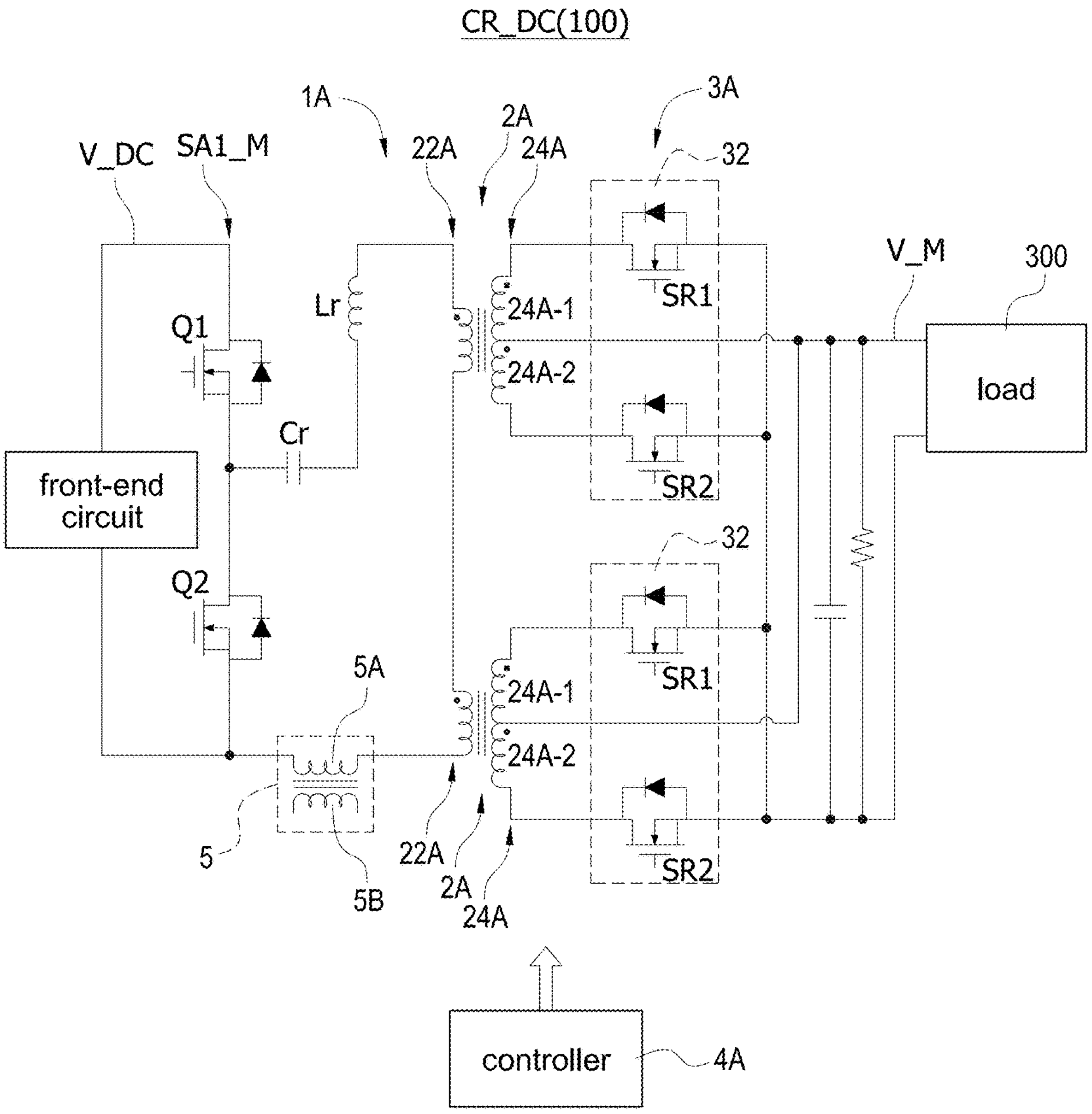
FIG. 11A is a circuit block diagram of a conventional current converter coupled to the resonant converter of the present disclosure.
Figure 11B:
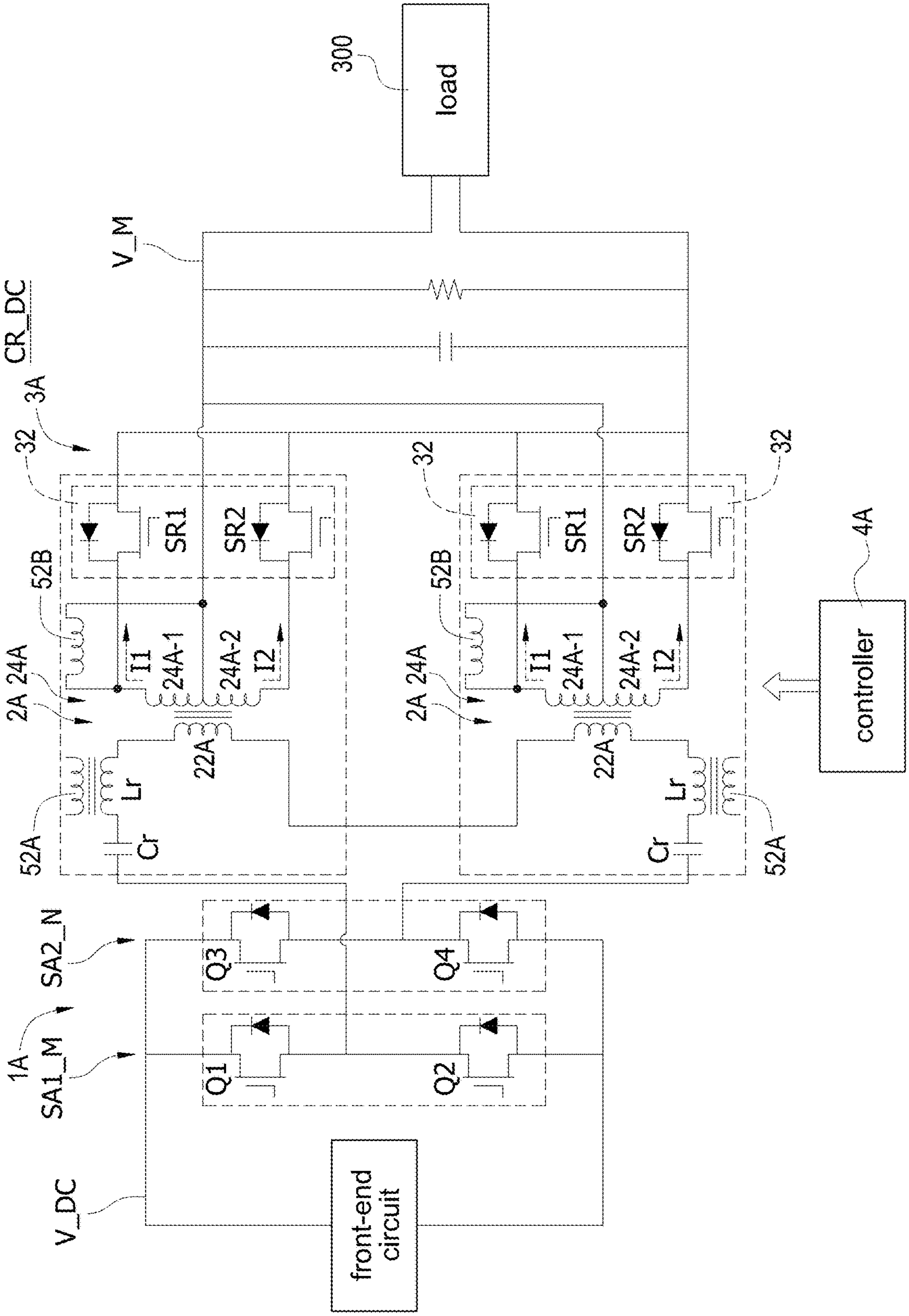
FIG. 11B is a circuit block diagram of a resonant converter according to another embodiment of the present disclosure and a current transformer coil of the present disclosure.

Please refer to FIG. 11A, which shows a circuit block diagram of a conventional current converter coupled to the resonant converter of the present disclosure; please refer to FIG. 11B, which shows a circuit block diagram of a resonant converter according to another embodiment of the present disclosure and a current transformer coil of the present disclosure, and also refer to FIG. 3B, FIG. 3C and FIG. 4A to FIG. 4L. In FIG. 11A, the traditional current detection is to connect a current transformer (CT) 5 in series on the primary-side path, and the current transformer 5 includes a current transformer primary-side coil 5A and a current transformer secondary-side coil 5B. The current transformer 5 usually requires the current transformer primary-side coil 5A and the current transformer secondary-side coil 5B to be wound around the current transformer core to detect the current, and therefore larger space and safety distance are usually required to meet the design requirements. Therefore, it is also impossible to effectively reduce the size of the resonant converter, resulting in the problem that the power supply is bulky and has poor power density.

In FIG. 11B, the disclosed DC conversion module CR_DC is composed of the resonant converter 100 of another embodiment. The difference between the resonant converter 100 of FIG. 11B and the resonant converter 100 of FIG. 3A is that the first primary-side circuit 1A includes two first switch bridge arms SA1_M,SA1_N and two resonant tanks (i.e., the resonant inductor Lr and the resonant capacitor Cr). In addition, the DC conversion module CR_DC further includes current transformer coils 52A,52B. Compared with the conventional current transformer 5 in FIG. 11A which includes the current transformer primary-side coil 5A and the current transformer secondary-side coil 5B, in this disclosure, since the current transformer primary-side coil 5A is integrated in the resonant inductor Lr and the first secondary-side coil 24A, the present disclosure does not include the current transformer primary-side coil 5A. Moreover, the current transformer coils 52A,52B serve as the current transformer secondary-side coil 5B for sensing the current flowing through the resonant inductor Lr and the first secondary-side coil 24A. On the other hand, the current transformer coils 52A,52B of FIG. 11B may be coupled to, for example, but not limited to, a current detection circuit (not shown). The current detection circuit can generate a voltage signal according to the current sensed by the current transformer coils 52A,52B, so as to provide the voltage signal to the first controller 4A. Therefore, the first controller 4A can acquire the magnitude of the current flowing through the resonant inductor Lr and the first transformer 2A through calculation of the voltage signal.

Figure 11C:
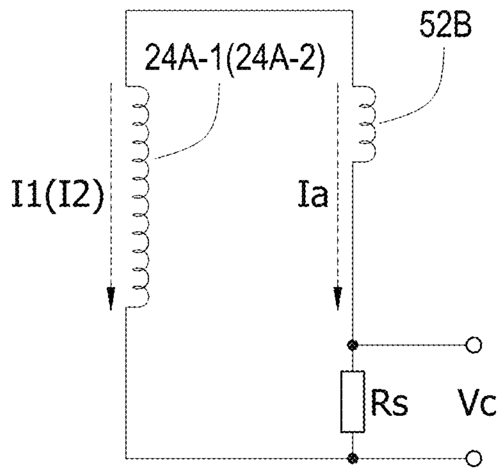
FIG. 11C is a schematic diagram of the circuit structure of the current transformer coil coupled to the first secondary-side coil of the present disclosure.

Please refer to FIG. 11C, which shows a schematic diagram of the circuit structure of the current transformer coil coupled to the first secondary-side coil of the present disclosure, and also refer to FIG. 3B, FIG. 3C and FIG. 4A to FIG. 4L. One terminal of the current transformer coil 52B is coupled to one terminal of the first coil 24A-1 or the second coil 24A-2, and the other terminal of the current transformer coil 52B is coupled to a detection resistor Rs, and therefore the current transformer coil 52B and the detection resistor Rs are connected in parallel to the first coil 24A-1 or the second coil 24A-2. For convenience of explanation, the secondary-side currents Is flowing through the rectification switches SR1,SR2 are distinguished as a first current I1 and a second current I2 respectively. When the current transformer coil 52B is coupled to the first coil 24A-1 and the first current I1 flows through the first coil 24A-1, the current transformer coil 52B induces a sensing current Ia. The sensing current Ia flowing through the detection resistor Rs can generate a cross-voltage Vc on the detection resistor Rs, and a back-end coupled current detection circuit (not shown) can generate a voltage signal according to the cross-voltage Vc. Furthermore, since the voltage across the first coil 24A-1 will be equal to the voltage across the current transformer coil 52B and the detection resistor Rs, and the first current I1 has a corresponding relationship with the sensing current Ia, the first controller 4A can realize the size of the first current I1 by calculating the cross voltage Vc. On the other hand, when the current transformer coil 52B is coupled to the second coil 24A-2, the operation is similar to the first coil 24A-1 and will not be described again. Since the current transformer coil 52B is only used to sense the shunt current (i.e., the sensing current Ia), its current value should not be too large. Therefore, the resistance value of the detection resistor Rs should not be too small. For example, but not limited to, a resistor with a resistance value above 10 kΩ is preferably configured. Therefore, the resistance value of the detection resistor Rs should not be too small. For example, but not limited to, a resistor with a resistance value above 10 kΩ is preferably configured.

Figure 12A:
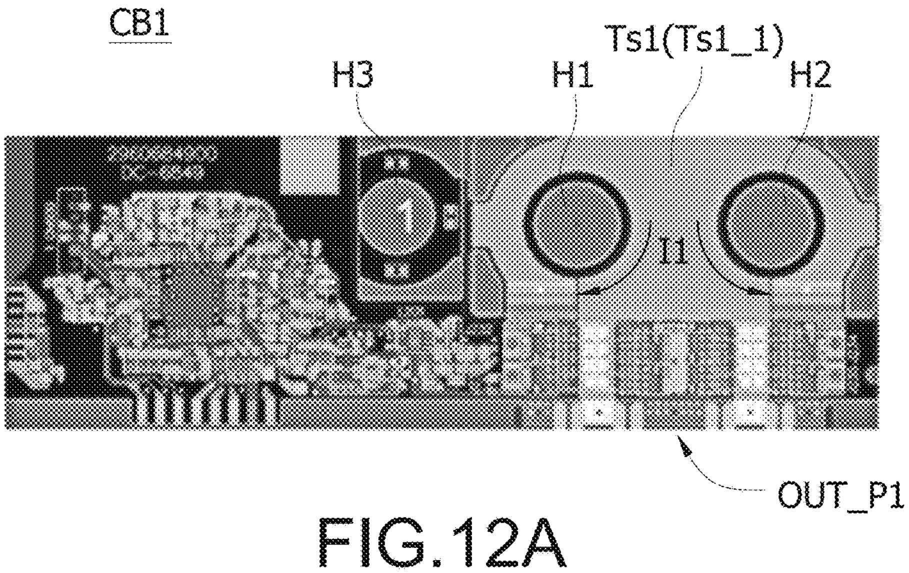
FIG. 12A to FIG. 12L are schematic diagrams of the wiring of the coil of the flat magnetic component on each layer of the first circuit board according to another embodiment of the present disclosure.
Figure 12B:
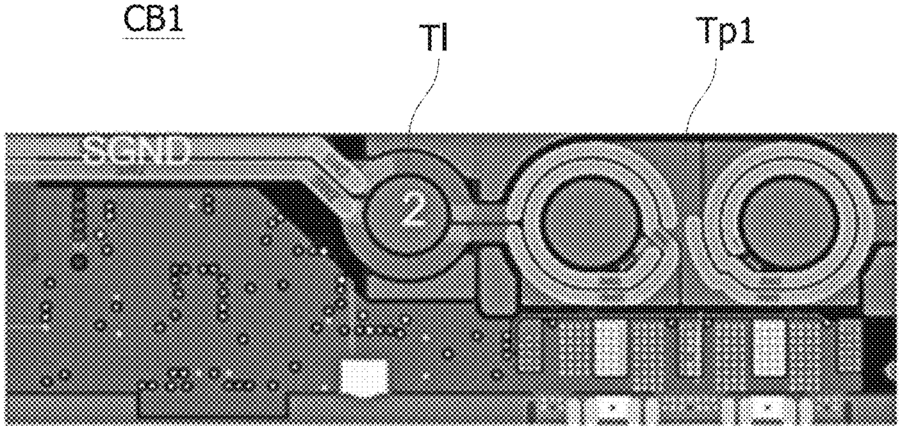
Figure 12C:
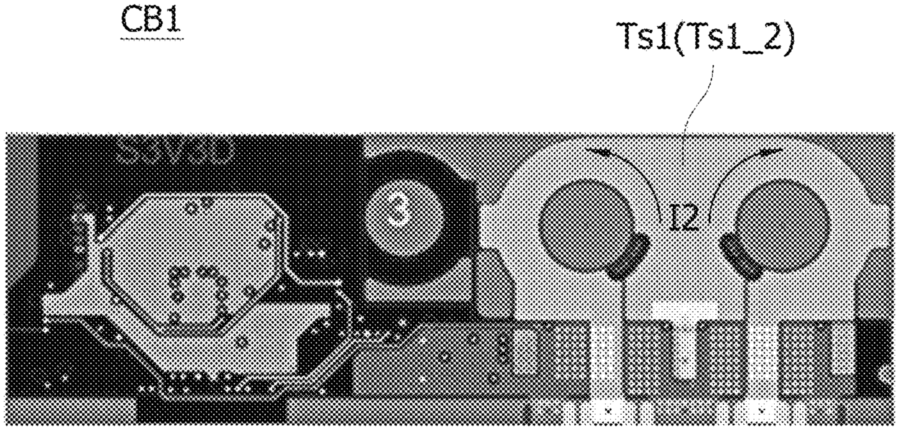
Figure 12D:
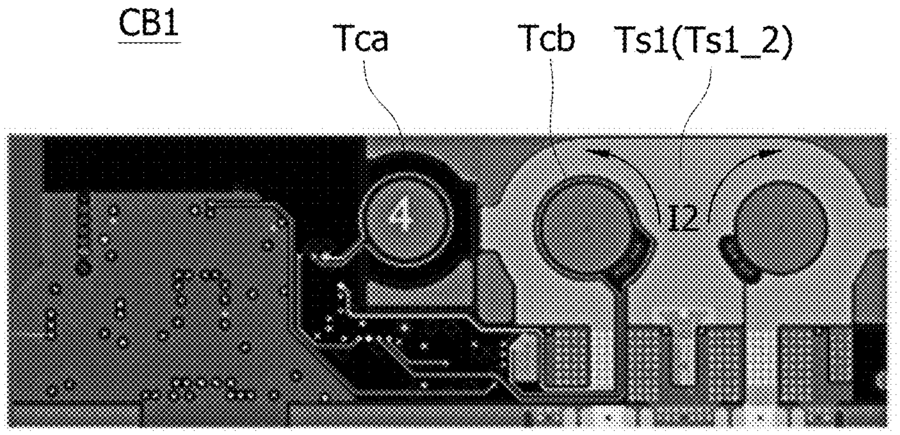
Figure 12E:
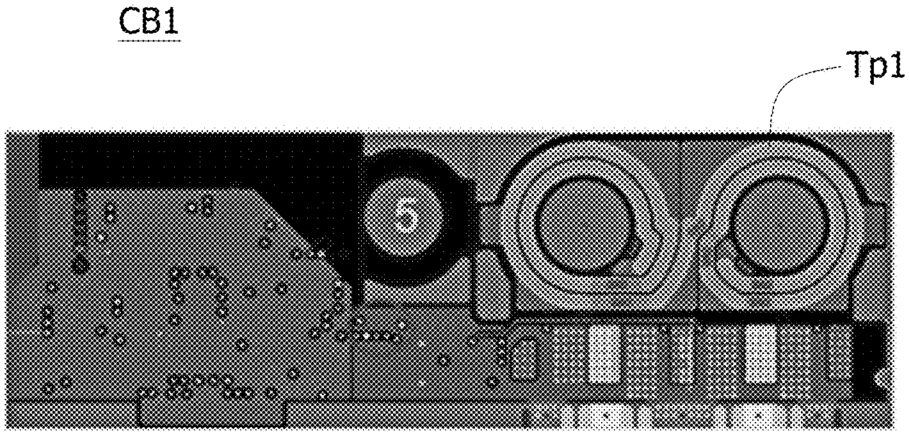
Figure 12F:
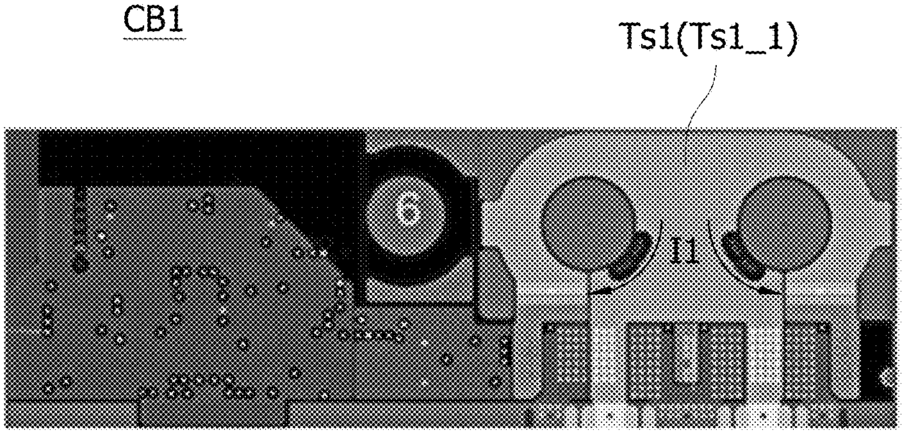
Figure 12G:
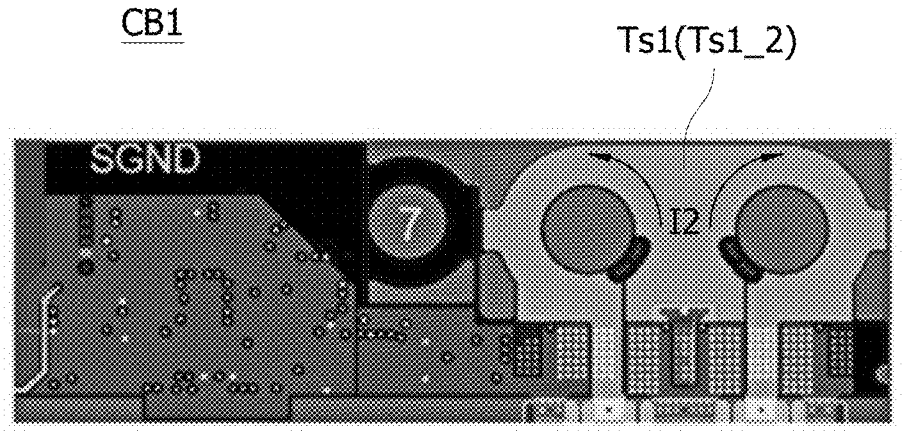
Figure 12H:
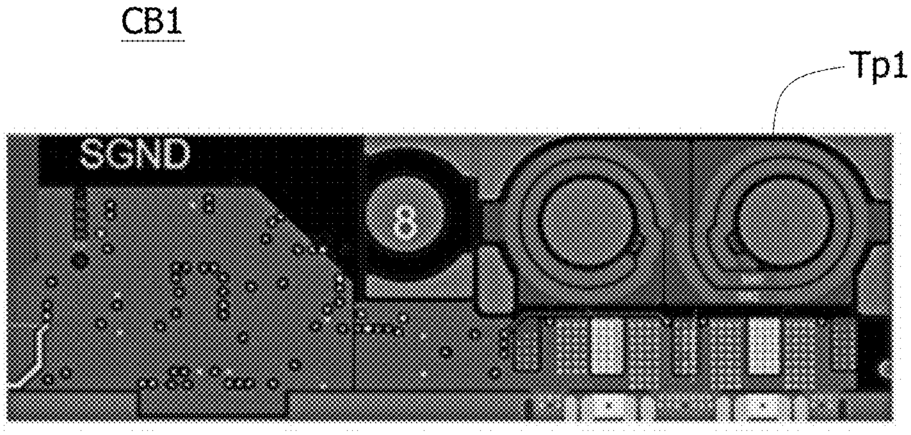
Figure 12I:
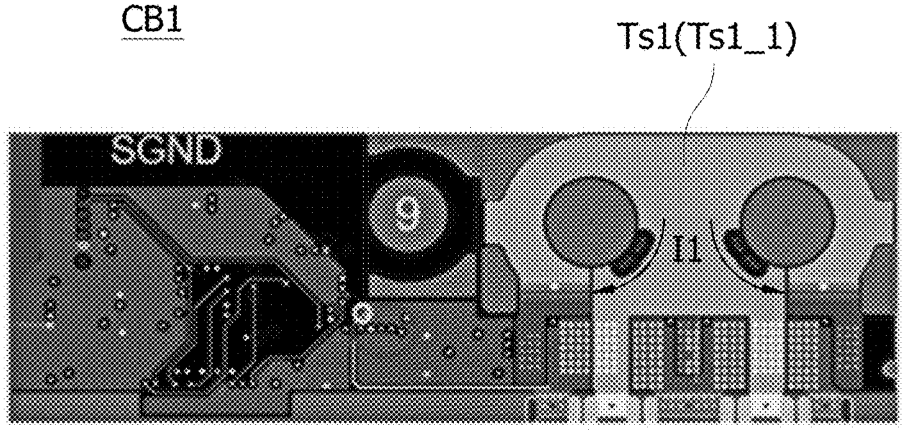
Figure 12J:
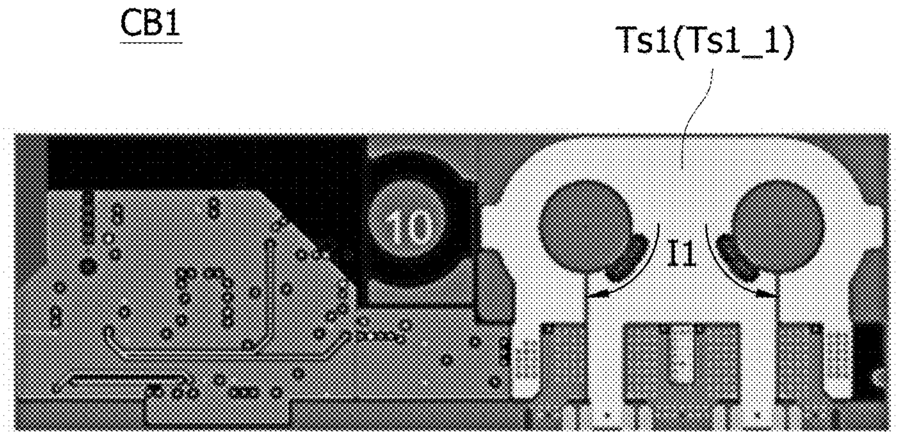
Figure 12K:
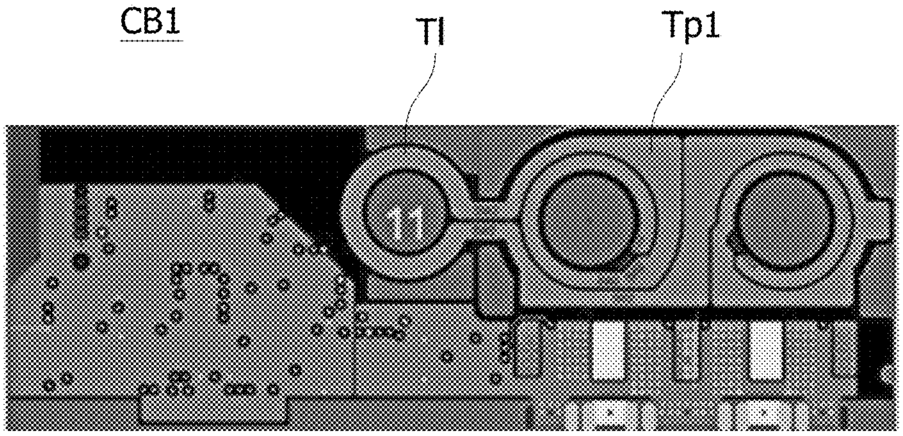
Figure 12L:
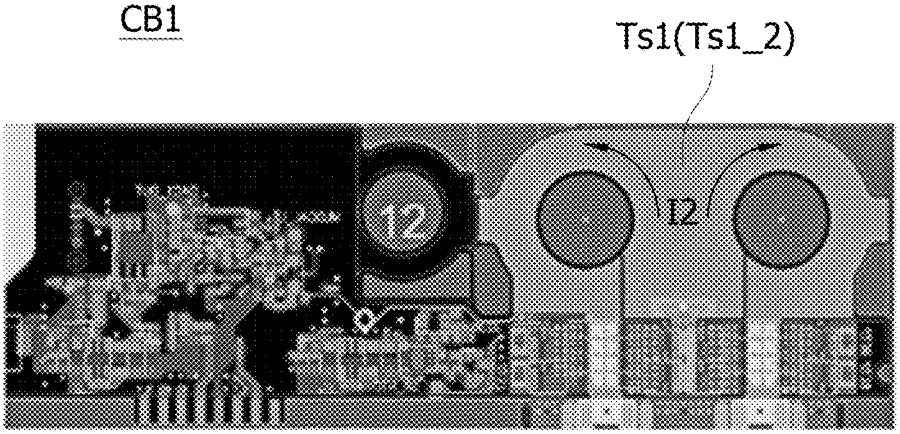

Please refer to FIG. 12A to FIG. 12L, which respectively show schematic diagrams of the wiring of the coil of the flat magnetic component on each layer of the first circuit board according to another embodiment of the present disclosure, and also refer to FIG. 11A to FIG. 11C, FIG. 4A to FIG. 4L, and FIG. 12A to FIG. 12L. The difference between the traces of each layer in FIG. 12A to FIG. 12L and the traces of each layer in FIG. 4A to FIG. 4L is that the traces of each layer in FIG. 12A to FIG. 12L is mainly formed corresponding to the transformer 2A and current transformer coils 52A,52B in FIG. 11B, and the first secondary-side trace Ts1 is filled with the flow direction of the first current I1 and the second current I2, but the principle is the same as that in FIG. 4A to FIG. 4L and will not be described again here. In particular, the main feature of FIG. 12A to FIG. 12L is that the current transformer traces Tca,Tcb are shown in FIG. 12D, and the current transformer traces Tca,Tcb serve as current transformer coils 52A,52B respectively. The current transformer trace Tca and the inductor trace T1 are arranged on different layer boards, and the current transformer trace Tca surrounds the third through hole H3 to couple the inductor trace T1 of the different layer board. Therefore, the circuit board CB1 can form a closed magnetic circuit after the inductor core C_L is sleeved on the inductor trace T1 and the current transformer trace Tca to constitute the resonant inductor Lr and the current transformer with a common iron core structure with the resonant inductor Lr. The current transformer trace Tcb and the second trace Ts1_2 are configured on the same layer board, and the current transformer trace Tcb and the second trace Ts1_2 of the secondary-side trace Ts1 have a concentric circle structure. On the other hand, the current transformer trace Tcb can also be configured on the same layer board as the first trace Ts1_1, and the current transformer trace Tcb and the second trace Ts1_2 of the secondary-side trace Ts1 have a concentric structure.

Please refer to FIG. 12D again, the current transformer trace Tcb surrounds the first through hole H1 to couple the second trace Ts1_2 of the same layer board. Therefore, the first circuit board CB1 can form a closed magnetic circuit to form the first transformer 2A and a current transformer with a common core structure as the first transformer 2A after the first iron core C1 is sleeved on the first primary-side trace Tp1, the first secondary-side trace Ts1, and the current transformer trace Tcb. It is assumed that the current transformer trace Tcb and the first trace Ts1_1 are configured on the same layer board, and when the synchronous rectification switch SR1 is turned on, the current transformer trace Tcb can induce the first current I1 flowing through the first trace Ts1_1. On the contrary, it is assumed that the current transformer trace Tcb and the second trace Ts1_2 are configured on the same layer board, and when the synchronous rectification switch SR2 is turned on, the current transformer trace Tcb can induce the second current I2 flowing through the second trace Ts1_2. Since the synchronous rectification switch SR1 and the synchronous rectification switch SR2 (or diodes) are designed to be in complementary conduction (forward bias), when the synchronous rectification switch SR1 is turned on, the synchronous rectification switch SR2 is turned off, and vice versa. In particular, since the current transformer trace Tcb is disposed closer to the first through hole H1 than the second trace Ts1_2 of the secondary-side trace Ts1, a closed magnetic circuit is formed to form the first transformer 2A and a current transformer having a common core structure with the first transformer 2A after the first iron core C1 is sleeved on the first secondary-side trace Ts1 and the current transformer trace Tcb.

In particular, the current transformer trace Tca surrounding the third through hole H3 has a first area, and the inductor trace T1 surrounding the third through hole H3 has a second area. Since the current transformer is mainly used to sense the current flowing through the resonant inductor Lr, and the current flowing through the current transformer coil 52A is not too large, the first area must be smaller than the second area, and the area difference is preferably $\frac{1}{5}$ to $\frac{1}{10}$. Similarly, the current transformer trace Tcb surrounding the first through hole H1 has a third area, and the first secondary-side traces Ts1 surrounding the first through hole H1 has a fourth area. In particular, the third area must be smaller than the fourth, and the area difference is preferably $\frac{1}{5}$ to $\frac{1}{10}$.

Figure 12M:
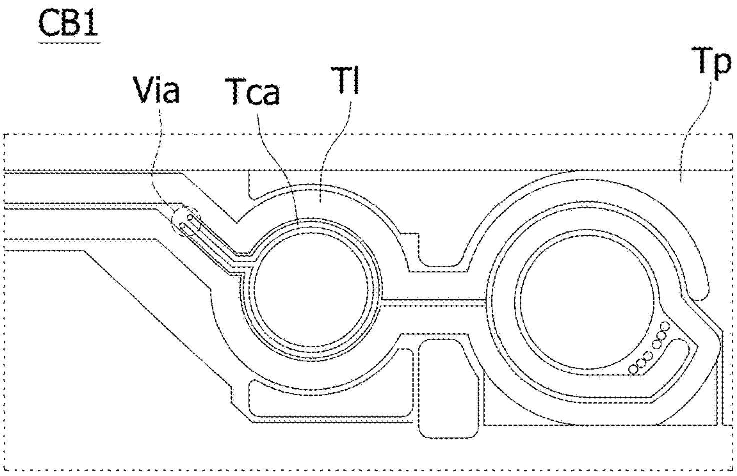
FIG. 12M to FIG. 12O are schematic diagrams of the wiring of the coil of the flat magnetic component on each layer of the first circuit board according to another embodiment of the present disclosure.
Figure 12N:
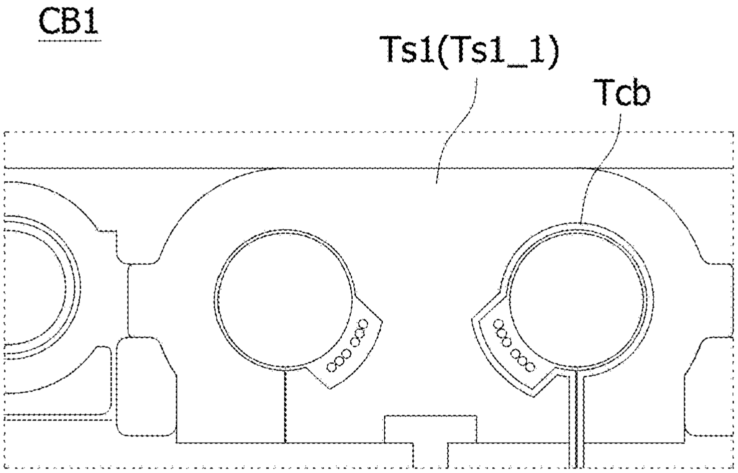
Figure 12O:
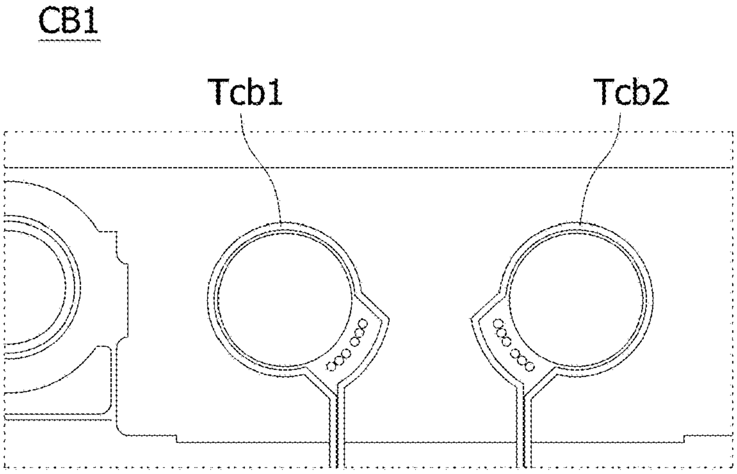

Please refer to FIG. 12M to FIG. 12O, which respectively show schematic diagrams of the wiring of the coil of the flat magnetic component on each layer of the first circuit board according to another embodiment of the present disclosure, and also refer to FIG. 3B, FIG. 3C, FIG. 4A to FIG. 4L, FIG. 11A to FIG. 11C, and FIG. 12A to FIG. 12L. The trace structures in FIG. 12M and FIG. 12O are only simple trace diagrams, so only the traces of the main components are shown, and the detailed structure can be easily inferred from the structures in FIG. 12A to FIG. 12L. In FIG. 12M, the current transformer trace Tca and the inductor trace T1 are arranged on the same layer board, and the current transformer trace Tca is disposed closer to the third through hole H3 than the inductor trace T1. In particular, the current transformer trace Tca can be coupled to the current detection circuit (not shown) through, for example, but not limited to, a via hole via. In FIG. 12N, the current transformer trace Tcb and the first trace Ts1_1 are arranged on the same layer board, and the current transformer trace Tcb and the first trace Ts1_1 of the first secondary-side trace Ts1 have a concentric structure. The current transformer trace Tcb surrounds the second through hole H2 to couple the first trace Ts1_1 that surrounds the second through hole H2 in the same layer board. Therefore, it is similar to FIG. 12D, when the synchronous rectification switch SR1 is turned on, the current transformer trace Tcb can induce the first current I1 flowing through the first trace Ts1_1. In particular, the current transformer trace Tcb is disposed closer to the second through hole H2 than the first trace Ts1_1 of the first secondary-side trace Ts1 so that a closed magnetic circuit is formed to form the first transformer 2A and a current transformer having a common core structure with the first transformer 2A after the first iron core C1 is sleeved on the first secondary-side trace Ts1 and the current transformer trace Tcb.

In FIG. 12O, the current transformer trace Tcb includes a first current transformer trace Tcb1 and a second current transformer trace Tcb2, and the second current transformer trace Tcb2 and the first current transformer trace Tcb1 are arranged on the same layer. In particular, this layer independently configures the first current transformer trace Tcb1 and the second current transformer trace Tcb2 (similar to the current transformer trace Tca FIG. 4D). This layer does not include any first trace Ts1_1 or second trace Ts1_2, but it does not exclude that the first current transformer trace Tcb1 and the second current transformer trace Tcb2 may be configured on the same layer as one of the first trace Ts1_1 and the second trace Ts1_2, as long as the second current transformer trace Tcb2 and the first current transformer trace Tcb1 are configured on the same layer. The first current transformer trace Tcb1 surrounds the first through hole H1, and the second current transformer trace Tcb2 surrounds the second through hole H2 to couple the first trace Ts1_1 and the second trace Ts1_2 of different layer boards. Since the synchronous rectification switch SR1 and the synchronous rectification switch SR2 (or diodes) are designed for complementary conduction (forward bias), when the synchronous rectification switch SR1 operates, the first current transformer trace Tcb1 and the second current transformer trace Tcb2 can induce the first current I1 flowing through the first trace Ts1_1. When the synchronous rectification switch SR2 operates, the first current transformer trace Tcb1 and the second current transformer trace Tcb2 can induce the second current I2 flowing through the second trace Ts1_2. In particular, the characteristics of the current transformer trace configuration of FIG. 4A to FIG. 4L, FIG. 11B, FIG. 11C, FIG. 12A to FIG. 12L, FIG. 12M, and FIG. 12O may be applied interchangeably, and will not be described again here.

Since the current transformer coils 52A,52B have a planar structure having current transformer traces Tca,Tcb, and are respectively integrated into the inductor trace T1 and the first secondary-side trace Ts1 to form the structure of the planar magnetic component PE, the current detection can be achieved by utilizing the turn ratio of the current transformer traces Tca,Tcb to the inductor trace T1 and the first secondary-side trace Ts1 respectively. Therefore, the DC conversion module CR_DC can omit the current transformer primary-side coil 5A and the current transformer core of the current transformer 5, thereby reducing the contact resistance caused by the current transformer, increasing efficiency, and increasing power density. In addition, the use of integrated planar magnetic component PE can increase the space utilization of the DC conversion module CR_DC and reduce the manpower assembly in the manufacturing process. Moreover, the first primary-side coil 22A and the first secondary-side coil 24A of the first transformer 2A can be effectively distributed to reduce AC eddy current losses and increase efficiency.

B-5. Configuration of DC Conversion Module

Figure 13A:
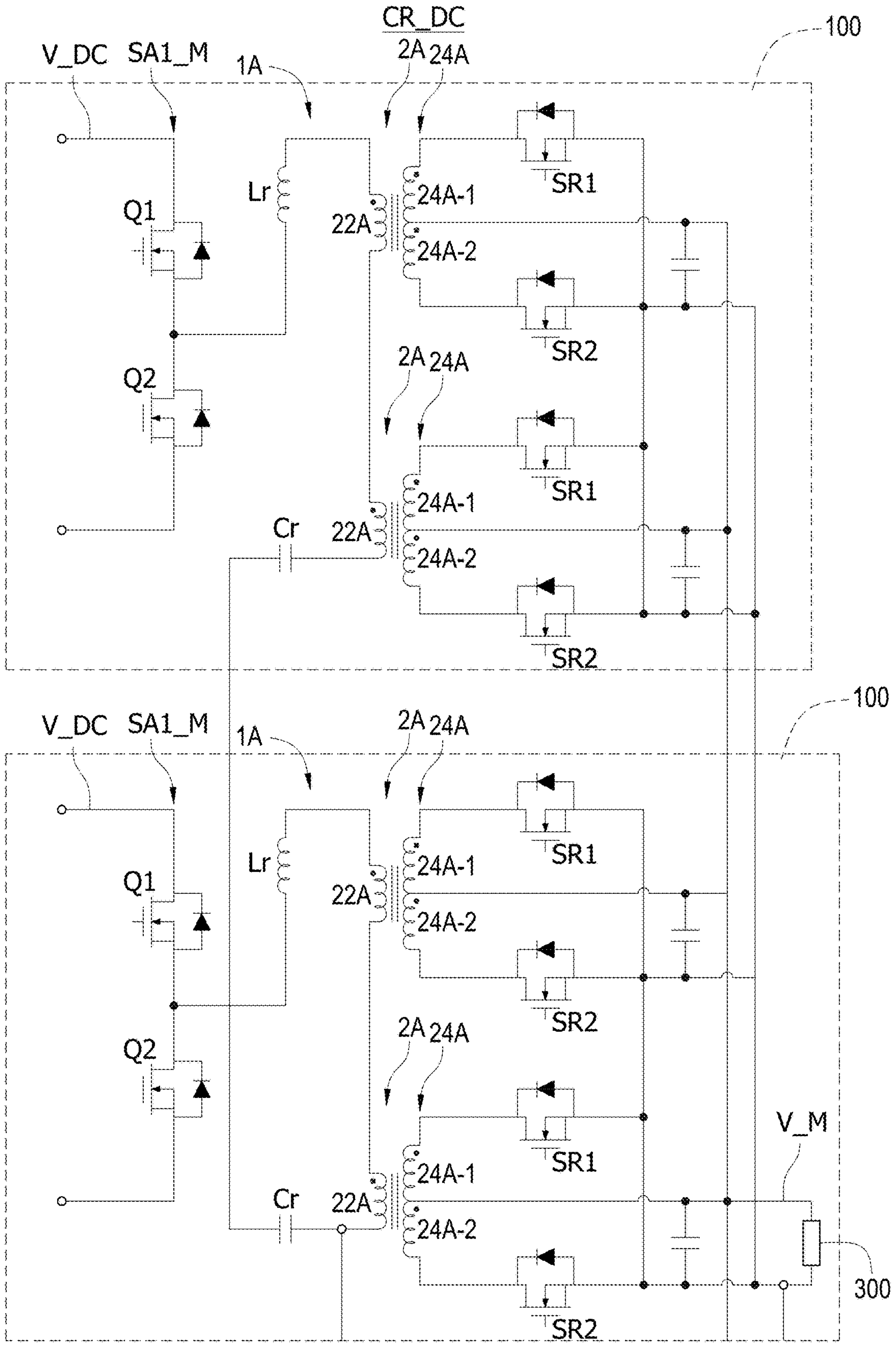
FIG. 13A is a circuit diagram of the second embodiment of the DC conversion module of the present disclosure.
Figure 13B:
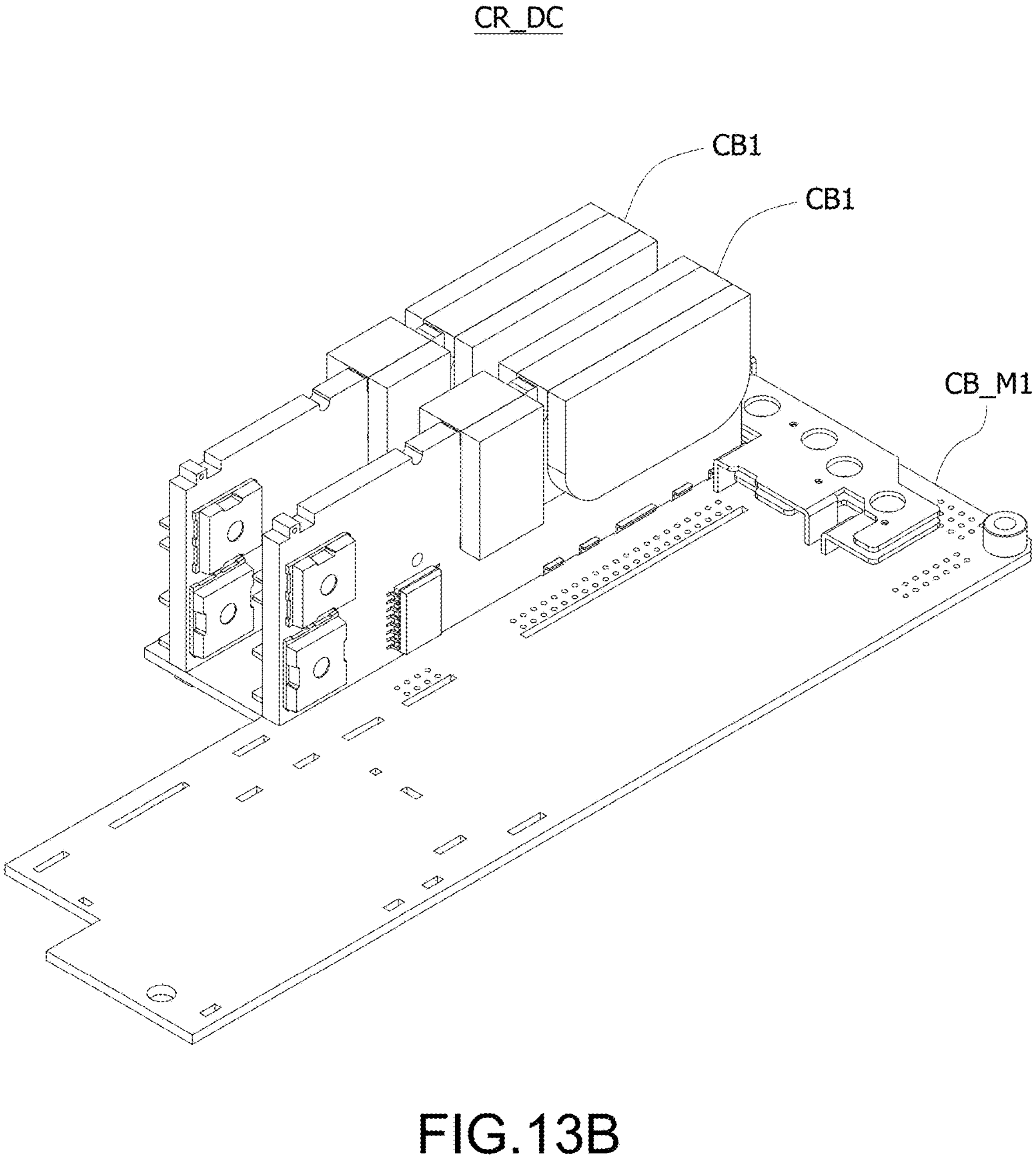
FIG. 13B is a three-dimensional circuit structure assembly diagram of the DC conversion module according to the second embodiment of the present disclosure.
Figure 13C:
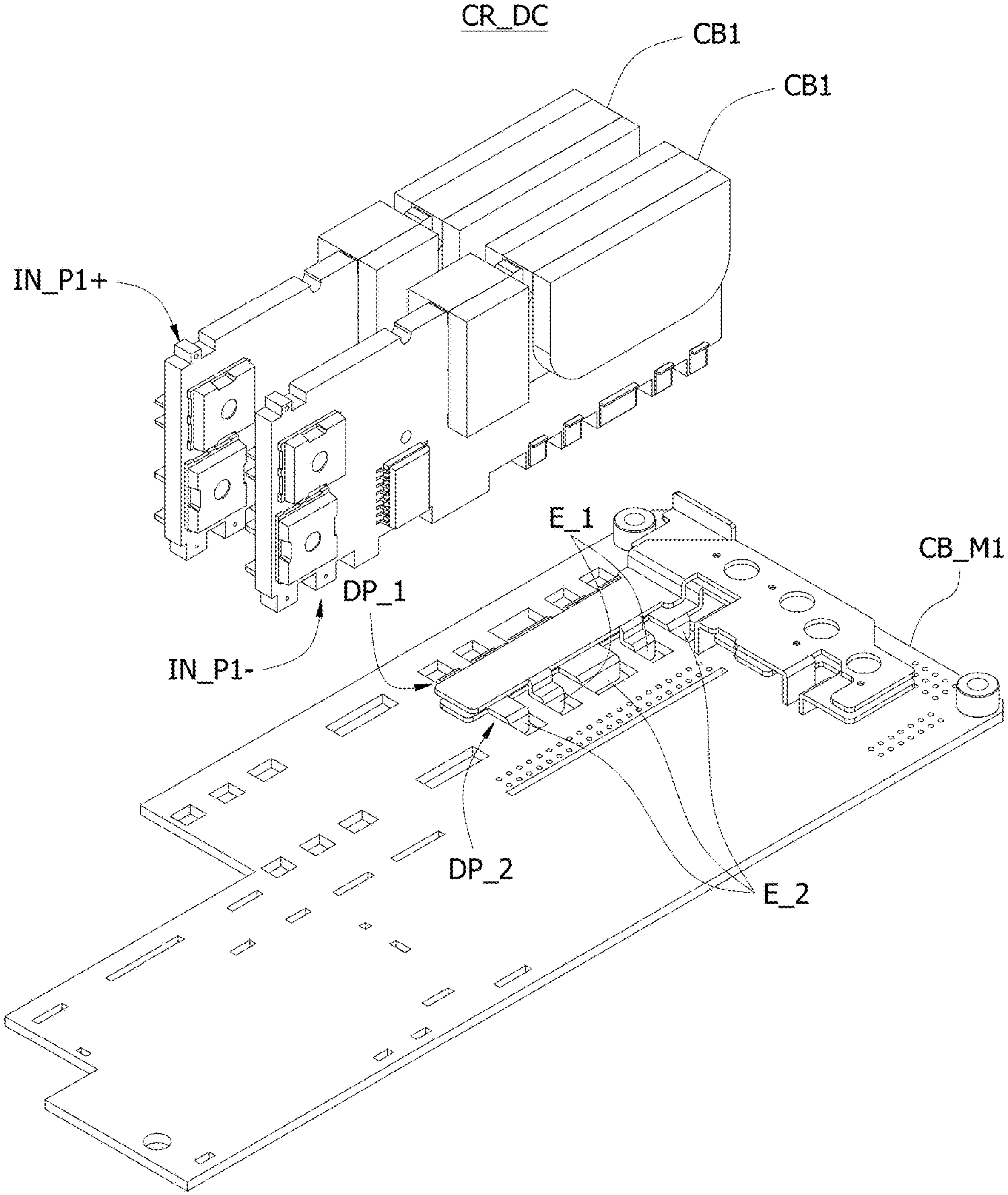
FIG. 13C is an exploded view of the three-dimensional circuit structure of the DC conversion module according to the second embodiment of the present disclosure.

Please refer to FIG. 13A, which shows a circuit diagram of the second embodiment of the DC conversion module of the present disclosure; please refer to FIG. 13B, which shows a three-dimensional circuit structure assembly diagram of the DC conversion module according to the second embodiment of the present disclosure; please refer to FIG. 13C, which shows an exploded view of the three-dimensional circuit structure of the DC conversion module according to the second embodiment of the present disclosure, and also refer to FIG. 3A to FIG. 12C. In FIG. 13A, the DC conversion module CR_DC includes two resonant converters 100, and the two resonant converters 100 are connected in series through the primary-side resonant tanks, and the secondary sides are connected in parallel to form the DC conversion module CR_DC. In FIG. 13B, the DC conversion module CR_DC includes a first main circuit board CB_M1 and two first circuit boards CB1. Specifically, the two first circuit boards CB1 are plugged into the first main circuit board CB_M1 to form a structure in which the resonant inductor Lr is connected in series with the first primary-side coil 22A, and the first secondary-side circuit 3A is connected in parallel. The DC conversion module CR_DC uses an interleaved operation through the first controller 4A to reduce the specifications and volume of the power components. In FIG. 13A, the DC conversion module CR_DC uses the primary-side series connection structure of two half-bridge resonant converters 100 (i.e., the first circuit board CB1) to achieve the full-bridge rectification, and uses the secondary-side parallel connection structure to achieve the secondary-side shunt effect. Moreover, by changing the traces on the first main circuit board CB_M1, multiple resonant converters 100 (i.e., the first circuit board CB1) can be used in different series and parallel connections according to actual needs, thereby achieving the convenience of power expansion and being applied to larger output power.

Specifically, in FIG. 13C, the first main circuit board CB_M1 is configured with a first plug port DP_1 and a second plug port DP_2. The two first circuit boards CB1 are respectively plugged into the first plug port DP_1 and the second plug port DP_2 to form the DC conversion module CR_DC (including two resonant converters 100). The circuit structure of the two first circuit boards CB1 is similar to FIG. 3B and FIG. 3C, and will not be described again here. The first power output terminals OUT_P1 of the two first circuit boards CB1 are respectively plugged into the first plug port DP_1 and the second plug port DP_2, and coupled to the output port OUT, and the first controller 4A is coupled to the first switch arm SA1_M so as to provide the first control signal Scl to control the power switches Q1,Q2 of the first switch bridge arm SA1_M. The first controller 4A may also be coupled to the rectification circuit 32 to control the rectification switches SR1,SR2, or may use other controllers to control the rectification switches SR1,SR2 to be controlled separately from the power switches Q1,Q2.

In particular, the two first circuit boards CB1 are coupled to each other by plugging into the first plug port DP_1 and the second plug port DP_2. The phase difference of the first control signal Scl provided by the first controller 4A of the two first circuit boards CB1 to the first switch bridge arm SA1_M is 180 degrees, so as to form an interleaved DC conversion module CR_DC. Therefore, by using two control signals with the phase difference of 180 degrees, the voltage and current resistance specifications of the power switches Q1,Q2 can be reduced, the size of the resonant inductor Lr and the output capacitor can significantly reduce the output/input current ripple. In particular, by the specific wires of the first main circuit board CB_M1, the inductor trace T1 and the first primary-side trace Tp1 of the half-bridge structure of the two first circuit boards CB1 can form a series structure, and he first secondary-side circuits 3A of the two first circuit boards CB1 can also form a parallel structure. Therefore, the DC conversion module CR_DC can provide greater output power to drive the load 300 with greater power consumption (compared to the single first circuit board CB1 in FIG. 3B and FIG. 3C).

Please refer to FIG. 3B, FIG. 3C, FIG. 13B, and FIG. 13C again, the first plug port DP_1 and the second plug port DP_2 respectively include a plurality of first terminals E_1 and a plurality of second terminals E_2, and the first terminals E_1 of each plug port DP_1 and DP_2 are coupled to each other, and the second terminals E_2 are also coupled to each other. The positive input terminals IN_P1+ of the two first circuit boards CB1 are coupled to each other by being plugged into the first terminals E_1 of the first plug port DP_1 and the second plug port DP_2, and the negative input terminals IN_P1− are coupled to each other by being plugged into the second terminals E_2 of the first plug port DP_1 and the second plug port DP_2. Therefore, a parallel structure of the first secondary-side circuits 3A of the two first circuit boards CB1 can be formed. Since the positive output terminals OUT_P1+ and the negative output terminals OUT_P1− are arranged in a staggered manner, the first terminals E_1 and the second terminals E_2 are also arranged in a staggered manner so as to reduce the AC loss and increase power.

On the other hand, the two first circuit boards CB1 respectively include a positive input terminal IN_P1+ and a negative input terminal IN_P1−, and the positive input terminal IN_P1+ is located above or below the first circuit board CB1, while the configuration position of the negative input terminal IN_P1− is opposite to that of the positive input terminal IN_P1+. For illustration, it is assumed that the positive input terminal IN_P1+ is located above the first circuit board CB1, and the negative input terminal IN_P1− is located below the first circuit board CB1. When the two first circuit boards CB1 are plugged into the first plug port DP_1 and the second plug port DP_2, the negative input terminal IN_P1− is also plugged into the first main circuit board CB_M1 to couple the negative terminal of the bus capacitor Cbus. The positive input terminals IN_P1+ of the two first circuit boards CB1 are coupled together through the first power copper bar and coupled to the positive terminal of the bus capacitor Cbus. Therefore, the vertical space of the power supply PSU can be effectively utilized to provide large power transmission, and the first power copper bar can be specially widened to carry large currents and increase heat dissipation efficiency.

For example, it is assumed that a single resonant converter 100 (i.e., a single first circuit board CB1) can reach more than 16,00 W, it means that two resonant converters 100 can provide a power output of more than 32,00 W. On the other hand, since the circuits of the two resonant converters 100 are the same, it is only necessary to design the circuit for a single first circuit board CB1. Therefore, it is not necessary to consider the mutual influence factors of multiple resonant converters 100 when they are configured together since all components are applied on the same board. Therefore, the circuit design is relatively simple, which can reduce the circuit development cycle and effectively increase efficiency and component utilization. In particular, the circuit structures and characteristics not illustrated in FIG. 13A to FIG. 13C are similar to those in FIG. 3A to FIG. 12C, and will not be described again here.

On the other hand, it can be noticed from FIG. 13A that a single first circuit board CB1 cannot form a complete resonant converter 100 (the resonant capacitor Cr is not coupled to the power switch Q2), however, the two circuit boards are plugged into the first main circuit board CB_M1 to form the structure of the two resonant converters 100. Therefore, the first circuit board CB1 and the first main circuit board CB_M1 of the present disclosure have various matching methods. Specifically, the first circuit board CB1 may be the complete resonant converter 100 as shown in FIG. 3A. Therefore, after the first main circuit board CB_M1 is plugged in, a structure in which both the primary sides and the secondary sides of the two resonant converters 100 connected in parallel is formed. Alternatively, the first circuit board CB1 may also be a resonant converter 100 with a partially missing circuit, and the partially missing circuit can be supplemented by plugging in the first main circuit board CB_M1. Therefore, the first main circuit board CB_M1 can have a variety of reserve circuits in response to different types of first circuit boards CB1, and can adjust the appropriate application type through, for example, but not limited to, flying wire, switch switching, jumper cap, etc.

Figure 14A:
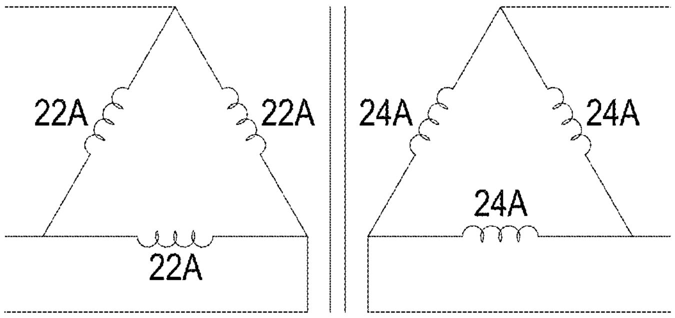
FIG. 14A is a magnetic component wiring diagram of the first embodiment of the present disclosure using three sets of resonant converters to form a DC conversion module.

Please refer to FIG. 14A, which shows a magnetic component wiring diagram of the first embodiment of the present disclosure using three sets of resonant converters to form a DC conversion module, and also refer to FIG. 3A to FIG. 13C. In FIG. 14A, the present disclosure can also expand the DC conversion module CR_DC to be implemented using three half-bridge/full-bridge resonant converters 100 to provide greater output power. Furthermore, the DC conversion module CR_DC includes a first main circuit board CB_M1 and three first circuit boards CB1. The three first circuit boards CB1 are connected to the first plug port DP_1, the second plug port DP_2, and the third plug port (not shown) of the first main circuit board CB_M1. Therefore, the first primary-side coils 22A of the three first circuit boards CB1 form a primary-side delta connection (A connection), and the first secondary-side coils 24A of the three first circuit boards CB1 also form a secondary-side delta connection (A connection), thereby forming a three-phase DC conversion module CR_DC composed of three resonant converters 100. In particular, the circuit structure of the three first circuit boards CB1 in FIG. 14A that are plugged into the first main circuit board CB_M1 is similar to that in FIG. 13B and FIG. 13C, and can be equivalently deduced, and will not be described again here.

Figure 14B:
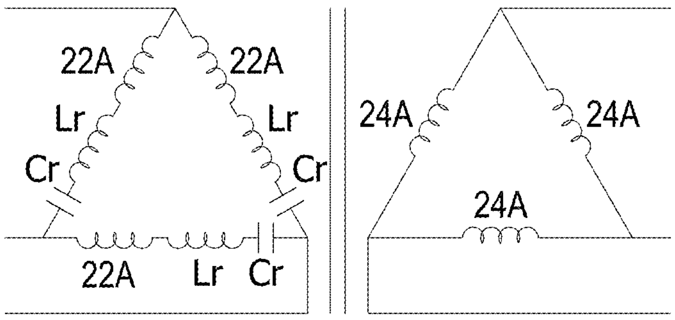
FIG. 14B is a magnetic component wiring diagram of the second embodiment of the present disclosure using three sets of resonant converters to form a DC conversion module.

Please refer to FIG. 14B, which shows a magnetic component wiring diagram of the second embodiment of the present disclosure using three sets of resonant converters to form a DC conversion module, and also refer to FIG. 3A to FIG. 14A. In FIG. 14B, since each of the primary sides of the three resonant converters 100 includes a resonant tank (i.e., the resonant inductor Lr and the resonant capacitor Cr) and the first primary-side coil 22A, and each of the secondary sides includes a first secondary-side coil 24A. Therefore, the present disclosure uses three primary-side resonant tanks of the resonant converter 100 and the first primary-side coil 22A to form a circuit structure in a delta connection (A connection), and each resonant tank and the first primary-side coil 22A are respectively coupled to the first secondary-side coil 24A through coupling. It is similar to FIG. 13A to FIG. 13C, three DC conversion modules CR_DC also use interleaved operation so that each phase is different in 120 degrees. That is, the phase difference of the first control signal Scl provided by the first controller 4A of the three first circuit boards CB1 to the first switch bridge arm SA1_M is 120 degrees so as to form an interleaved DC conversion module CR_DC. Therefore, the specifications and volume of the power components can also be reduced, and greater output power can be provided. In particular, the circuit structure of the three first circuit boards CB1 in FIG. 14B connected to the first main circuit board CB_M1 is also similar to FIG. 13B and FIG. 13C, and can be equivalently deduced, and will not be described again here. In addition, the resonant converter 100 of the present disclosure is also suitable for a full-bridge circuit structure. Compared with a half-bridge circuit structure, it can apply greater output power, has higher gain, and can extend the hold-up time during shutdown. In particular, the circuit structures and characteristics not illustrated in FIG. 14A and FIG. 14B are similar to those in FIG. 3A to FIG. 13C, and will not be described again here.

C. Output Structure of Power Supply

Figure 15A:
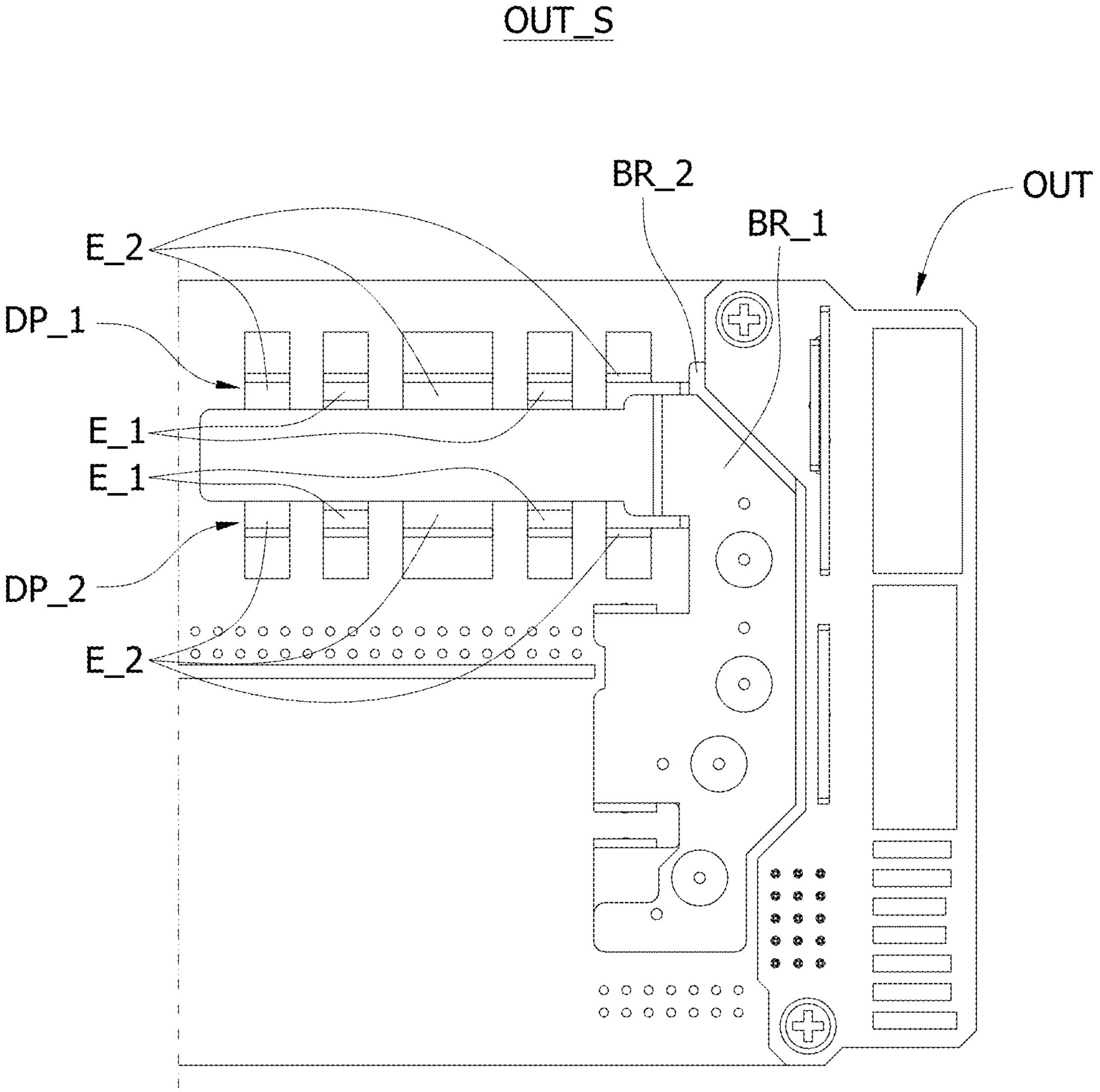
FIG. 15A is a structural top view of the output structure of the power supply of the present disclosure.

Please refer to FIG. 15A, which shows a structural top view of the output structure of the power supply of the present disclosure, and also refer to FIG. 3A to FIG. 14B. Since the DC conversion module CR_DC has a large current output, if the traces of the first main circuit board CB_M1 are simply used for output, the trace area/volume will be too small, which will easily cause the current to be too high and heat to accumulate at the output terminal of the first main circuit board CB_M1. On the other hand, if too large traces are configured on the first main circuit board CB_M1 to provide large current flow, the trace area/volume will be too large and will be squeezed into other circuit component configurations (such as, but not limited to, isolated converter CR_AUX, etc.). Therefore, the output structure OUTS of the present disclosure uses a copper bar to reduce DC losses, and by the staggered design of positive and negative poles, AC losses can be reduced and power can be increased.

Specifically, the output structure OUTS of the present disclosure includes a first copper bar BR_1, a second copper bar BR_2, and an output port OUT. The first copper bar BR_1 includes a plurality of first terminals E_1, and the first terminals E_1 are used to plug into the positive output terminal OUT_P1+ of the first circuit board CB1. The second copper bar BR_2 includes a plurality of second terminals E_2, and the second terminals E_2 are used for the negative output terminal OUT_P1− to be connected. Therefore, the output structure OUTS can adopt a three-dimensional design of stacking large-volume copper bars, which can use vertical space to increase space utilization and reduce DC losses. On the other hand, the first terminal E_1 and the second terminal E_2 may form the first plug port DP_1 (and/or the second plug port DP_2 and the third plug port (not shown)), and the first terminal E_1 and the second terminal E_2 are arranged in a staggered manner to reduce AC loss and increase power.

On the other hand, in the present disclosure, the races on the inner layer of the first main circuit board CB_M1 are also staggered. The reason is that the first main circuit board CB_M1 is mainly configured to provide a path for large power transmission (i.e., the positive terminal or negative terminal of DC input/output), and therefore by the staggered configuration of the traces on the inner layer of the first main circuit board CB_M1, the magnetic flux can also be offset, the AC loss can be reduced, and the power can be increased. In addition, since the copper bars used in the present disclosure (i.e., the first power copper bar, the first copper bar BR_1, the second copper bar BR_2, and other copper bars that will be mentioned later) can be designed to be widened separately to carry large current and increase heat dissipation efficiency.

Figure 15B:
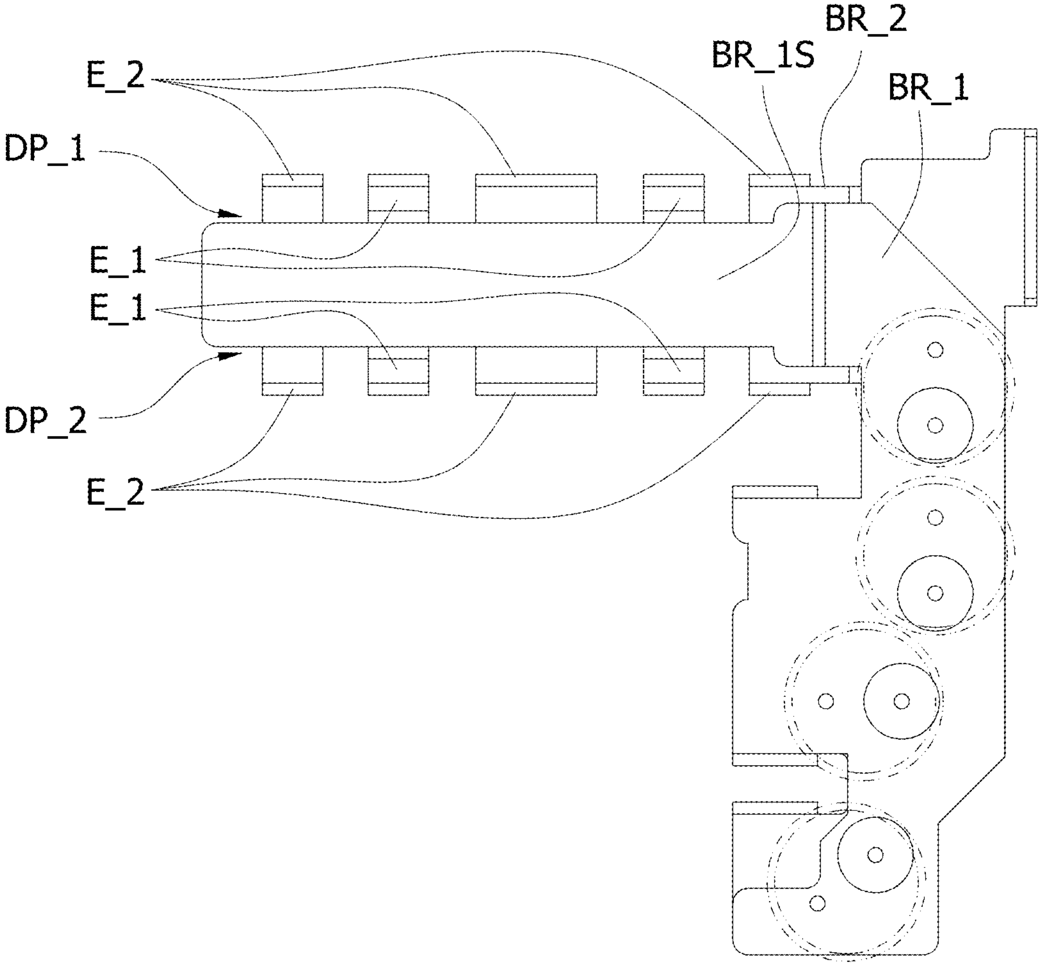
FIG. 15B is a top view of the copper bar structure of the output structure of the present disclosure.

Please refer to FIG. 15B, which shows a top view of the copper bar structure of the output structure of the present disclosure, and also refer to FIG. 3A to FIG. 15A. In FIG. 15B, the first copper bar BR_1 includes a first copper bar segment BR_1S, and the second copper bar BR_2 includes a second copper bar segment BR_2S. At least one side (two sides are shown here) of the first copper bar segment BR_1S includes a plurality of first extension segments, and the first extension segments respectively form the first terminals E_1. Similarly, the second extension segments of the second copper bar segment BR_2S respectively form the second terminals E_2. Recesses are respectively formed in the first terminals E_1 and the second terminals E_2, and the recesses of the first terminals E_1 and the second terminals E_2 are used to respectively accommodate the plug of the positive output terminals OUT_P1+ and the negative output terminals OUT_P1−. After plugging, the plugged structure can be made more stable through methods such as but not limited to tin filling.

On the other hand, most circuit boards (such as the first main circuit board CB_M1, the first circuit board CB1, etc.) have a planar structure, the recesses on the same side of the first copper bar segment BR_1S and the second copper bar segment BR_2S are arranged in a line to facilitate the plug of the first circuit board CB1 with a plate-like structure. However, if the first circuit board CB1 is not in a plate-like structure, the arrangement of the recessed portions is not limited to this, and the main requirement is that the arrangement of the recessed portions corresponds to the shape of the first circuit board CB1.

Figure 15C:
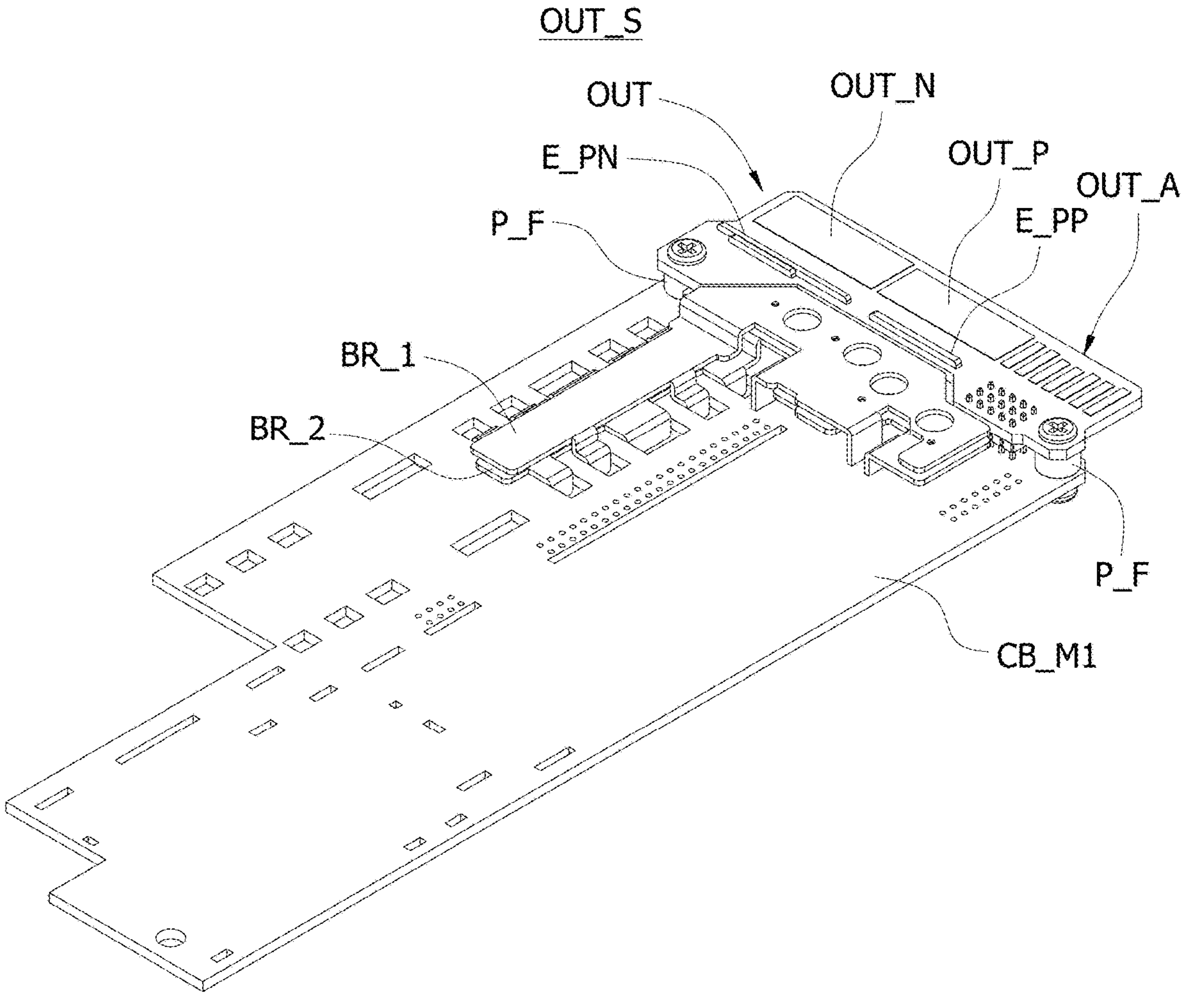
FIG. 15C is a three-dimensional assembled view of the output structure of the present disclosure.
Figure 15D:
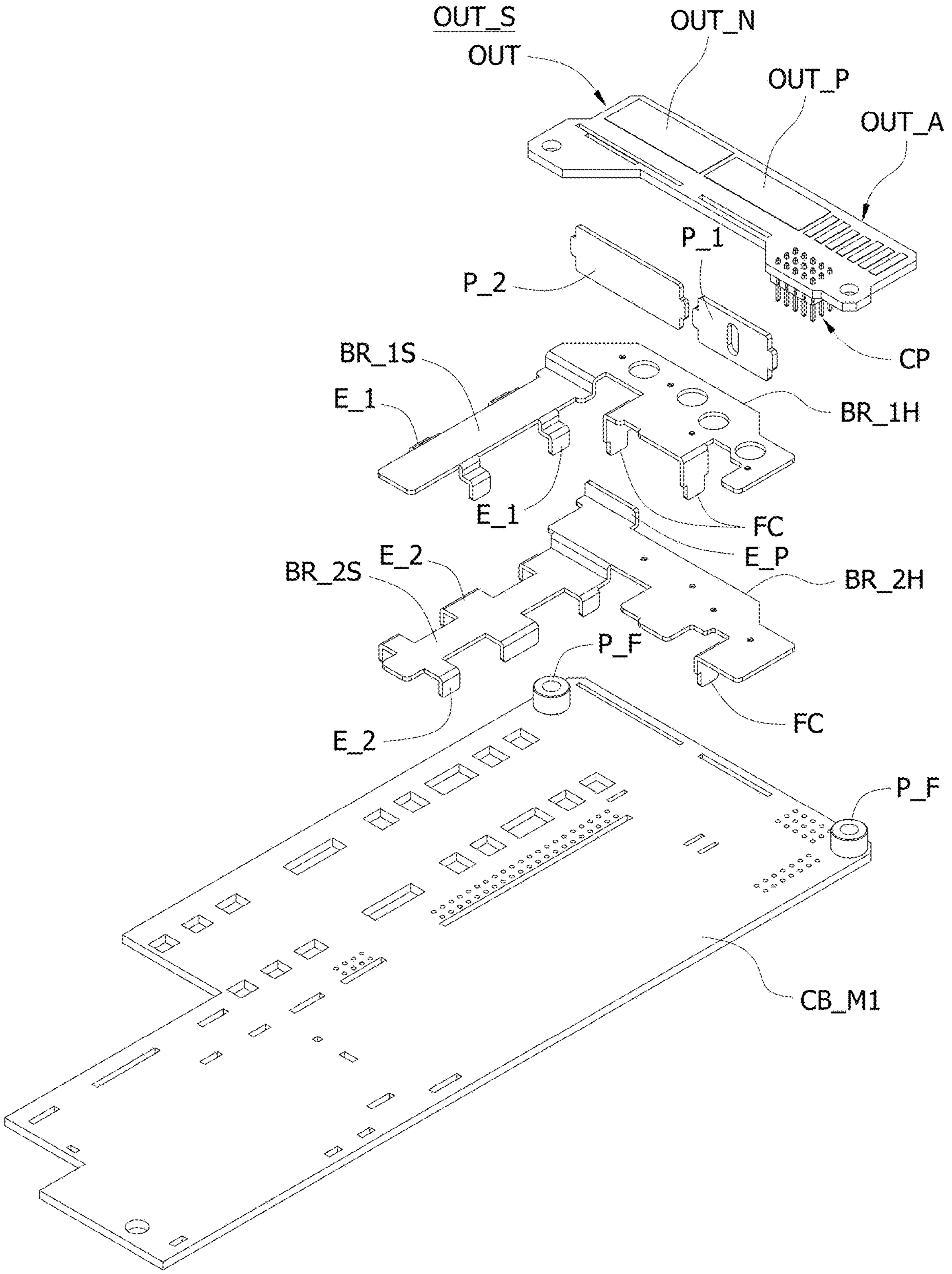
FIG. 15D is a three-dimensional exploded view of the output structure of the present disclosure.

Please refer to FIG. 15C, which shows a three-dimensional assembled view of the output structure of the present disclosure; please refer to FIG. 15D, which shows a three-dimensional exploded view of the output structure of the present disclosure, and also refer to FIG. 3A to FIG. 15B. It can be seen from the circuit structures of FIG. 15C and FIG. 15D that the first copper bar BR_1 and the second copper bar BR_2 are stacked in a specific stacked structure. That is, the stacked structure is sequentially the first main circuit board CB_M1, one of the first copper bar BR_1 and the second copper bar BR_2 (here represented by the second copper bar BR_2, and referred to as the lower copper bar), the other of the first copper bar BR_1 and the second copper bar BR_2 (herein represented by the first copper bar BR_1, and referred to as the upper copper bar). Since the upper copper bar and the lower copper bar carry positive and negative voltages respectively, and the current directions of the two are opposite, the magnetic fluxes generated by the two can be cancelled. Therefore, the principle of positive and negative overlapping magnetic field cancellation of positive and negative voltages can be used to reduce AC losses and increase efficiency. In FIG. 15C and FIG. 15D, the first main circuit board CB_M1 includes a fixing portion P_F, and the fixing portion P_F is used to fix the output port OUT to form a raised structure of the output port OUT.

Preferably, in order to increase the magnetic field cancellation effect, the shapes of the first copper bar segment BR_1S and the second copper bar segment BR_2S are the same (see FIG. 15B and FIG. 15C). Also, one of the first copper bar segment BR_1S and the second copper bar segment BR_2S is stacked on top of the other, so that the two overlap, which is a better implementation. On the other hand, in order to meet the application of high-end systems, the output port OUT of the present disclosure uses the first copper bar BR_1 and the second copper bar BR_2 combined with the golden finger structure of the output port OUT, so as to enable the high-current path to not rely solely on the thin copper foil (trace) of the motherboard. Therefore, a thick copper bar can be directly connected to the gold finger to reduce contact loss and increase efficiency.

Please refer to FIG. 15C and FIG. 15D again, the golden finger structure includes a positive connection terminal OUT_P and a negative connection terminal OUT_N. The first copper bar BR_1 further includes a first high segment BR_1H, and the platform of the first high segment BR_1H is configured to be farther away from the first main circuit board CB_M1 than the first copper bar segment BR_1S. The second copper bar BR_2 further includes a second high segment BR_2H, and the platform of the second high segment BR_2H is configured to be farther away from the first main circuit board CB_M1 than the second copper bar segment BR_2S. Preferably, the first high section BR_1H and the second high section BR_2H are integrally formed with the first copper bar segment BR_1S and the second copper bar segment BR_2S respectively, but this is not a limitation. The first high section BR_1H and the second high section BR_2H can be respectively coupled to the first main circuit board CB_M1 through at least one copper frame FC to enhance the structural strength of the output structure OUTS, and optionally also provide power transmission requirements.

Please refer to FIG. 15C and FIG. 15D again, the first high segment BR_1H of the first copper bar BR_1 is coupled to the first main circuit board CB_M1 through the copper frame FC and the first terminal E_1, and then is plugged into the first main circuit board CB_M1 and a positive plug terminal E_PP of the output port OUT through a first plug part P_1 to couple the positive connection terminal OUT_P. The second high segment BR_2H of the second copper bar BR_2 is plugged into a negative plug terminal E_PN of the output port OUT through a plug terminal E_P and a second plug part P_2 to couple the negative connection terminal OUT_N. The output port OUT can be placed higher than the platform of the first high segment BR_1H or the platform of the second high segment BR_2H, and one terminal of the first high segment BR_1H adjacent to the output port OUT is complementary to the output port OUT. Therefore, the raised output port OUT can be firmly fixed by a fixing part P_F, and the position limiting function is implemented by the first plug part P_1, the second plug part P_2, the first high segment BR_1H, and the second high segment BR_2H to enhance the structural strength of the output port OUT so as to prevent the external force from causing the output port OUT to become concave when the output port OUT is connected to the load 300. In particular, in addition to providing the position limiting function of the output port OUT, the first plug part P_1 and the second plug part P_2 also provide the conductive function (used to flow large current) as mentioned above, and the plug terminal E_P and the second high segment BR_2H can preferably be integrally formed, but are not limited to this.

In FIG. 15D, the auxiliary terminal OUT_A is configured on one side segment of the golden finger structure, and the positive connection terminal OUT_P and the negative connection terminal OUT_N are respectively configured on the middle segment and the other side segment of the golden finger structure. The auxiliary terminal OUT_A is plugged into the first main circuit board CB_M1 through a connection pin CP, so that the auxiliary terminal OUT_A receives the signal or the auxiliary power V_AUX provided by the first main circuit board CB_M1.

D. Isolated CONVERSION MODULE

The isolated converter CR_AUX of the present disclosure is mainly composed of the circuit structure of a flyback converter, and also includes a planar transformer integrated on the circuit board. Therefore, by the modular design of the planar transformer integrated control circuit, the isolated converter CR_AUX can greatly eliminate the component configuration space required by traditional transformers, thereby greatly increasing the power density of the auxiliary power module. In addition, due to the planar design of the transformer, the power switches in the isolated converter CR_AUX can use third-generation semiconductor components such as wide bandgap (WBG) as the main power switch, and are used for switching operations at frequencies above 300 KHz, for example but not limited to. On the other hand, the isolated converter CR_AUX forms an isolated conversion module CR_M by integrating a DC bus module CR_BUS formed by the bus capacitor Cbus, so as to configure the larger bus capacitor Cbus adjacent to the smaller isolated converter CR_AUX to save circuit volume and increase power density.

Figure 16:
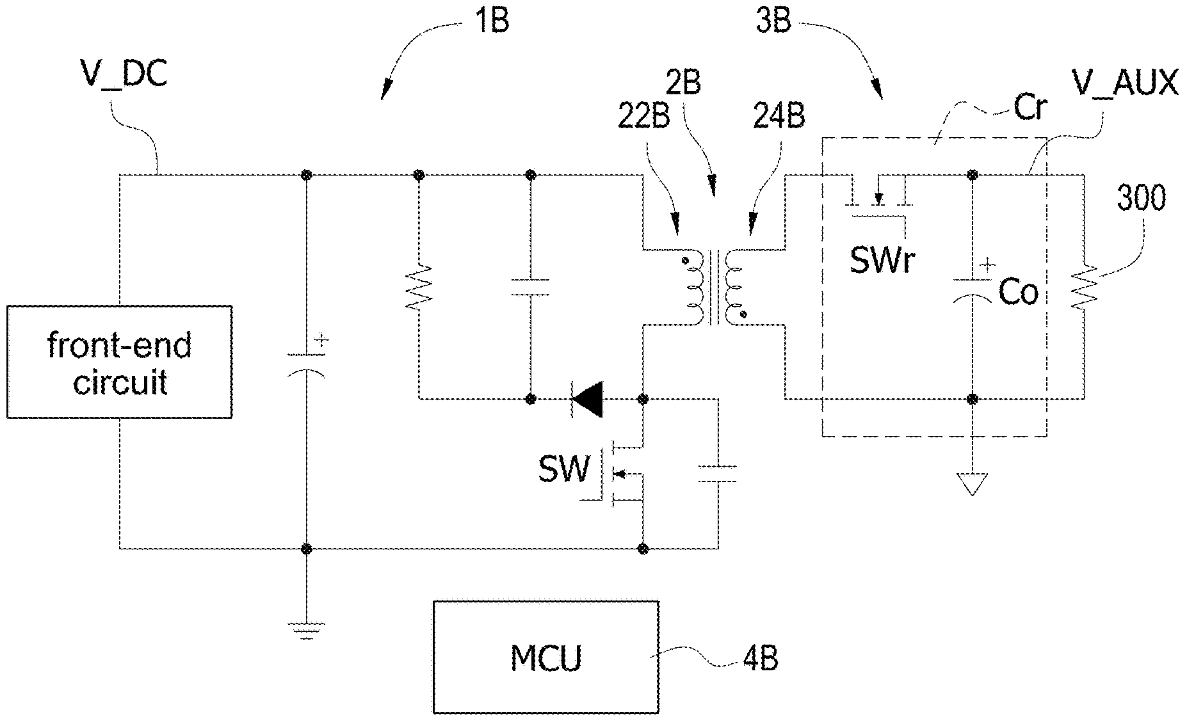
FIG. 16 is a circuit block diagram of the isolated converter of the present disclosure.

Please refer to FIG. 16, which shows a circuit block diagram of the isolated converter of the present disclosure, and also refer to FIG. 1 and FIG. 2. The isolated converter CR_AUX may be coupled to the front-end circuit (that is, coupled to the power factor corrector PFC through the bus capacitor Cbus) and the load 300. The isolated converter CR_AUX includes a second primary-side circuit 1B, a transformer 2B, a second secondary-side circuit 3B, and a second controller 4B, and the transformer 2B includes a primary-side coil 22B and a secondary-side coil 24B. In one embodiment, for example, but not limited to, the isolated converter CR_AUX may be composed of the flyback converter shown in FIG. 16. Therefore, any conversion circuit with a transformer 2B to isolate the primary side and the secondary side should be included in the scope of this embodiment.

The second primary-side circuit 1B includes the switch SW, and the second secondary-side circuit 3B includes the secondary rectification circuit Cr. The secondary rectifier circuit Cr includes a rectification switch SWr and an output capacitor Co, and the rectification switch SWr may be optionally replaced with a passive diode. In general, the second controller 4B controls the switch SW and the secondary-side rectification circuit Cr to store and release energy in the transformer 2B, so as to convert the DC power source V_DC received by the isolated converter CR_AUX through the stored/released energy of the transformer 2B into the auxiliary power source V_AUX. The primary-side coil 22B and the secondary-side coil 24B of the transformer 2B can form a planar transformer to facilitate placement on a circuit board, and this will be further explained later and will not be described in detail here. In one embodiment, the circuit structure of the second primary-side circuit 1B and the second secondary-side circuit 3B is only a schematic example. Any second primary-side circuit 1B and the second secondary-side circuit 3B that can form a structure of the isolated converter CR_AUX are all should be included in the scope of this embodiment.

Figure 17A:
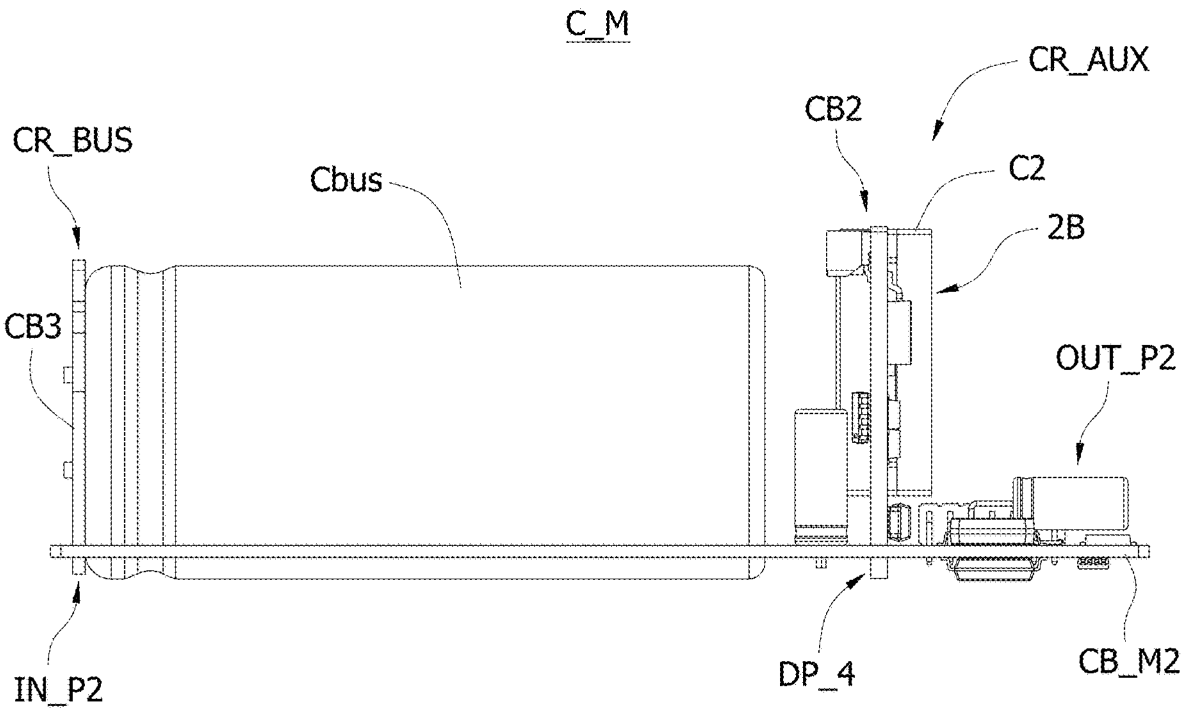
FIG. 17A is a plan side view of the isolated conversion module of the present disclosure.
Figure 17B:
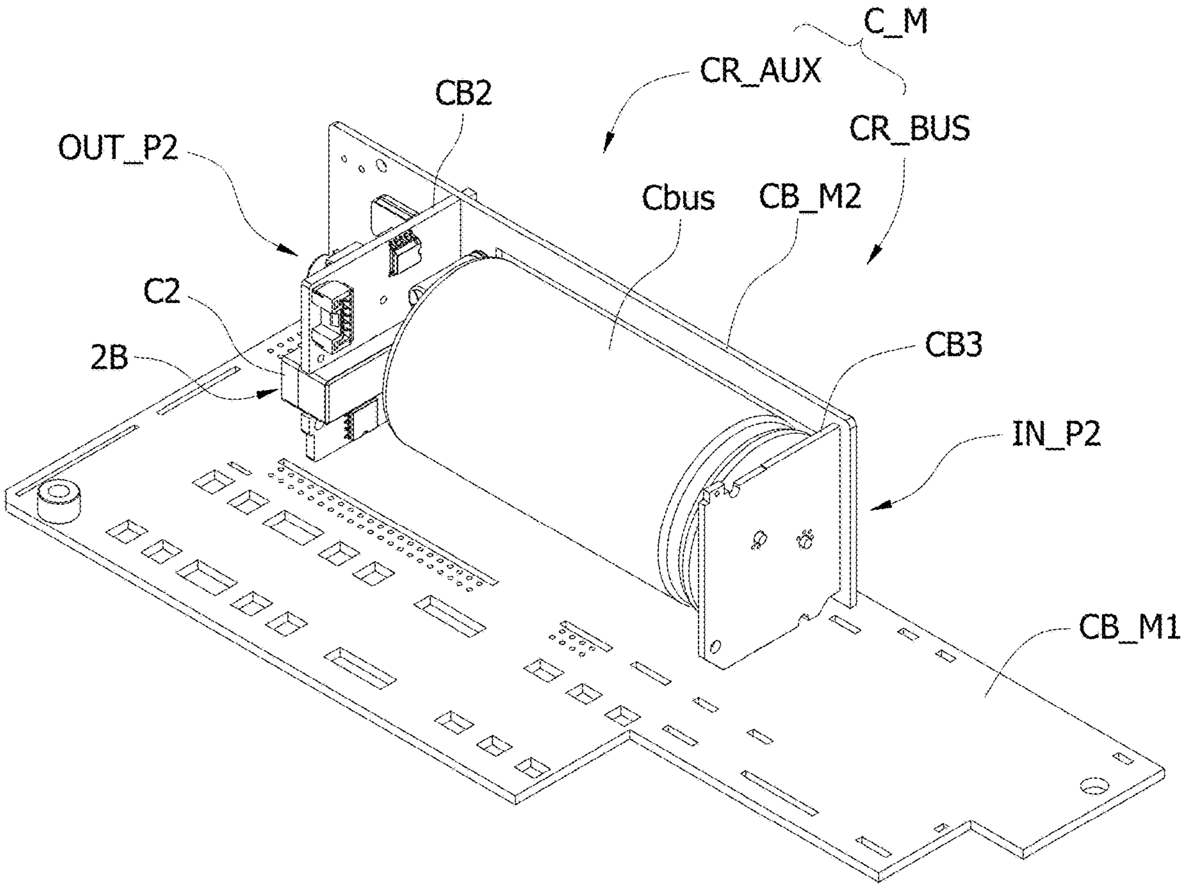
FIG. 17B is a three-dimensional assembly diagram of the isolated conversion module of the present disclosure.
Figure 17C:
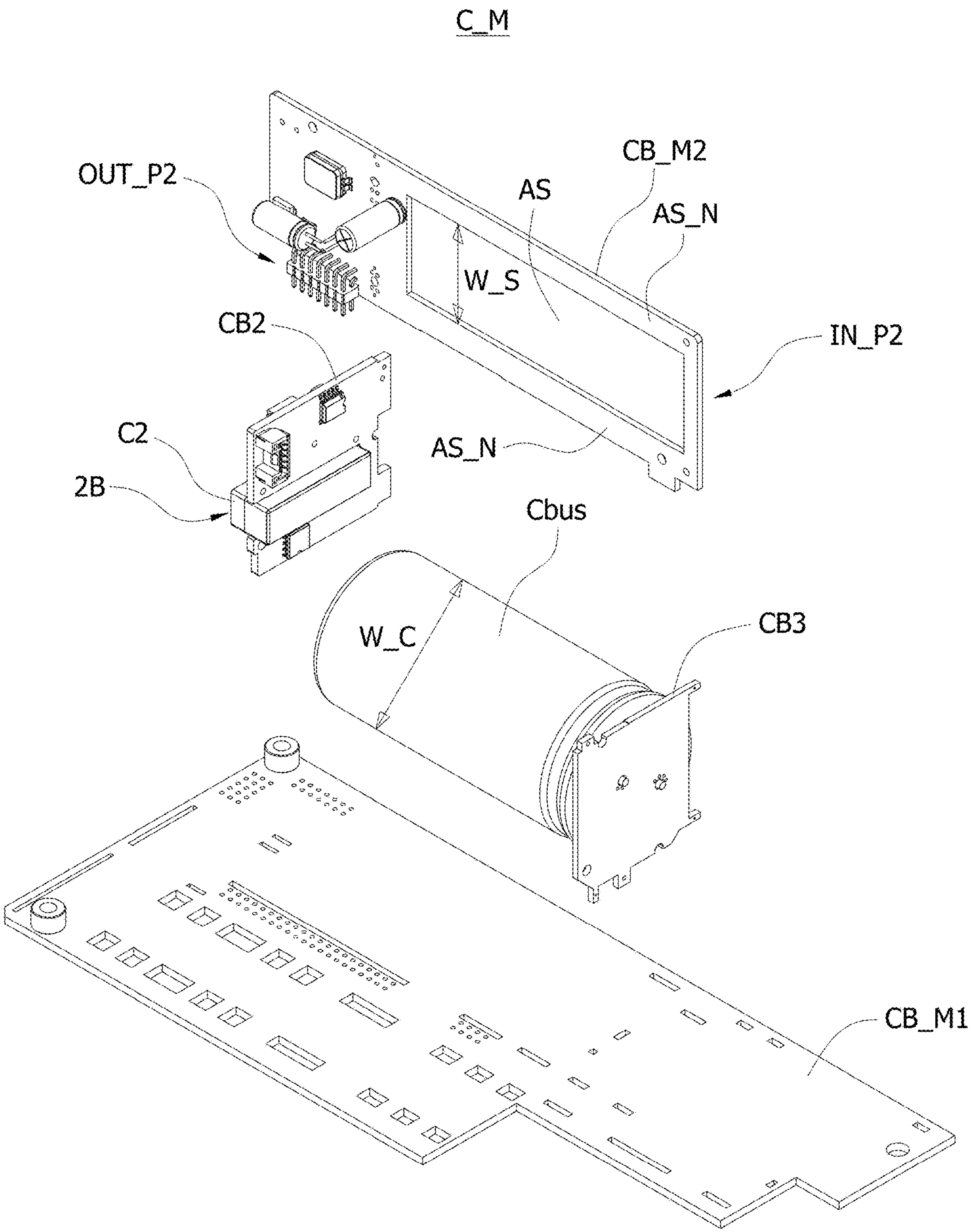
FIG. 17C is a three-dimensional exploded view of the isolated conversion module disclosed in this disclosure.

Please refer to FIG. 17A, which shows a plan side view of the isolated conversion module of the present disclosure; please refer to FIG. 17B, which shows a three-dimensional assembly diagram of the isolated conversion module of the present disclosure; please refer to FIG. 17C, which shows a three-dimensional exploded view of the isolated conversion module disclosed in this disclosure, and also refer to FIG. 16. In FIG. 17A and FIG. 17B, the isolated conversion module CR_M includes an isolated converter CR_AUX and a DC bus module CR_BUS. The isolated converter CR_AUX includes a second main circuit board CB_M2 and a second circuit board CB2, and the second circuit board CB2 includes a second transformer 2B. The DC bus module CR_BUS includes a third circuit board CB3 and a bus capacitor Cbus, and the DC bus module CR_BUS is plugged into the second main circuit board CB_M2 to form the isolated conversion module CR_M. The second main circuit board CB_M2 includes a fourth plug port DP_4, a second power input terminal IN_P2, and a second power output terminal OUT_P2, and the second circuit board CB2 is plugged into the fourth plug port DP_4.

The second primary-side coil 22B and the second secondary-side coil 24B of the second transformer 2B are formed on the second circuit board CB2, and a second iron core C2 is sleeved on the second primary-side coil 22B and the second secondary-side coil 24B of the second circuit board CB2 to form the second transformer 2B. The third circuit board CB3 is plugged into the second power input terminal IN_P2, and the bus capacitor Cbus is plugged into the third circuit board CB3, so that the bus capacitor Cbus and the second main circuit board CB_M2 are arranged horizontally. Therefore, the bus capacitor Cbus can be coupled to the second power input terminal IN_P2 through the third circuit board CB3. As shown in FIG. 17B and FIG. 17C, by plugging the second main circuit board CB_M2 into the first main circuit board CB_M1, the bus capacitor Cbus can be configured horizontally in the power supply PSU, thereby significantly increasing the power density of the power supply PSU and reducing the occupied volume of the power supply PSU.

On the other hand, the second power output terminal OUT_P2 of the second main circuit board CB_M2 is coupled to the output port OUT of the golden finger structure by being plugged into the first main circuit board CB_M1. The specific coupling manner is that the second power output terminal OUT_P2 is coupled to the connection pin CP of the output port OUT by being plugged into the first main circuit board CB_M1, so that the auxiliary terminal OUT_A of the output port OUT is coupled to the second power output terminal OUT_P2 through the connection pin CP. Therefore, the isolated converter CR_AUX can provide the auxiliary power V_AUX to the first main circuit board CB_M1, and can also transmit/receive signals through the first main circuit board CB_M1. In addition, the second main circuit board CB_M2 further includes a square hollow area AS. The square hollow area AS is used to engage the bus capacitor Cbus, and the isolated converter CR_AUX is coupled to the bus capacitor Cbus through traces of the non-hollow area ASN on the side of the square hollow area AS. Preferably, the width W S of the square hollow area AS may be smaller than the diameter W_C of the bus capacitor Cbus, so that the bus capacitor Cbus can be fixed in the square hollow area AS to avoid the bus capacitor Cbus from being easily displaced or even loosened due to the shaking of the power supply PSU.

Therefore, the isolated converter CR_AUX integrates the modular design of the control circuit through the second transformer 2B to increase power density. In addition, The DC bus module CR_BUS is mainly composed of the third circuit board CB3 and the bus capacitor Cbus to replace the adverse effects caused by flying wires (jumpers), and allows the bus capacitor Cbus to be configured horizontally, thereby effectively utilizing vertical space. The second circuit board CB2 (including the second transformer 2B) and the DC bus module CR_BUS are jointly plugged into the second main circuit board CB_M2, and the square hollow area AS on the second main circuit board CB_M2 is used to accommodate the bus capacitor Cbus, so as to limit and fix the bus capacitor Cbus and provide the effect of supporting the bus capacitor Cbus.

Figure 18A:
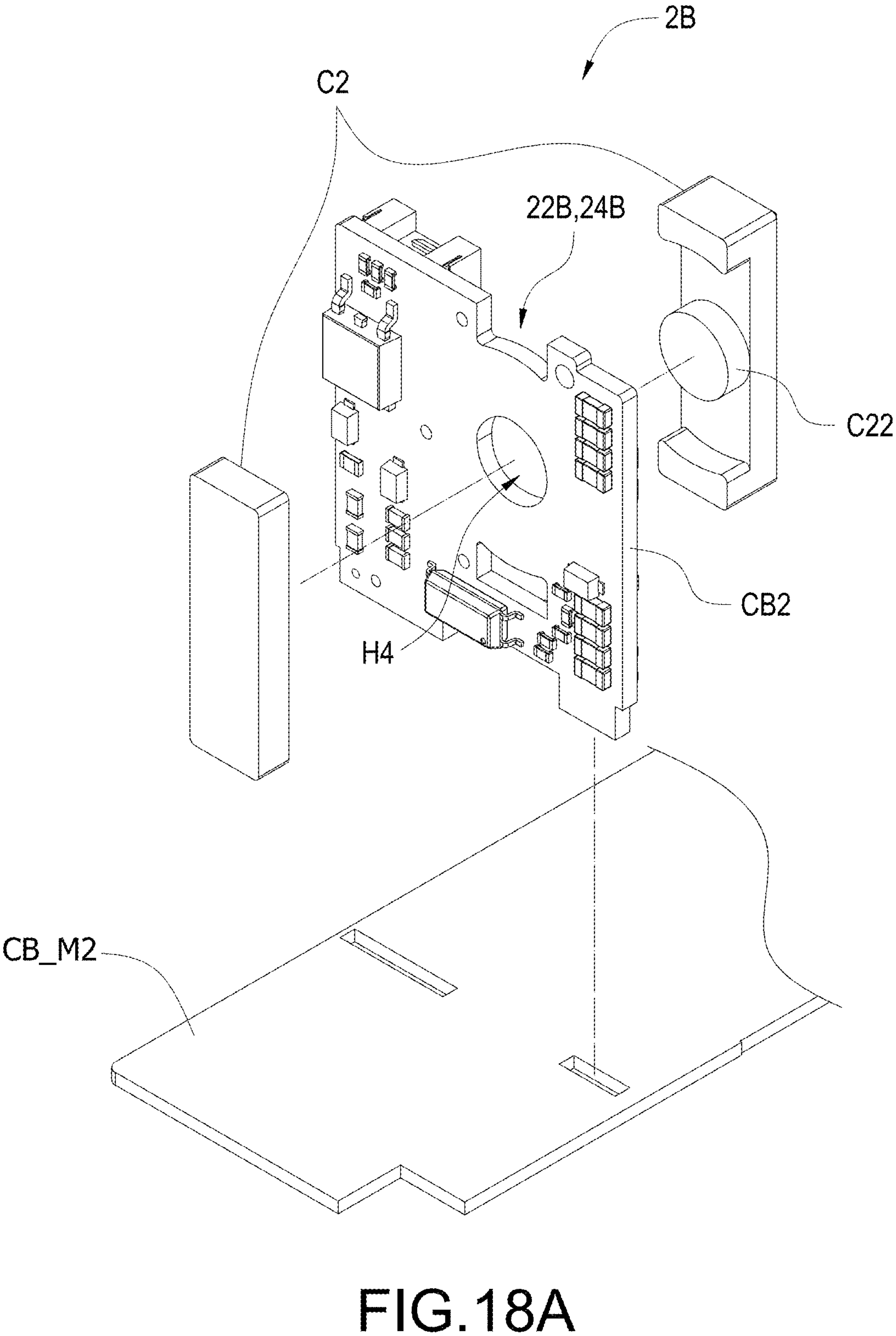
FIG. 18A is an exploded view of the three-dimensional circuit structure of the second circuit board of the present disclosure.
Figure 18B:
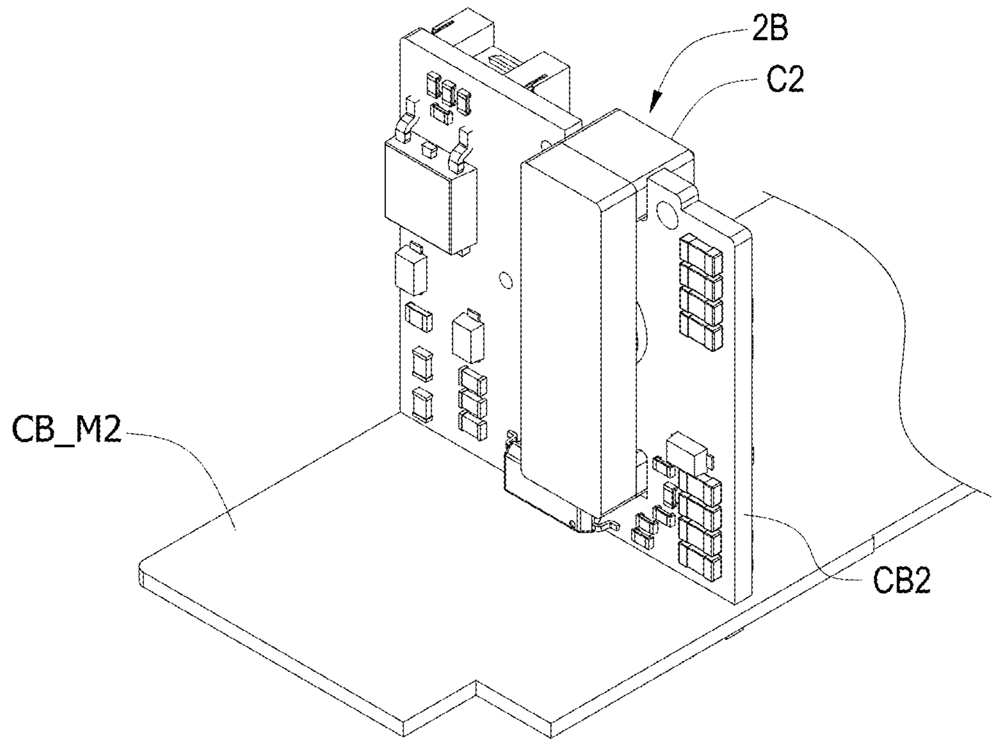
FIG. 18B is a three-dimensional circuit structure assembly diagram of the second circuit board of the present disclosure.

Please refer to FIG. 18A, which shows an exploded view of the three-dimensional circuit structure of the second circuit board of the present disclosure; please refer to FIG. 18B, which shows a three-dimensional circuit structure assembly diagram of the second circuit board of the present disclosure, and also refer to FIG. 16 to FIG. 17C. The second transformer 2B is configured on the second circuit board CB2, and the second primary-side circuit 1B, the second secondary-side circuit 3B, and the second controller 4B may be configured on the second main circuit board CB_M2 or the second circuit board CB2. Both the second primary-side coil 22B and the second secondary-side coil 24B of the second transformer 2B have a planar trace structure, and formed on the second circuit board CB2, so that the second iron core C2 is directly placed on the second primary-side coil 22B and the second secondary-side coil 24B of the second circuit board CB2 to form the second transformer 2B. In particular, the second iron core C2 includes a third core pillar C22, and the third core pillar C22 is directly sleeved on the second circuit board CB2 through the second iron core C2 and penetrates through a fourth through hole H4 of the second circuit board CB2. Since the second transformer 2B does not have a traditional winding frame for winding coils, and all traces are formed on the circuit board CB2, the transformer 2B has a planar structure and forms a planar transformer. Since the planar transformer is relatively flat, the height of the second circuit board CB2 is small. Therefore, the second circuit board CB2 can be plugged into the second main circuit board CB_M2 by plugging to form the circuit structure of FIG. 16, so as to save the use space of the second main circuit board CB_M2, but it does not exclude the possibility that the second circuit board CB2 may be formed or configured in one of the blocks of the second main circuit board CB_M2.

Therefore, the isolated converter CR_AUX mainly forms the second primary-side coil 22B and the second secondary-side coil 24B of the second transformer 2B on the second circuit board CB2, so that the planar transformer can be planarized to significantly increase the space utilization of the isolated converter CR_AUX to achieve high power density requirements. In addition, the isolated converter CR_AUX also has a small size due to the use of a planar transformer, which can significantly increase the operating frequency of the isolated converter CR_AUX. Therefore, the rectification switch SWr of the switch SW and the secondary rectification circuit Cr can use third-generation semiconductor components such as wide bandgap (WBG) as the main power switch, so that the isolated converter CR_AUX has the advantages of higher efficiency, significantly reduced power switch size, lighter weight and increased heat dissipation performance.

Figure 19A:
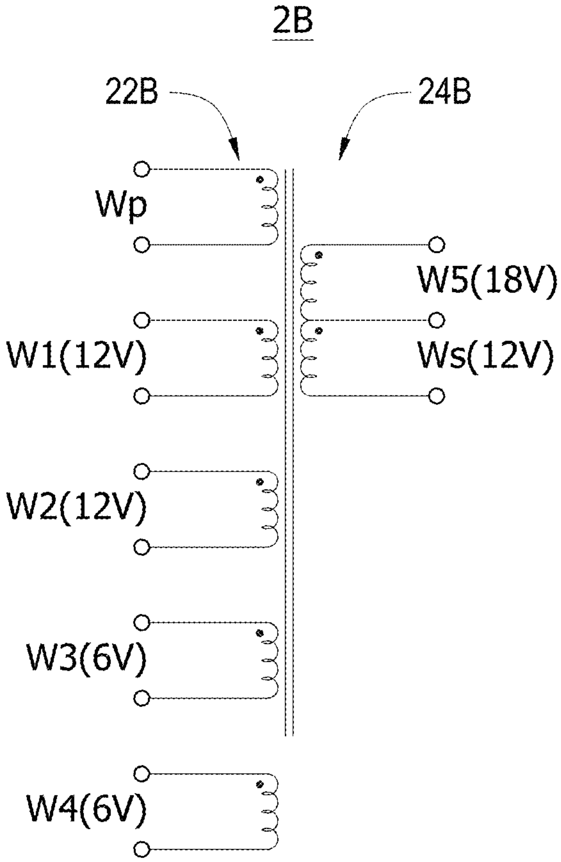
FIG. 19A is a circuit diagram of the second transformer coil of the present disclosure.
Figure 19B:
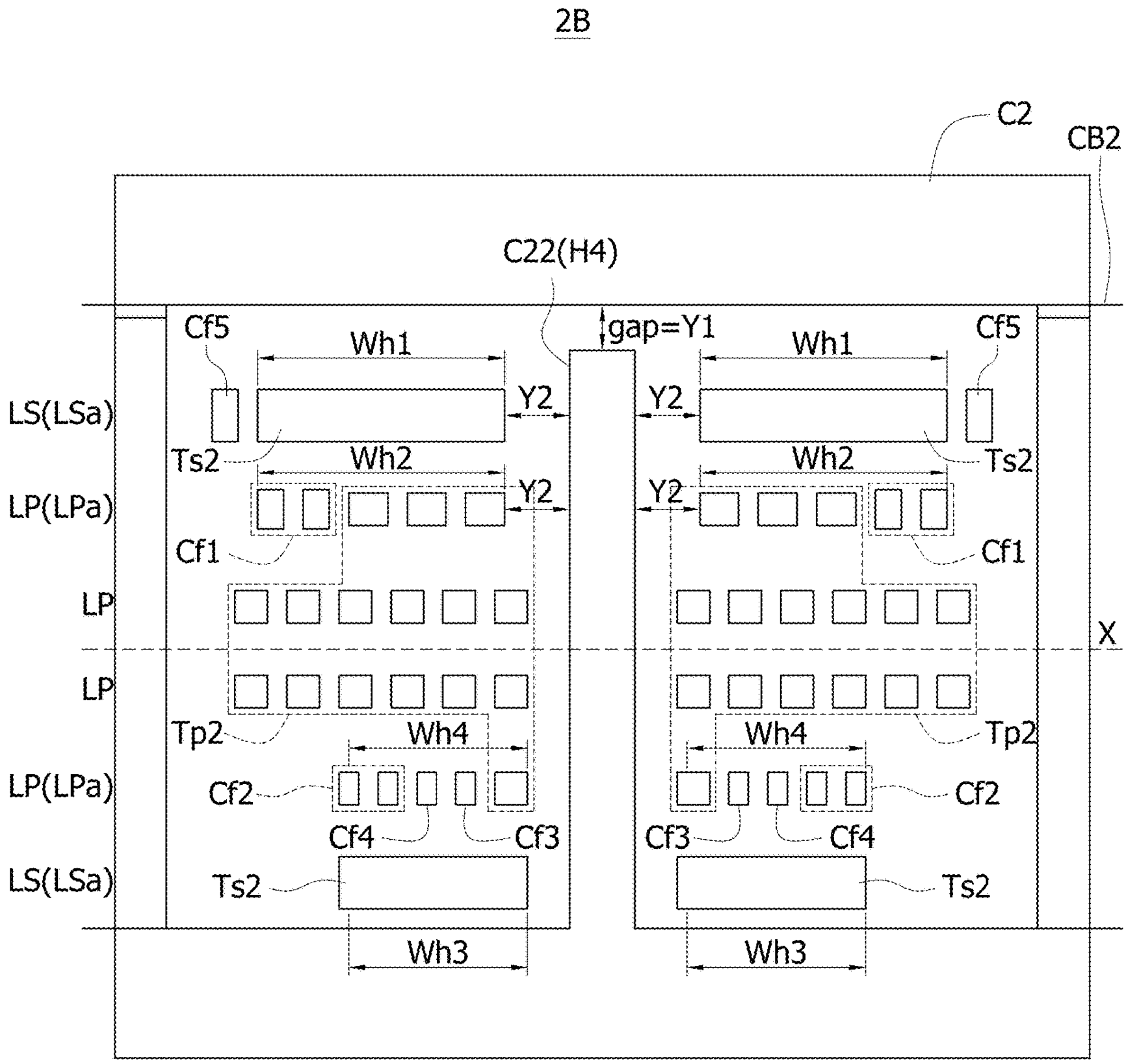
FIG. 19B is a schematic diagram of the wiring configuration of the second transformer of the present disclosure.

Please refer to FIG. 19A, which shows a circuit diagram of the second transformer coil of the present disclosure; please refer to FIG. 19B, which shows a schematic diagram of the wiring configuration of the second transformer of the present disclosure, and also refer to FIG. 16 to FIG. 18B. In FIG. 19A, the second transformer 2B includes a primary side and a secondary side. The primary side includes a second primary-side coil 22B and the secondary side includes a second secondary-side coil 24B. The second transformer 2B may also optionally include auxiliary coils W1,W2,W3,W4,W5, and the auxiliary coil W5 may form a center-tapped coil structure with the secondary-side coil 24B. In particular, the auxiliary coils W1,W2,W3,W4,W5 may couple the energy provided by the primary-side coil 22B through coupling manner, and the voltage acquired by coupling can be adjusted by adjusting the number of turns thereof. Furthermore, the auxiliary coils W1,W2,W3,W4, W5 may be used for detection of the auxiliary power source of supplying power to the load 300 according to different output voltage requirements. In one embodiment, the number of auxiliary coils W1,W2,W3,W4,W5 and their structural characteristics (independent or center-tapped, etc.) are only schematic examples and are not limited to FIG. 19A.

FIG. 19B shows a schematic cross-sectional view of the second circuit board CB2 to focus on the main features of the present disclosure, only the block of the second transformer 2B is shown in the cross-sectional position. In FIG. 19B, the second circuit board CB2 is a multi-layer board (a 6-layer board is used as an example here, but is not limited to this). The second circuit board CB2 includes a plurality of primary-side layers LP and a plurality of secondary-side layers LS, and the two sides away from the center line X are the top layer and the bottom layer of the circuit board CB2 respectively. A plurality of second primary-side traces Tp2 are respectively formed on the primary-side layer LP of the second circuit board CB2, and each primary-side layer LP includes at least one second primary-side trace Tp2 that surrounds several turns (as shown in FIG. 19B with four primary-side layers LP, but not limited to this). The second primary-side traces Tp2 may be connected in series through the interconnection of each primary-side layer LP (for example, using via holes, not shown) to serve as the second primary-side coil 22B coupled to the second primary-side circuit 1B.

A plurality of second secondary-side traces Ts2 are respectively formed on the secondary-side layer LS of the second circuit board CB2, and each layer of the secondary-side layer LS includes at least one second secondary-side trace Ts2 that surrounds several turns (as shown in FIG. 19B with two secondary-side layers Ls, but not limited to this). The second secondary-side traces Ts2 may be connected in series through the interconnection of each secondary-side layer LS (for example, using via holes, not shown) to serve as the second second-side coil 24B coupled to the second primary-side circuit 3B. In one embodiment, the material of the traces formed by each layer board may be copper foil, but it does not exclude the use of other metal foils that are easy to conduct electricity (such as but not limited to gold, silver, etc.) The second iron core C2 surrounds the second circuit board CB2, and the second iron core C2 includes a third core pillar C22. The third core pillar C22 penetrates the fourth through hole H4 of the second circuit board CB2, so that the second primary-side trace Tp2 and the second secondary-side trace Ts2 surround the fourth through hole H4. After the second iron core C2 is sleeved on the second primary-side trace Tp2 and the second secondary-side trace Ts2, a closed magnetic circuit can be formed to form the second transformer 2B. Furthermore, as shown in FIG. 19B, the second transformer 2B is formed as follows: the second primary-side trace Tp2 is close to the center of the circuit board (i.e., the center line X), and the second secondary-side trace Ts2 is away from the center relative to the second primary-side trace Tp2 to form a sandwich trace.

That is, the second primary-side trace Tp2 is formed at a relatively central position in the second circuit board CB2, and the second secondary-side trace Ts2 is formed at a position close to the top or bottom layer of the second circuit board CB2, so that the leakage inductance of the second transformer 2B can be reduced and the efficiency of the isolated converter CR_AUX can be increased. In particular, The trace design of the second transformer 2B is not limited to sandwich trace. Specifically, if the sandwich trace design is not adopted (for example, but not limited to, the primary-side layer LP is configured close to the top layer, and the secondary-side layer LS is configured close to the bottom layer), the coupling capacitance between the primary-side layer LP and the secondary-side layer LS can be reduced, thereby reducing noise during operation of the second transformer 2B.

On the other hand, the secondary-side layer LS and the primary-side layer LP respectively include a secondary-side adjacent layer LSa and a primary-side adjacent layer LA adjacent to each other. A plurality of auxiliary traces Cf1, Cf2,Cf3,Cf4 are respectively formed on the primary-side adjacent layer LA of the second circuit board CB2, and the primary-side adjacent layer LA may include at least one auxiliary trace Cf1,Cf2,Cf3,Cf4. The auxiliary traces Cf1, Cf2,Cf3,Cf4 can be configured in the single-layer primary-side adjacent layer LA to form the auxiliary coils W1,W2, W3,W4, and may also be connected through each primary-side adjacent layer LA (for example, using via holes (not shown), so that the auxiliary wirings Cf1,Cf2,Cf3,Cf4 of the same path are connected in series to serve as the auxiliary coils W1,W2,W3,W4.

Similarly, the auxiliary trace Cf5 may be formed on the secondary-side adjacent layer LSa of the circuit board CB2, and the secondary-side adjacent layer LSa may include at least one auxiliary trace Cf5. The auxiliary trace Cf5 may be arranged on the single-layer secondary-side adjacent layer LSa to form the auxiliary coil W5, or the auxiliary trace Cf5 on the same path may be connected in series through the interconnection of each secondary-side adjacent layer LSa (for example, using via holes, not shown) to serve as the auxiliary coil W5. In addition, when the number of layers of the secondary-side layer LS and the primary-side layer LP is one (that is, the second circuit board CB2 is a double-layer board and includes the top layer and the bottom layer), the secondary-side layer LS is the secondary-side adjacent layer LSa, and the primary-side layer LP is the primary-side adjacent layer LA. The secondary-side adjacent layer LSa includes a second secondary-side trace Ts2 that surrounds the fourth through hole H4 for several turns and an auxiliary trace Cf5. The primary-side adjacent layer LA includes a second primary-side trace Tp2 that surrounds the fourth through hole H4 for several turns and at least one auxiliary trace Cf1,Cf2,Cf3,Cf4. Therefore, when the second circuit board CB2 is a double-layer board, its structure and achievable functions can be inferred from the descriptions in FIG. 16 to FIG. 19B of the present disclosure and the corresponding paragraphs, and will not be described again here.

In particular, the auxiliary traces Cf1,Cf2,Cf3,Cf4,Cf5 may selectively adjust the number of turns surrounding the fourth through hole H4 according to the voltage required by the back-end circuit. Therefore, the auxiliary traces Cf1,Cf2, Cf3,Cf4 and the second primary-side trace Tp2 may have a concentric structure (the center is the fourth through hole H4), and the auxiliary trace Cf5 and the second secondary-side trace Ts2 may have a concentric structure (the center is the fourth perforation H4). In particular, the via holes described above can usually be filled with conductive materials (such as but not limited to solder paste and other conductive materials), so that the traces of the second transformer 2B can be electrically connected through the via holes.

In FIG. 19B, the second secondary-side trace Ts2 in the secondary-side adjacent layer LSa has a first width Wh1, Wh3, and the second primary-side trace Tp2 in the primary-side adjacent layer LA has a second width Wh2,Wh4. Specifically, in the secondary-side adjacent layer LSa, the distance from the second secondary-side trace Ts2 farthest from the fourth through hole H4 to the second secondary-side trace Ts2 closest to the fourth through hole H4 is the first width Wh1,Wh3. In the primary-side adjacent layer LA, the distance from the second primary-side trace Tp2 farthest from the fourth through hole H4 to the second primary-side trace Tp2 closest to the fourth through hole H4 is the second width Wh2,Wh4. In particular, the "width" may be the maximum distance formed by the traces of this layer in any cross-section of the circuit board CB2 perpendicular to the center line (that is, the distance from the trace farthest from the through hole Hf to the trace closest to the through hole Hf.). In one embodiment, the first width Wh1,Wh3 are larger than the second width Wh2,Wh4, which can make the coupling between the second primary-side coil 22B and the second secondary-side coil 24B better and make the voltage induced by the second secondary-side coil 24B be more stable. That is, in the secondary-side adjacent layer LSa close to the top layer, the first width Wh1 formed by the second secondary-side trace Ts2 of the secondary-side adjacent layer LSa can preferably cover the second width Wh2 formed by the second primary-side trace Tp2 of the primary-side adjacent layer LA. Therefore, the area formed by the second secondary-side trace Ts2 of the secondary adjacent layer LSa may be larger than the area formed by the second primary-side trace Tp2 of the primary-side adjacent layer LA.

In addition, when the primary-side adjacent layer LA includes the second primary-side trace Tp2 and the auxiliary traces Cf1,Cf2,Cf3,Cf4, the second width Wh2,Wh4 is formed by the auxiliary traces Cf1,Cf2,Cf3,Cf4 and the primary-side trace Tp2. That is, the first width Wh1 formed by the second secondary-side trace Ts2 of the secondary-side adjacent layer LSa is preferably greater than or equal to the second width Wh2 formed by the second primary-side trace Tp2 and the auxiliary traces Cf1, Cf2,Cf3,Cf4 of the primary-side adjacent layer LA. In particular, in the primary-side adjacent layer LA, from the trace farthest from the fourth through hole H4 (which may be the second primary-side trace Tp2 or one of the auxiliary traces Cf1,Cf2,Cf3, Cf4) to the trace closest to the fourth through hole H4 (which may be the second primary-side trace Tp2 or another of the auxiliary traces Cf1,Cf2,Cf3,Cf4) is the second width Wh2, Wh4. Therefore, the coupling properties of the second primary-side coil 22B, the second secondary-side coil 24B, and the auxiliary coils W1,W2,W3,W4,W5 can be better, and the voltage induced by each coil can be more stable.

In one embodiment, the corresponding relationship between the first width Wh3 and the second width Wh4 is the same as the first width Wh1 and the second width Wh2, and will not be described again here. In addition, the auxiliary traces Cf1,Cf2,Cf3,Cf4,Cf5 may preferably be configured on the secondary-side adjacent layer LSa and the primary-side adjacent layer LA to provide a better coupling effect, but are not limited thereto. In other words, the auxiliary traces Cf1,Cf2,Cf3,Cf4,Cf5 can be configured in any one of the secondary-side layer LS and the primary-side layer LP, as long as a suitable voltage can be acquired through coupling.

In FIG. 19B, the second iron core C2 may also include an air gap to increase the magnetic resistance through the air gap configuration to avoid magnetic saturation of the second transformer 2B during operation. The air gap gap can usually be formed on the third core pillar C22, but the shaped and position of the air gap gap can be determined according to the actual requirements, and they are not limited to FIG. 19B. In particular, the air gap gap has a first distance Y1, and the second primary-side trace Tp2, the second secondary-side trace Ts2 and the fourth through hole H4 have a plurality of second distances Y2, and the second distances Y2 are respectively greater than or equal to three times the first distance Y1. Specifically, maintaining a specific distance between the trace and the air gap gap can reduce the cutting loss of the second transformer 2B and increase the efficiency. Therefore, it is a better implementation to set the distance between the second secondary-side trace Ts2 and the fourth through hole H4 to three times the air gap gap.

On the other hand, since the second transformer 2B forms traces on the second circuit board CB2, the distance between the second primary-side trace Tp2, the second secondary-side trace Ts2 and the fourth through hole H4 on each layer of the second circuit board CB2 can be adjusted through simple circuit design software. Therefore, compared with the traditional transformer that can only grind the air gap on the second iron core C2 and cannot adjust the coil distance, the second transformer 2B of the present disclosure uses a trace structure formed on the second circuit board CB2, which can achieve the effect of fine-tuning the second distance Y2. In addition, the auxiliary traces Cf1,Cf2,Cf3, Cf4,Cf5 may preferably have a third distance from the fourth through hole H4, and it is a preferred implementation that the third distance is greater than or equal to three times the first distance Y1.

Figure 20:
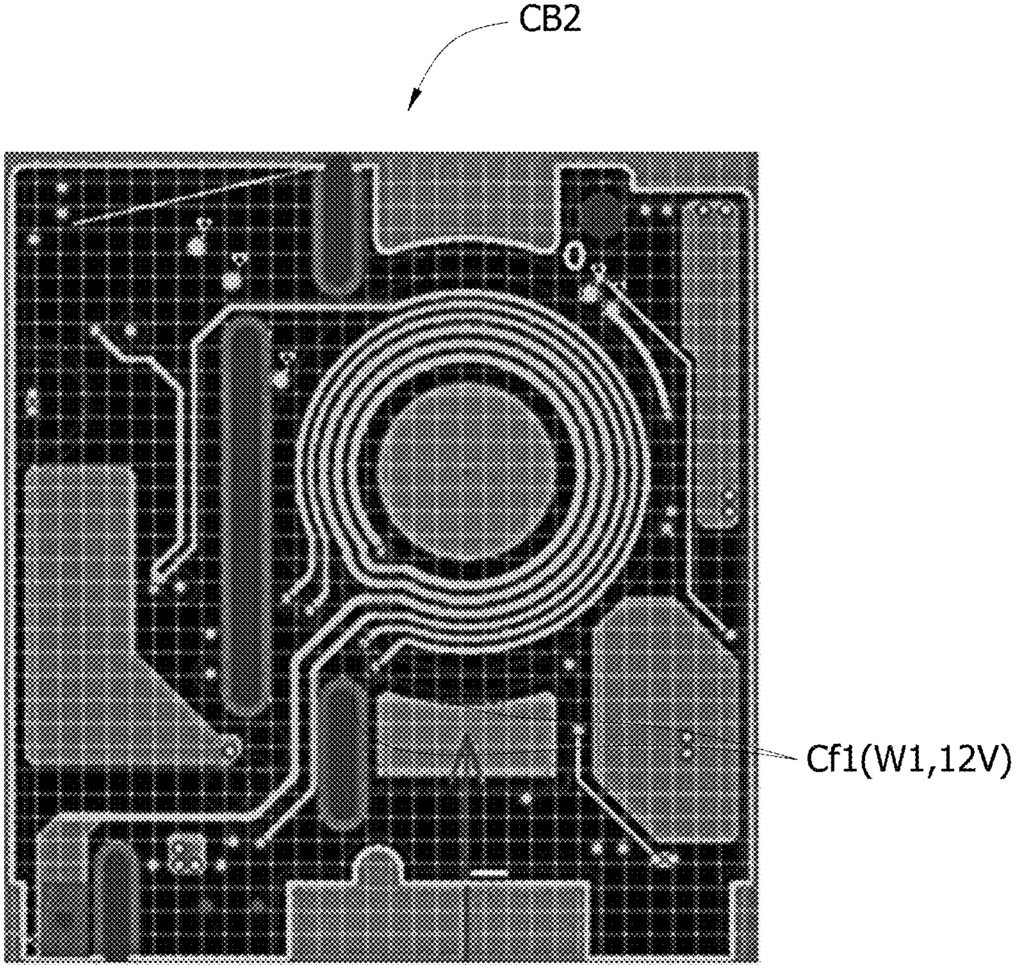
FIG. 20 is a schematic diagram of the wiring configuration of the primary adjacent layer of the present disclosure.

Please refer to FIG. 20, which shows a schematic diagram of the wiring configuration of the primary adjacent layer of the present disclosure, and also refer to FIG. 16 to FIG. 19B. In FIG. 20, the trace configuration of the primary-side adjacent layer LA close to the top layer of the second circuit board CB2 is illustrated, and the configuration includes the second primary-side trace Tp2 and the auxiliary trace Cf1. In FIG. 20, the auxiliary trace Cf1 can be configured in fractional turns (that is, the number of turns of the trace of this layer around the fourth through hole H4 is not an integer number of turns), so that the second transformer 2B can fine-tune the voltage acquired to achieve the requirements of better application. Specifically, in order to make the voltage value of the output voltage more stable and finely adjusted, the second transformer 2B can fine-tune the voltage induced by the auxiliary trace Cf1 by configuring an additional half turn (that is, auxiliary trace Cf1 is configured with an additional half turn), ¼ turn, or even ¹⁄₁₀ turn (take FIG. 20 as an example, the auxiliary trace Cf1 is 2.5 turns), so that the voltage can be more accurate (such as but not limited to 12V, etc.). In particular, although only the number of turns of the auxiliary trace Cf1 surrounding the fourth through hole H4 is shown in FIG. 20, which is not an integer number of turns, the similar second primary-side trace Tp2, the second secondary-side trace Ts2, and the auxiliary traces Cf2,Cf3,Cf4,Cf5 can also fine-tune the induced voltage through fractional turns, and no further details will be given here.

Figure 21:
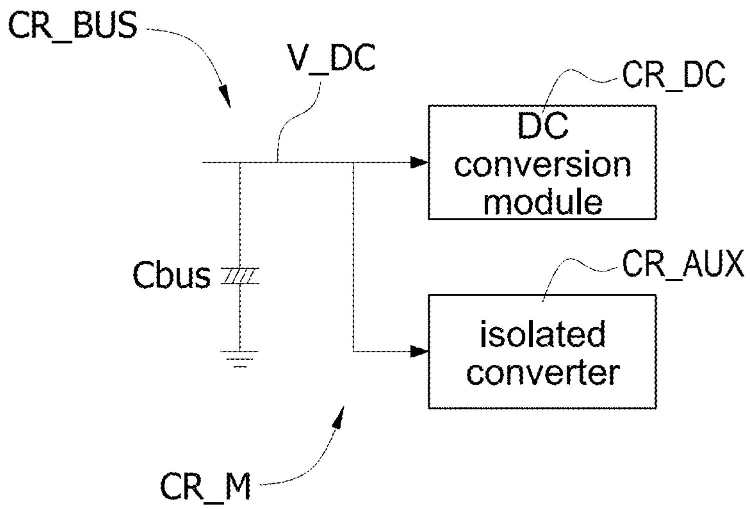
FIG. 21 is a schematic circuit diagram of the isolated conversion module and the DC conversion module of the present disclosure.

Please refer to FIG. 21, which shows a schematic circuit diagram of the isolated conversion module and the DC conversion module of the present disclosure, and also refer to FIG. 1 to FIG. 20. In FIG. 21A, the bus capacitor Cbus of the DC bus module CR_BUS is used to store a large amount of energy in order to supply power to the back-end DC conversion module CR_DC and the isolated converter CR_AUX. Since the DC conversion module CR_DC is a high-power conversion circuit, and the power supply PSU also needs to meet the hold-up time requirement when the power is shutdown, the bus capacitor Cbus cannot reduce its size and capacity. On the other hand, since the isolated converter CR_AUX mainly provides the auxiliary power supply V_AUX with small power, and its current capability is not high, the non-hollow area ASN next to the accommodating space of the second main circuit board CB_M2 shown in FIG. 17A to FIG. 17C for tracing to transmit power. It does not need to be equipped with copper bars to transmit current like the DC conversion module CR_DC.

Figure 22A:
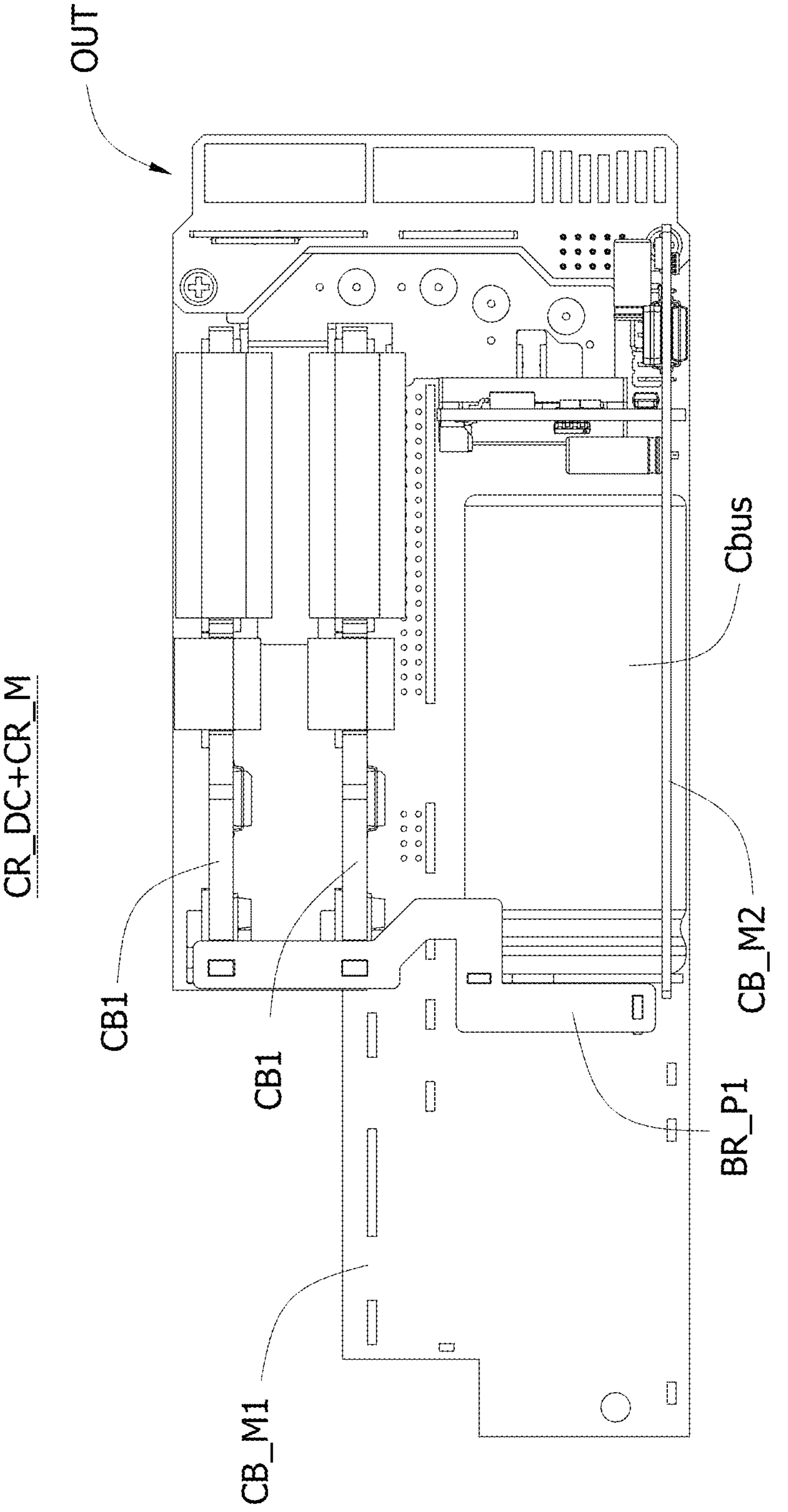
FIG. 22A is a top plan view of the isolated conversion module and the DC conversion module of the present disclosure.
Figure 22B:
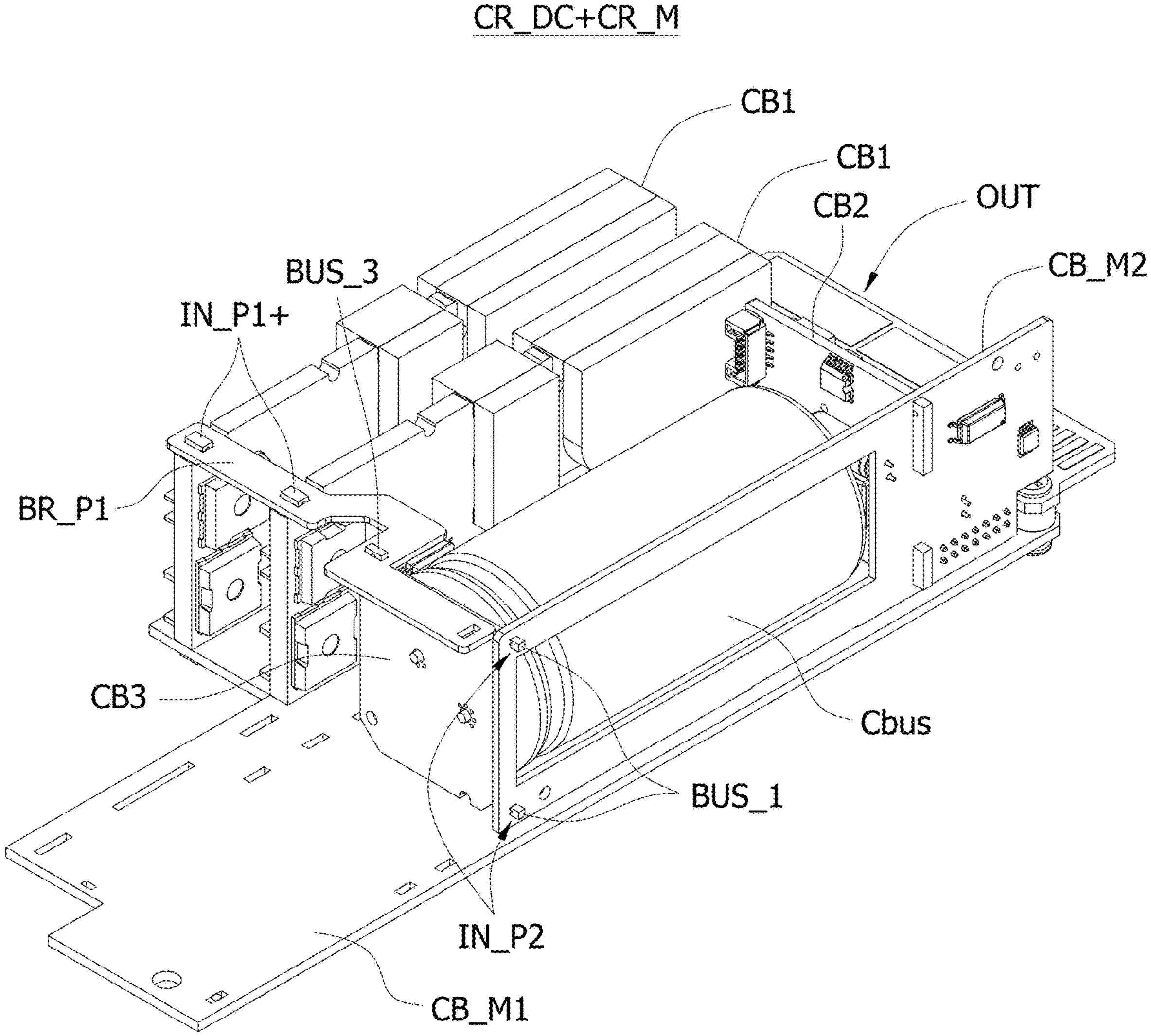
FIG. 22B is a three-dimensional combination diagram of the isolated conversion module and the DC conversion module of the present disclosure.
Figure 22C:
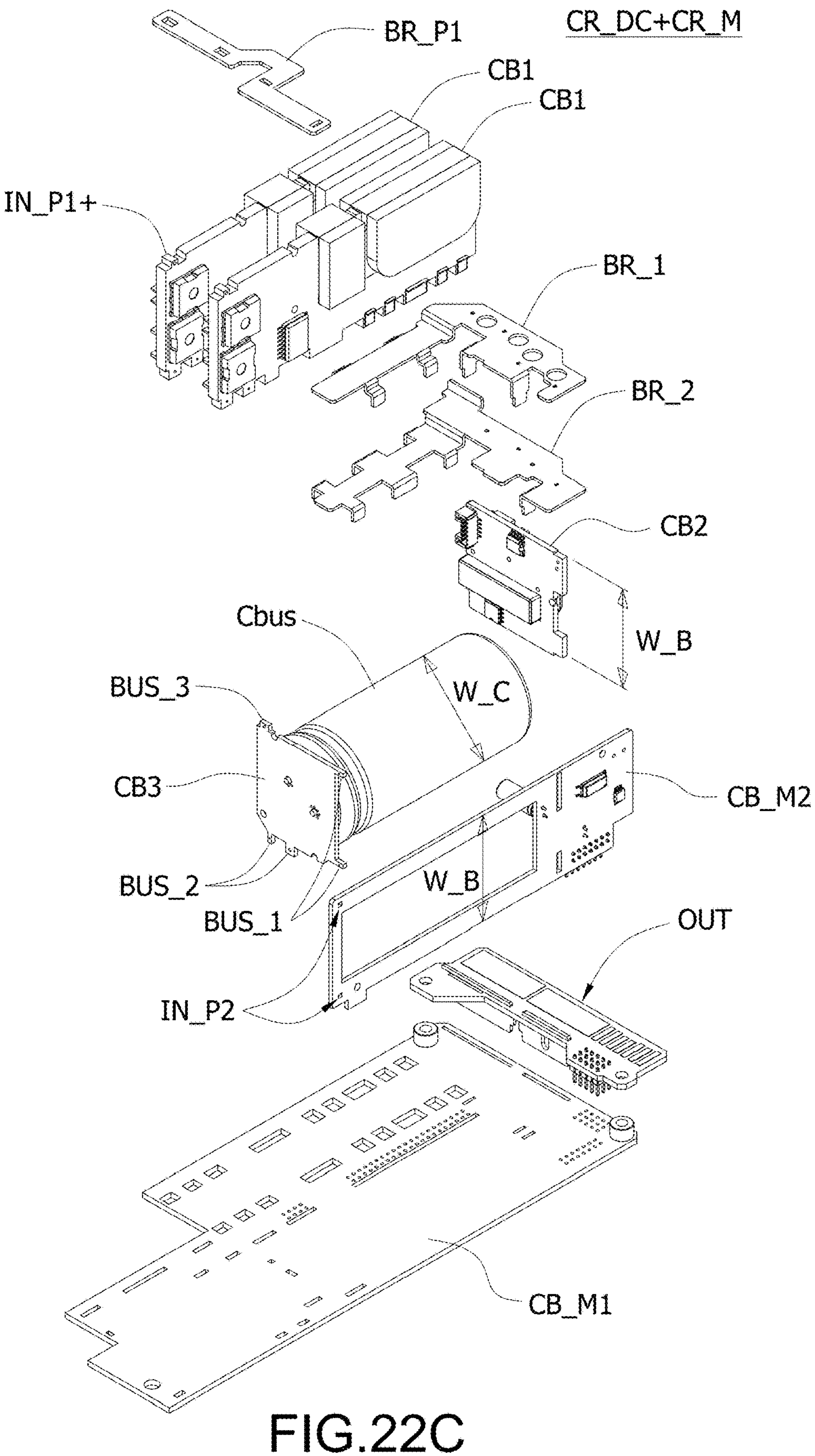
FIG. 22C is a three-dimensional exploded view of the isolated conversion module and the DC conversion module of the present disclosure.

Please refer to FIG. 22A, which shows a top plan view of the isolated conversion module and the DC conversion module of the present disclosure; please refer to FIG. 22B, which shows a three-dimensional combination diagram of the isolated conversion module and the DC conversion module of the present disclosure; please refer to FIG. 22C, which shows a three-dimensional exploded view of the isolated conversion module and the DC conversion module of the present disclosure, and also refer to FIG. 21. Since the bus capacitor Cbus needs to provide a large power supply to the DC conversion module CR_DC, the first power copper bar BR_P1 is used to connect the bus capacitor Cbus and the first circuit board CB1. In order to separate the high and low voltage of the power supply, avoid high-voltage noise from affecting low-voltage small signal transmission, and rationally use the vertical space inside the power supply PSU, the first power copper bar BR_P1, which provides a high-voltage path, is arranged in the upper space inside the power supply unit PSU to connect the bus capacitor Cbus and the first circuit board CB1. Therefore, the high-power first power copper bar BR_P1 can be prevented from affecting or interfering with the low-voltage control signal on the first main circuit board CB_M1.

In FIG. 22B and FIG. 22C, the third circuit board CB3 of the DC bus module CR_BUS includes the first bus terminal BUS 1, the second bus terminal BUS_2, and the third bus terminal BUS_3. The first bus terminal BUS 1 is formed on the first side of the third circuit board CB3 and is plugged into the second power input terminal IN_P2 to provide the DC power V_DC to the second main circuit board CB_M2 to supply power to the isolated converter CR_AUX to convert the DC power source V_DC into the auxiliary power source V_AUX. The second bus terminal BUS_2 is formed on the second side of the third circuit board CB3 and is plugged into the first main circuit board CB_M1 to fix the third circuit board CB3 at a specific position through the second main circuit board CB_M2 and the first main circuit board CB_M1. In particular, one terminal of the bus capacitor Cbus (i.e., the ground terminal or the power terminal) can also be connected to the first main circuit board CB_M1 through the third circuit board CB3 and be coupled to the ground loop or the power loop. The third bus terminal BUS_3 is formed in the third circuit board CB3, opposite to the third side of the second side (i.e., the side opposite to the first main circuit board CB_M1). Therefore, the third bus terminal BUS_3 can be coupled to the DC conversion module CR_DC through the first power copper bar BR_P1, and the second bus terminal BUS_2 can be coupled to the DC conversion module CR_DC through the first main circuit board CB_M1 so that the DC power source V_DC can be provided to the DC conversion module CR_DC, and the high voltage is transmitted through the vertical upper and lower areas inside the power supply unit PSU (i.e., the first power copper bar BR_P1 and the first main circuit board CB_M1).

Therefore, by the structural insertion of the first main circuit board CB_M1 and the second main circuit board CB_M2, the second main circuit board CB_M2, the third circuit board CB3, and the first main circuit board CB_M1 can form a three-dimensional vertical structure. In particular, the three-dimensional vertical structure refers to a structure in which any two of the three directions of X, Y, and Z are vertical. On the other hand, the second circuit board CB2 may also have a three-dimensional vertical structure through the structural insertion of the first main circuit board CB_M1 and the second main circuit board CB_M2. On the other hand, since the second accommodation space SA2 inside the power supply PSU must be able to accommodate the bus capacitor Cbus, any one of the length, width, and height of the power supply PSU must be larger than the diameter of the bus capacitor Cbus. Since the isolated conversion module CRM is a modular circuit, the structural stability of the combination of modules must be considered, and how to maximize the power density of the power supply PSU must be considered. Therefore, in order to avoid wasting the second accommodation space SA2, it is a better implementation that the width W B of the second main circuit board CB_M2 and the second main circuit board CB_M2 is substantially equal to the diameter W_C of the bus capacitor Cbus. Moreover, under such a configuration, the isolated conversion module CR_M can have a roughly columnar structure, and its appearance structure looks like a rectangular parallelepiped.

It is similar to FIG. 3D and FIG. 3E, since the large power input/output of the isolated converter CR_AUX and the DC bus module CR_BUS both rely on the lower first main circuit board CB_M1 and the upper first power copper bar BR_P1, the signal trace configuration of the isolated conversion module CR_M can be further away from the location of large power input/output, thereby preventing signal transmission from being affected by coupling of large currents. In addition, since the switch SW of the isolated converter CR_AUX may use third-generation semiconductor components such as wide bandgap (WBG) and is used in high-frequency switching (such as but not limited to, 300 kHz), it is necessary to use a signal transmission method that suppresses noise to avoid noise interference. Therefore, the drive circuit of the switch SW of the present disclosure still uses the principle of overlapping magnetic flux cancellation between the upper and lower layers of the second circuit board CB2 to reduce the parasitic inductance on the path, thereby reducing noise interference due to the high-frequency noise cancellation under the high-speed switching condition. Since the principle and detailed features of using upper and lower stacked magnetic flux cancellation are similar to those in FIG. 3D and FIG. 3E, and will not be described again here.

Figure 23A:
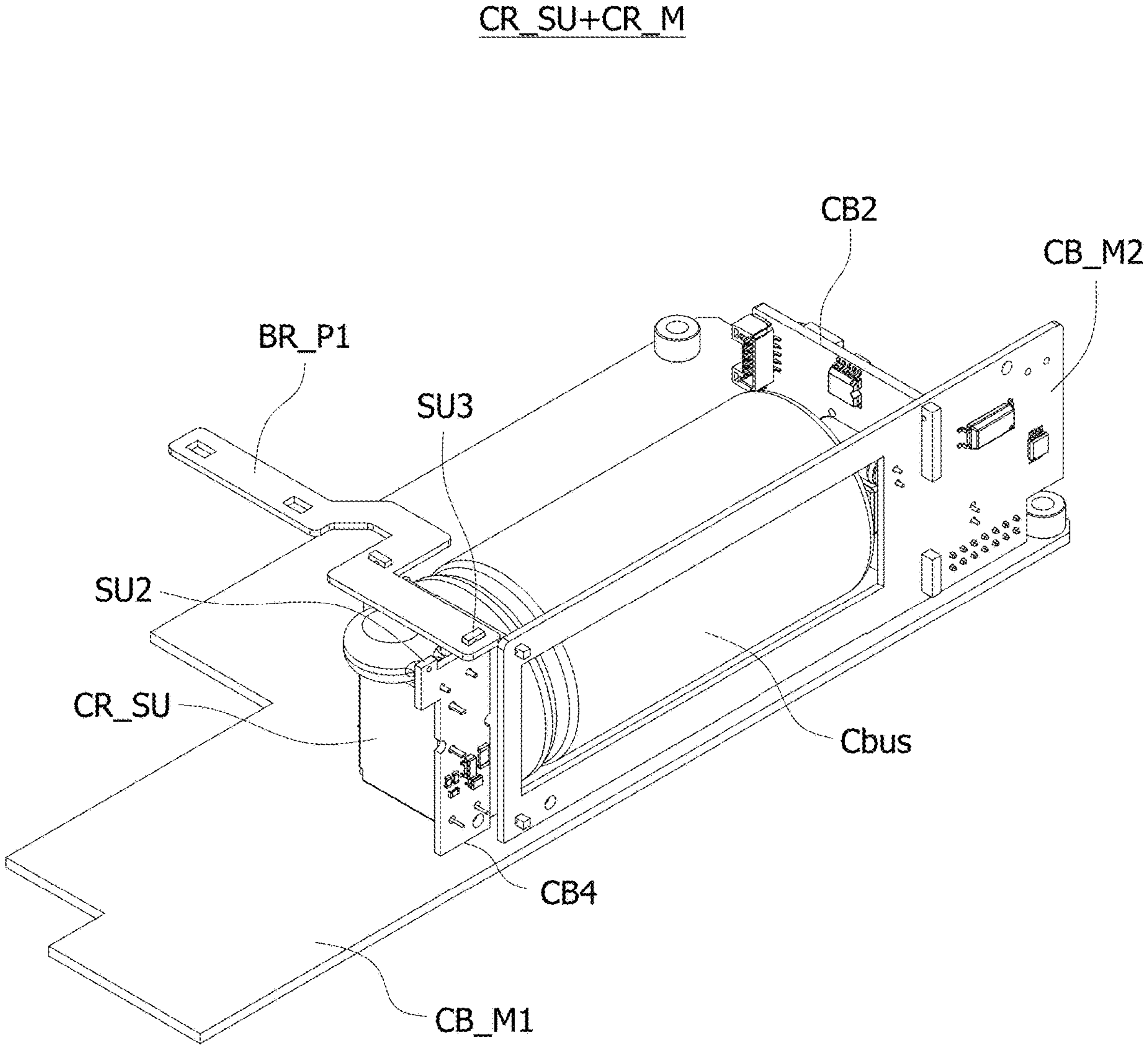
FIG. 23A is a three-dimensional assembly diagram of the disclosed isolated conversion module and a surge suppression circuit.
Figure 23B:
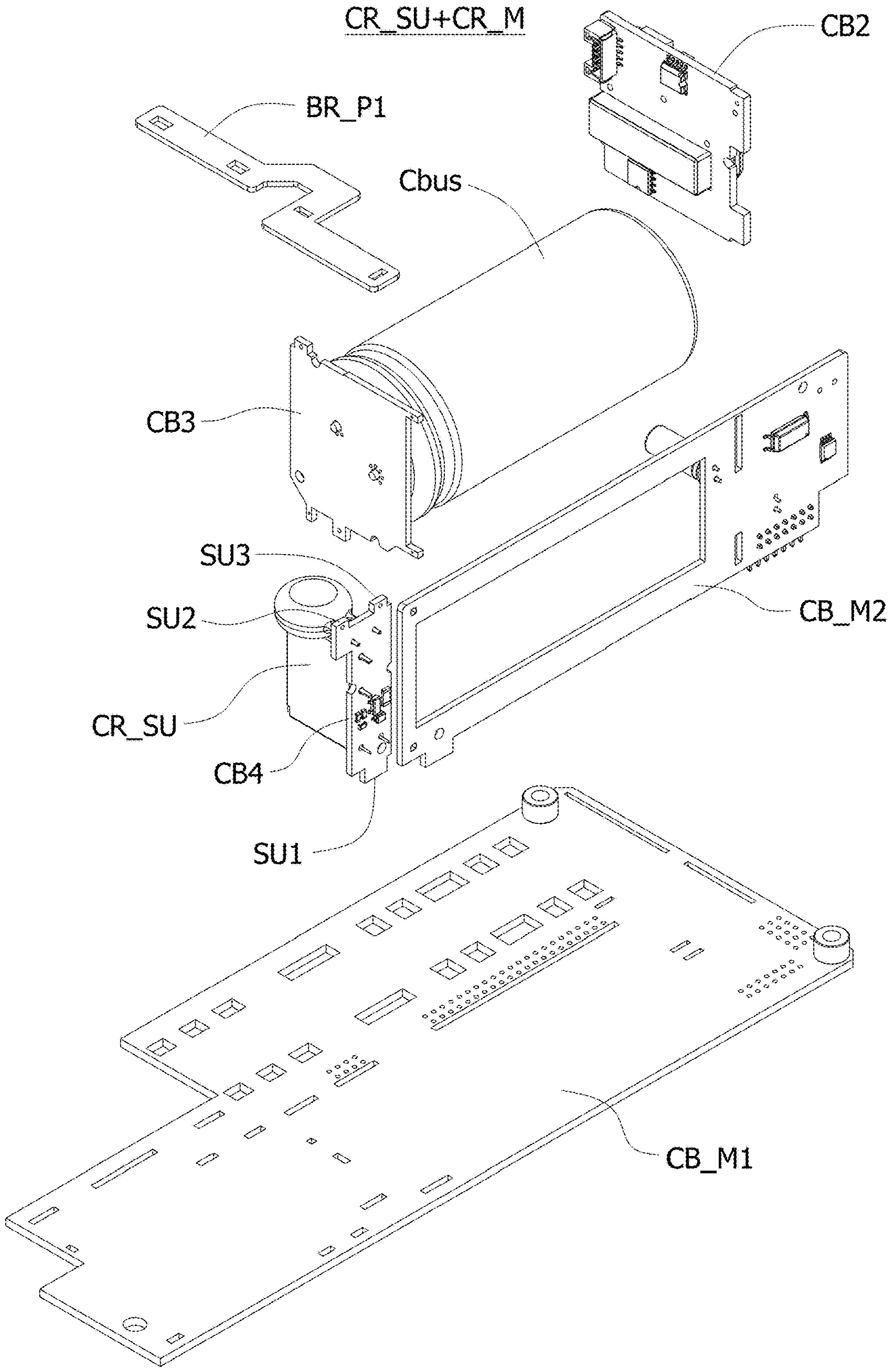
FIG. 23B is a three-dimensional exploded view of the disclosed isolated conversion module with a surge suppression circuit.

Please refer to FIG. 23A, which shows a three-dimensional assembly diagram of the disclosed isolated conversion module and a surge suppression circuit; please refer to FIG. 23B, which shows a three-dimensional exploded view of the disclosed isolated conversion module with a surge suppression circuit, and also refer to FIG. 21 to FIG. 22C. The path from the power factor corrector PFC to the bus capacitor Cbus may also include a surge suppression circuit CR_SU, and the surge suppression circuit CR_SU is used to suppress the instantaneous large current caused by charging the DC power source V_DC when the bus capacitor Cbus is discharged. In particular, the surge suppression circuit CR_SU may include, but is not limited to, a parallel controllable switch and a resistor (not shown). When the power supply PSU is just connected to the AC power source V_AC, the controllable switch is turned off, thereby allowing a large current to flow through the resistor and reducing the size of the current surge peak. After the bus capacitor Cbus has established a sufficient potential, the controllable switch is turned on, thereby allowing the current to flow through the controllable switch with lower energy consumption to reduce the power loss of the surge suppression circuit CR_SU.

In FIG. 23A to FIG. 23C, the isolated conversion module CR_M further includes a fourth circuit board CB4 and a surge suppression circuit CR_SU, and the surge suppression circuit CR_SU is plugged into the fourth circuit board CB4. The fourth circuit board CB4 includes a first terminal SU1, a second terminal SU2 and a third terminal SU3, the first terminal SU1 is formed on the first side of the fourth circuit board CB4, and the surge suppression circuit CR_SU is coupled to the first main circuit board CB_M1 by being plugged into the first main circuit board CB_M1. The second terminal SU2 is formed in the fourth circuit board CB4, opposite to the second side of the first side, and the third terminal SU3 is formed on the same side as the second terminal. In particular, the second terminal SU2 is coupled to the power factor corrector PFC, and the third terminal SU3 is coupled to the third bus terminal BUS_3 through the first power copper bar BR_P1, so that the DC power V_DC provided by the power factor corrector PFC first passes through the surge suppression circuit CR_SU, and then stored in the bus capacitor Cbus.

E. Power Factor Corrector

Figure 24:
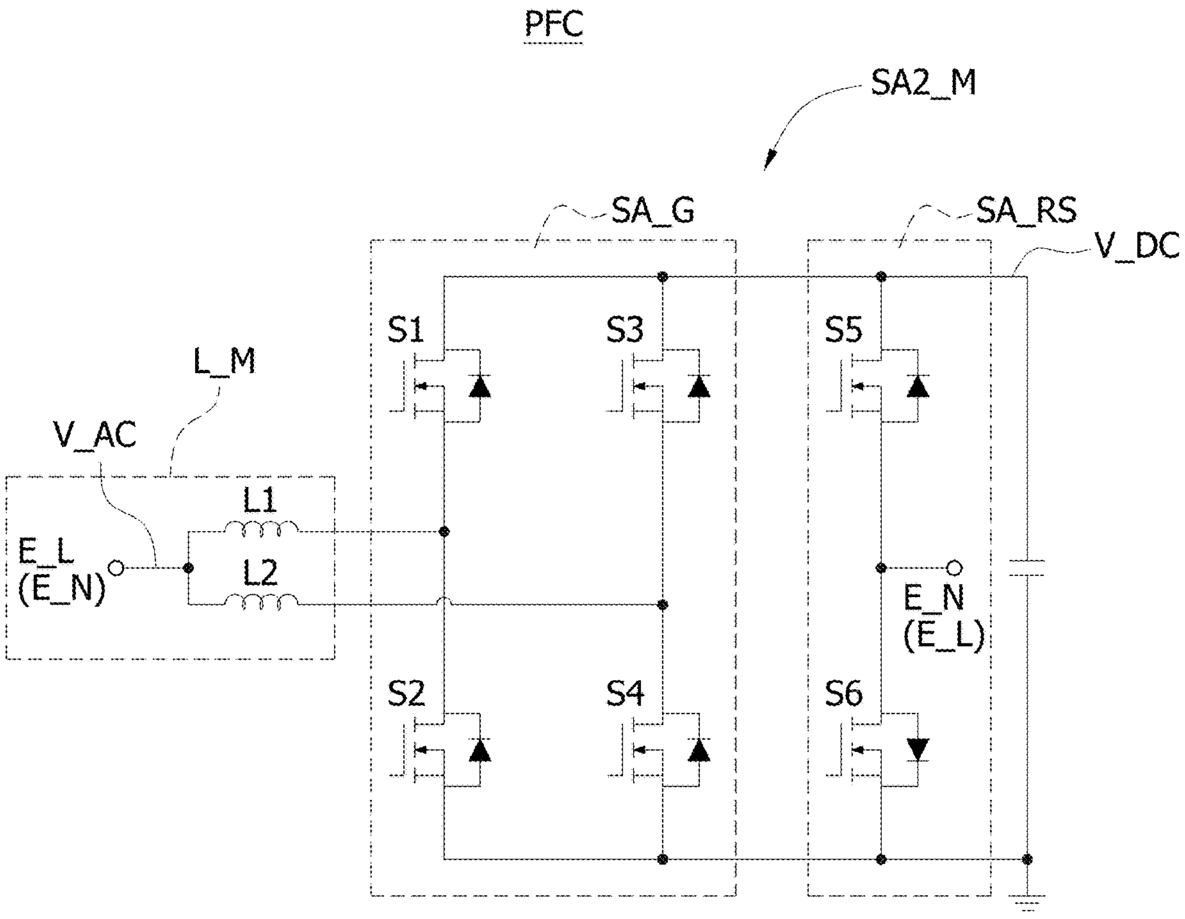
FIG. 24 is a circuit diagram of the power factor corrector of the present disclosure.

Please refer to FIG. 24, which shows a circuit diagram of the power factor corrector of the present disclosure, and also refer to FIG. 1 and FIG. 2. The power factor corrector PFC mainly uses a bridgeless Totem-Pole interleave converter, and its structure includes an inductor module L_M and a second switch bridge arm SA2_M. The inductor module L_M includes a first inductor L1 and a second inductor L2, and the second switch arm SA2_M includes a bridge arm assembly SA_G and a rectification bridge arm SA_SR. The bridge arm assembly SA_G may include a first bridge arm SA_1 and a second bridge arm SA_2 connected in parallel, and the first bridge arm SA_1 and the second bridge arm SA_2 respectively include a plurality of power switches S1-S4 to form a bridge arm assembly SA_G of a full-bridge structure. The rectification bridge arm SA_SR is connected in parallel to the bridge arm assembly SA_G and includes series-connected rectification switches S5-S6. One terminal of the first inductor L1 is coupled to one terminal of the second inductor L2 to form one of the live terminal E_L and the ground terminal E_N (herein represented by the live terminal E_L). The other terminal of the first inductor L1 is coupled to the power switches S1-S2, and the other terminal of the second inductor L2 is coupled to the power switches S3-S4. In particular, the bridge arm assembly SA_G may be called a fast-switching arm, and the other one of the live terminal E_L and the ground terminal E_N is formed between the rectification switches S5-S6 (herein represented by the ground terminal E_N). The live wire terminal E_L and the ground wire terminal E_N are respectively coupled to the live wire and the ground wire of the AC power source V_AC to receive the AC power source V_AC. The power factor corrector PFC converts the AC power source V_AC into a DC power source V_DC by switching the bridge arm assembly SA_G and the rectification bridge arm SA_SR.

Figure 25A:
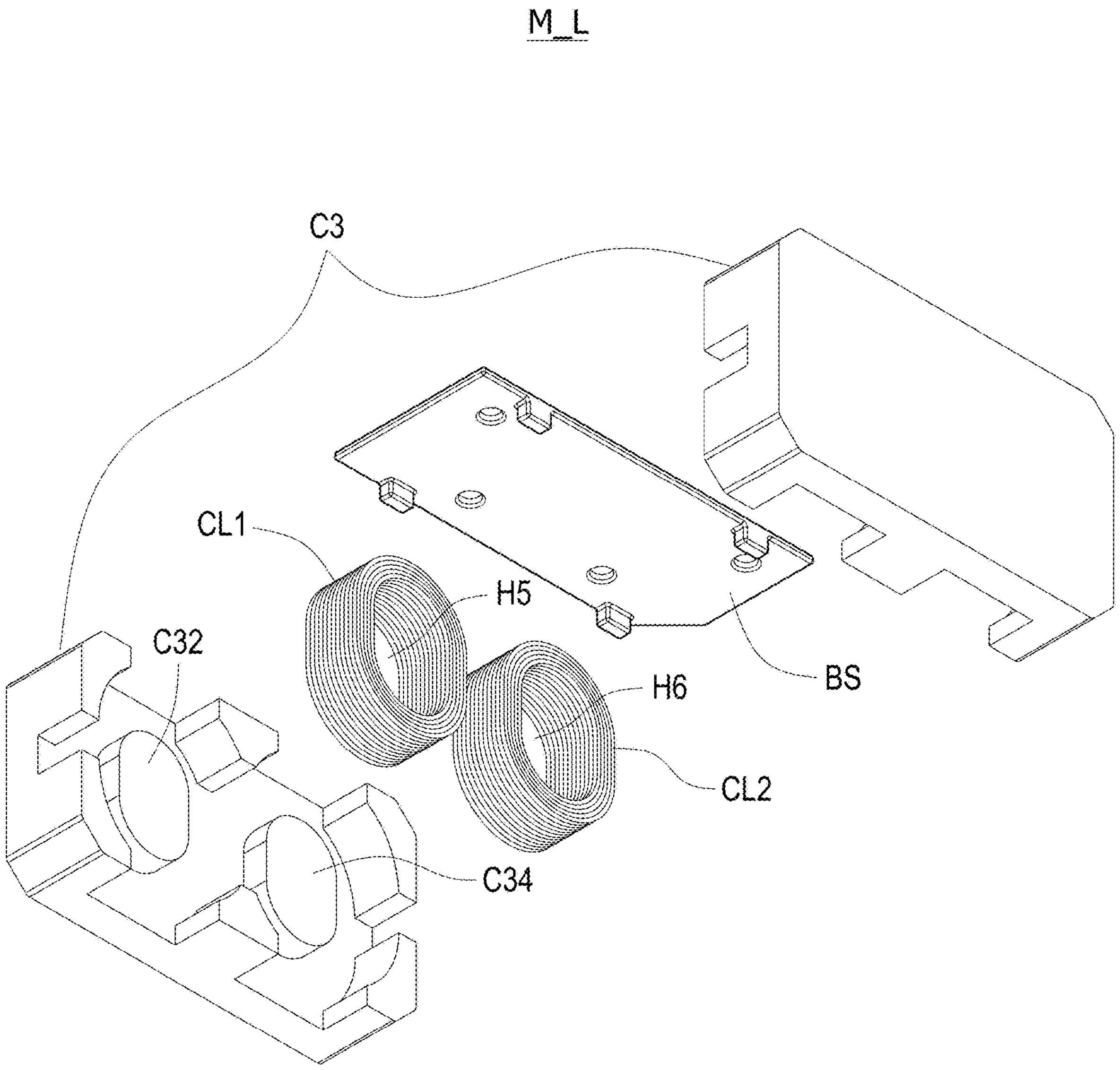
FIG. 25A is a three-dimensional structural diagram of the power inductor disclosed in the present disclosure.
Figure 25B:
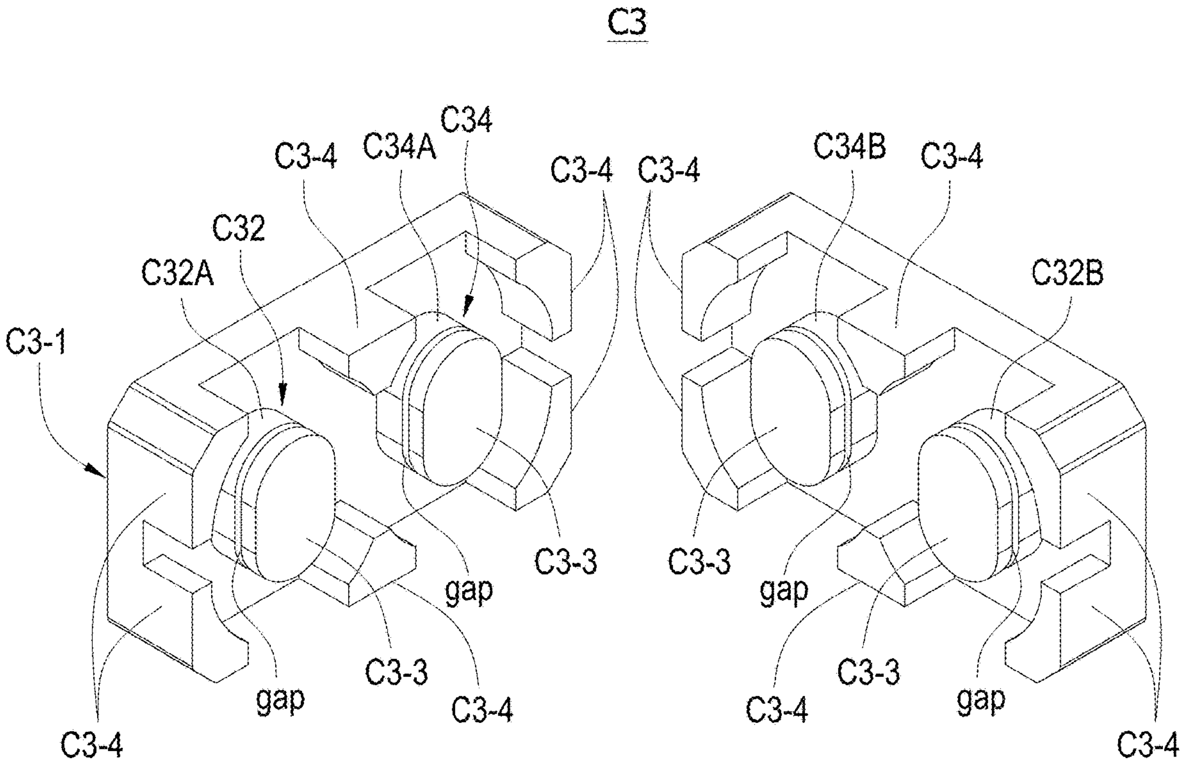
FIG. 25B is a three-dimensional structural view of the iron core of the power inductor disclosed in the present disclosure.

Please refer to FIG. 25A, which shows a three-dimensional structural diagram of the power inductor disclosed in the present disclosure; please refer to FIG. 25B, which shows a three-dimensional structural view of the iron core of the power inductor disclosed in the present disclosure, and also refer to FIG. 24. In FIG. 25A, the inductor module L_M includes a coil assembly, a third iron core C3, and a base BS, and the coil assembly includes a first coil CL1 and a second coil CL2. The first coil CL1 and the second coil CL2 are arranged on the base BS, and the wire heads/wire tails of the first coil CL1 and the second coil CL2 are fixed on the base BS by, for example but not limited to, tin filling, thereby avoid loosening or displacement of the first coil CL1 or the second coil CL2. The third iron core C3 is sleeved on the first coil CL1 and the second coil CL2 to form the first inductor L1 and the second inductor L2 respectively. Specifically, the first coil CL1 may be formed into a circular or elliptical coil by winding, for example but not limited to, copper wire, and a fifth through hole H5 is formed in the center of the circular or elliptical coil. Similarly, the second coil CL2 may also be wound by copper wire to form a circular or elliptical coil, and the sixth through hole H6.

In FIG. 25B, the third iron core C3 includes a fourth core pillar C32 and a fifth core pillar C34, and the fourth core pillar C32 and the fifth core pillar C34 respectively pass through the fifth through hole H5 and the sixth through hole H6, and are sleeved on the first coil CL1 and the second coil CL2 to form the first inductor L1 and the second inductor L2 respectively. In particular, the fourth core pillar C32 and the fifth core pillar C34 respectively include a plurality of air gaps gap. Although the third iron core C3 can use an EE-type or EI-type iron core, and the air gaps gap are formed by grinding the fourth core pillar C32 and/or the fifth core pillar C34. However, if a combined structure of sheet iron cores is used, the efficiency of the power factor corrector PFC can be increased, which is a better implementation.

Specifically, the third iron core C3 includes two cover bodies C3-1,C3-2 and a plurality of sheet iron cores C3-3, and the two cover bodies C3-1,C3-2 respectively include two protruding pillars C32A,C34A,C32B,C34B. The sheet iron cores C3-3 are respectively arranged between the protruding pillars C32A,C34A,C32B,C34B of the two cover bodies C3-1,C3-2 to form the fourth iron core pillar C32 and the fifth core pillar C34. That is, at least one sheet iron core C3-3 may be arranged between the pillars C32A,C32B to form the fourth core pillar C32, and the air gaps gap are formed between the sheet iron cores C3-3 and the pillars C32A,C32B. Similarly, at least one sheet iron core C3-3 may be arranged between the pillars C34A,C34B to form the fifth core pillar C34 and a plurality of air gaps gap.

In addition, in FIG. 25A, the two cover bodies C3-1,C3-2 also include a plurality of side pillars C3-4 respectively. According to the design of the side pillars C3-4 in FIG. 25A, the magnetic flux can not only pass through the fourth core pillar C32 and the fifth core pillar C34, but also can pass through the side pillars C3-4 to make the magnetomotive force MMF more balanced. Therefore, the currents of the first coil CL1 and the second coil CL2 can be made more even, thereby increasing the conversion efficiency of the power factor corrector PFC. Therefore, the power factor corrector PFC of the present disclosure combines the two inductors L1,L2 into one through a single third iron core C3 to form a dual-inductor inductor module L_M. In addition, the third iron core C3 uses a double center pillar structure, and the center pillar also forms a plurality of air gaps to increase the efficiency of the power factor corrector PFC. Therefore, by the integration and coupling of the two inductors L1,L2, combined with the interleaved control of the second switch bridge arm SA2_M, the ripple current can be reduced and the power density can be increased.

Figure 26A:
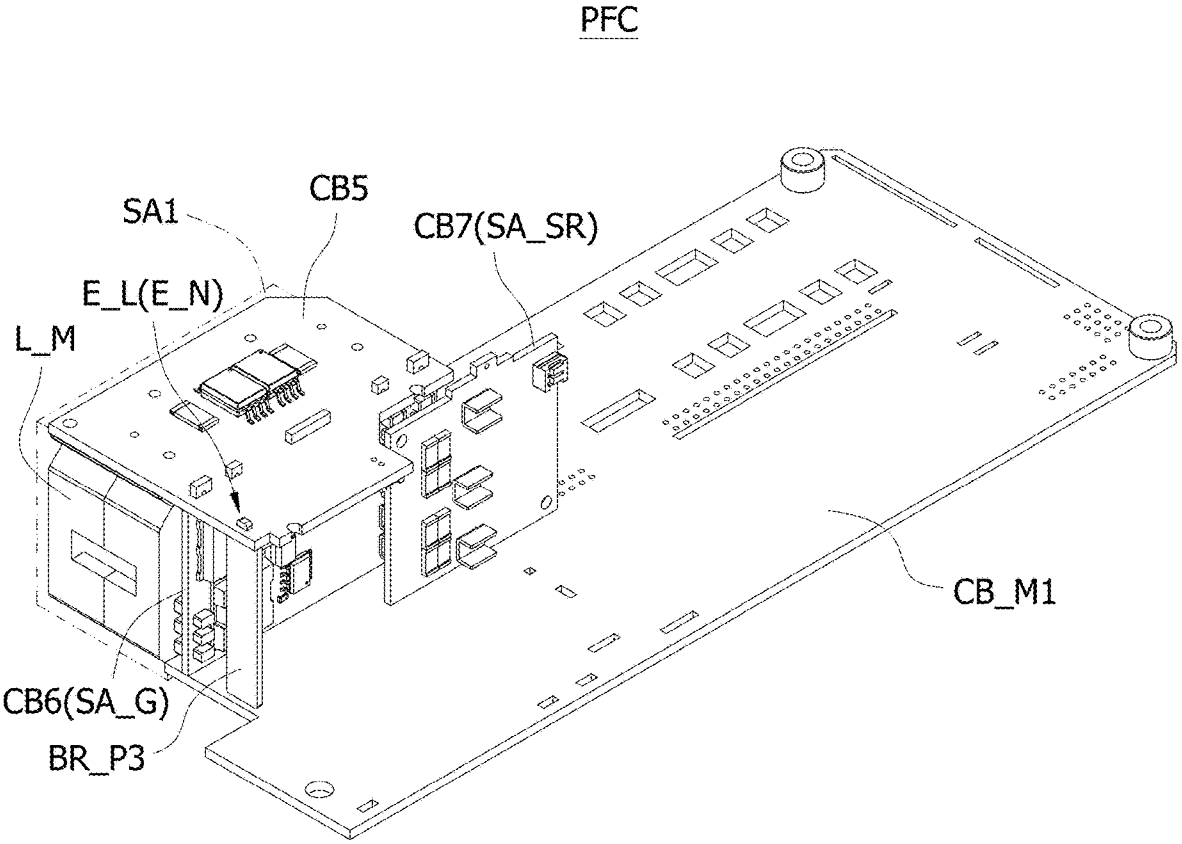
FIG. 26A is a three-dimensional assembled view of the power factor corrector of the present disclosure.
Figure 26B:
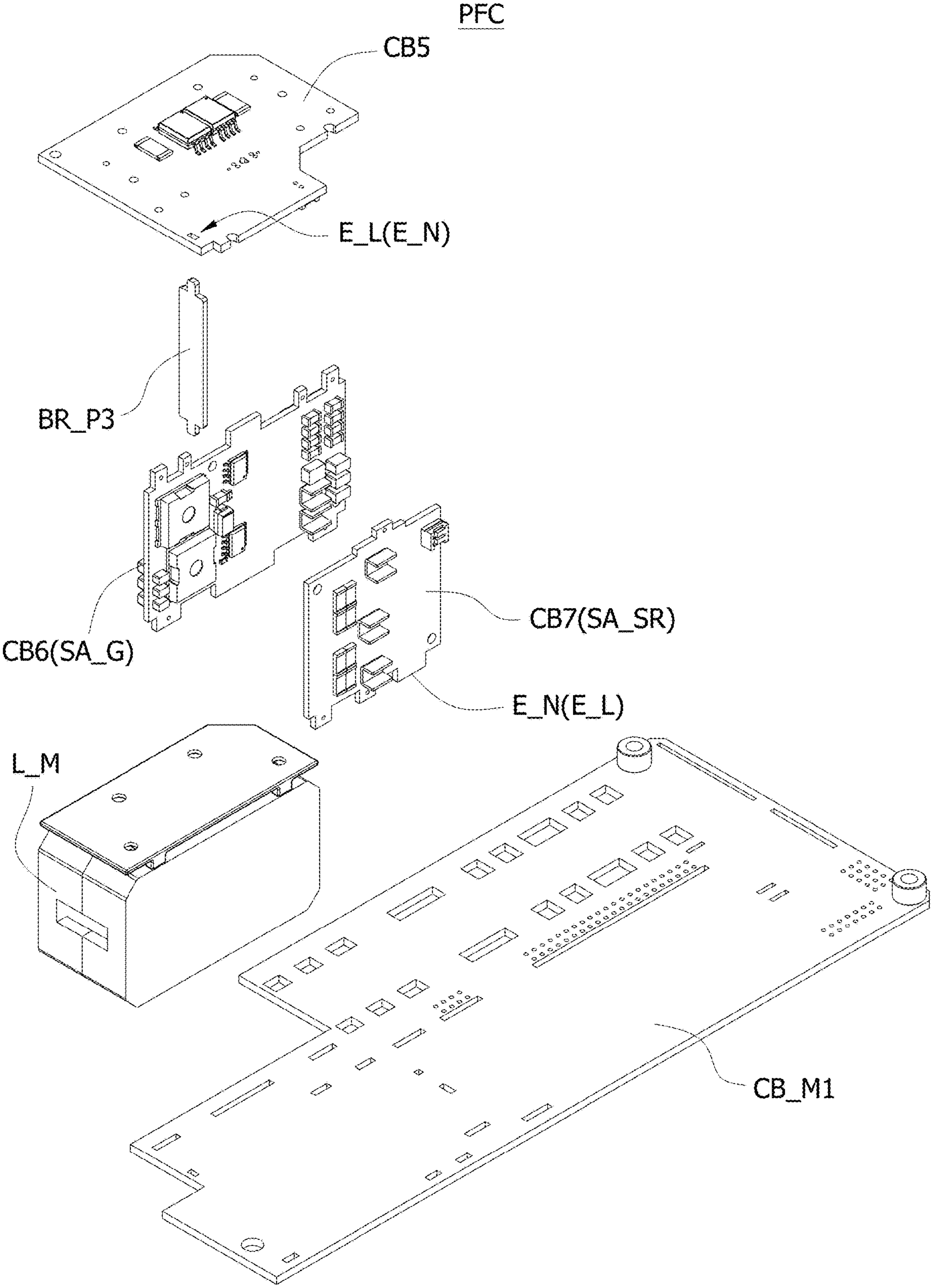
FIG. 26B is a three-dimensional exploded view of the power factor corrector of the present disclosure.

Please refer to FIG. 26A, which shows a three-dimensional assembled view of the power factor corrector of the present disclosure; please refer to FIG. 26B, which shows a three-dimensional exploded view of the power factor corrector of the present disclosure, and also refer to FIG. 24 to FIG. 25B. In addition to the inductor module L_M, the power factor corrector PFC also includes a fifth circuit board CB5, a sixth circuit board CB6, and a seventh circuit board CB7. The fifth circuit board CB5 is used to be plugged in by the inductor module L_M so that the wire heads/wire tails of the two inductors L1,L2 of the inductor module L_M are connected to the fifth circuit board CB5. The fifth circuit board CB5 also includes one of the live wire terminal E_L and the ground wire terminal E_N (here represented by the live wire terminal E_L), and this terminal is coupled to the third power copper bar BR_P3 to couple to the live wire or ground wire of the AC power source (here represented by the live wire terminal E_L being coupled to the live wire). The second switch arm SA2_M is formed by the sixth circuit board CB6 and the seventh circuit board CB7, and the second switch arm SA2_M is coupled to the fifth circuit board CB5 to form the power factor corrector PFC having a first inductor L1 and a second inductor L2 at the input terminal.

In FIG. 24 and FIG. 26B, the fifth circuit board CB5 and the inductor module L_M form the first inductor L1 and the second inductor L2 in FIG. 24, the sixth circuit board CB6 forms the bridge arm assembly SA_G in FIG. 24, and the seventh circuit board CB7 forms the rectification bridge arm SA_SR in FIG. 24. In particular, the fifth circuit board CB5 is arranged in parallel with the first main circuit board CB_M1, and they are respectively arranged in the upper and lower spaces of the power supply PSU. The sixth circuit board CB6 is arranged between the fifth circuit board CB5 and the first main circuit board CB_M1, and is arranged perpendicularly to them. Specifically, the sixth circuit board CB6 is configured with a plurality of power switches S1-S4 to form the bridge arm assembly SA_G, and one terminal of the sixth circuit board CB6 is plugged into the fifth circuit board CB5 and coupled to the inductor module L_M. The other terminal of the sixth circuit board CB6 is plugged into the first main circuit board CB_M1, so that the side view structure after the fifth circuit board CB5, the sixth circuit board CB6, and the first main circuit board CB_M1 are combined has an I-shaped structure.

In particular, the sixth circuit board CB6 forms the first accommodation space SA1 by plugging the fifth circuit board CB5, and the first accommodation space SA1 is used to accommodate the inductor module L_M. Furthermore, the length of the first accommodation space SA1 corresponds to the distance from the insertion point of the sixth circuit board CB6 and the fifth circuit board CB5 to the terminal of the sixth circuit board CB6, and the width of the first accommodation space SA1 corresponds to the distance from the insertion point of the sixth circuit board CB6 and the fifth circuit board CB5 to the fifth circuit board CB5. Therefore, the space formed by the casing CH of the power supply PSU corresponding to the bottom and side surfaces of the fifth circuit board CB5 and the sixth circuit board CB6 is the first accommodation space SA1, and the size of the first accommodation space SA1 accommodates the inductor module L_M.

The seventh circuit board CB7 is configured with a plurality of rectification switches S5-S6 to form a rectification bridge arm SA_SR, and the seventh circuit board CB7 is independently plugged into the first main circuit board CB_M1. In particular, the position where the seventh circuit board CB7 is plugged into the first main circuit board CB_M1 is the other one of the live wire terminal E_L and the ground wire terminal E_N (here represented by the ground wire terminal E_N) to couple the live wire or ground wire of the AC power source (here represented by the ground wire terminal E_N being coupled to the ground wire). Therefore, by vertical spatial configuration and combined inductor module L_M, the power density can be greatly increased.

Figure 26C:
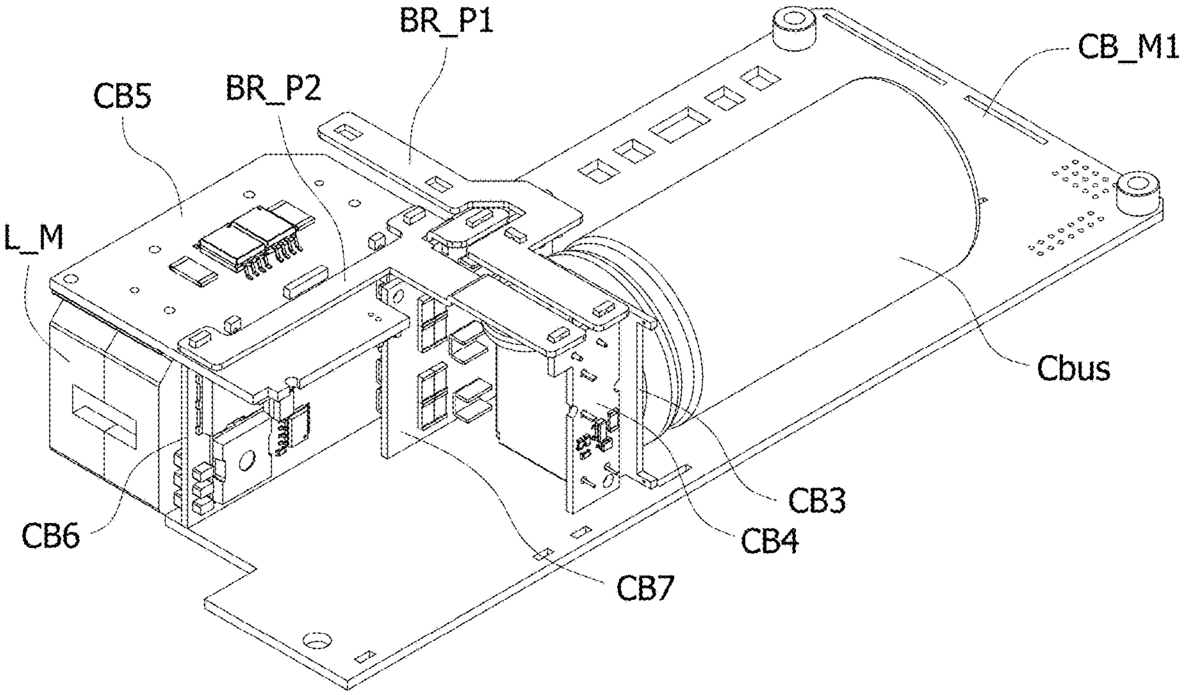
FIG. 26C is a three-dimensional assembly diagram of the disclosed power factor corrector with a surge suppression circuit and a DC bus module.
Figure 26D:
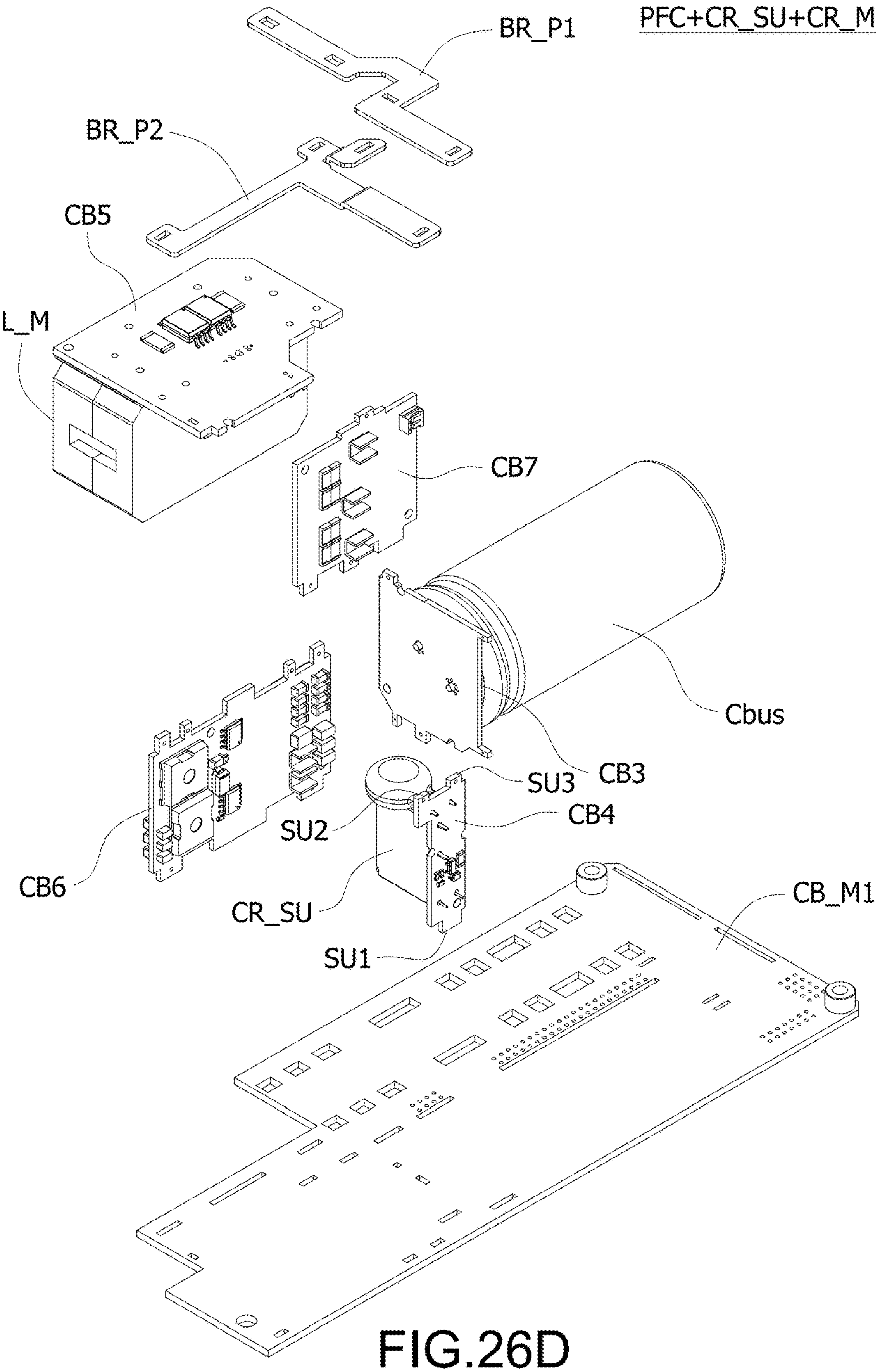
FIG. 26D is a three-dimensional exploded view of the disclosed power factor corrector with surge suppression circuit and DC bus module.

Please refer to FIG. 26C, which shows a three-dimensional assembly diagram of the disclosed power factor corrector with a surge suppression circuit and a DC bus module; please refer to FIG. 26D, which shows a three-dimensional exploded view of the disclosed power factor corrector with surge suppression circuit and DC bus module, and also refer to FIG. 24 to FIG. 26B. The path from the power factor corrector PFC to the bus capacitor Cbus may also include a surge suppression circuit CR_SU, and the surge suppression circuit CR_SU is used to suppress the instantaneous large current caused by charging the DC power source V_DC when the bus capacitor Cbus is discharged, and also refer to FIG. 23A and FIG. 23B. The isolated conversion module CRM may include a fourth circuit board CB4 and the surge suppression circuit CR_SU, so as to integrate the surge suppression circuit CR_SU into the isolated conversion module CR_M. Alternatively, the DC bus module CR_BUS may include a fourth circuit board CB4 and the surge suppression circuit CR_SU, so as to integrate the surge suppression circuit CR_SU into the DC bus module CR_BUS. On the other hand, the power factor corrector PFC may also include a fourth circuit board CB4 and a surge suppression circuit CR_SU, so as to integrate the surge suppression circuit CR_SU into the power factor corrector PFC. In addition, the fourth circuit board CB4 and the surge suppression circuit CR_SU may also be independent modular circuits. The same principle applies to the subordinate relationship between the output structure OUTS and the DC conversion module CR_DC, the isolated converter CR_AUX, and the isolated conversion module CR_M.

In FIG. 26C and FIG. 26D, the second power copper bar BR_P2 and the first main circuit board CB_M1 are respectively arranged above and below the power supply PSU. The fifth circuit board CB5 is coupled to the second terminal SU2 of the fourth circuit board CB4 through the second power copper bar BR_P2, so as to be coupled to the surge suppression circuit CR_SU and the bus capacitor Cbus through the second terminal SU2. The sixth circuit board CB6 is coupled to the second power copper bar BR_P2 by being plugged into the fifth circuit board CB5, so as to be coupled to the surge suppression circuit CR_SU and the bus capacitor Cbus through the second power copper bar BR_P2. The seventh circuit board CB7 is opposite to the terminal where the first main circuit board CB_M1 is plugged, and is coupled to the plug joint of the fifth circuit board CB5 and the sixth circuit board CB6 through the second power copper bar BR_P2, so that the rectification bridge arm SA_SR is connected to the bridge arm assembly SA_G in parallel. Similarly, the seventh circuit board CB7 is also coupled to the third power copper bar BR_P3 through the second power copper bar BR_P2 to couple the surge suppression circuit CR_SU and the bus capacitor Cbus through the second power copper bar BR_P2. The third terminal SU3 of the fourth circuit board CB4 is coupled to the third bus terminal BUS_3 through the first power copper bar BR_P1, so that the rectification bridge arm SA_SR is coupled to the surge suppression circuit CR_SU and the bus capacitor Cbus through the fourth circuit board CB4. Therefore, the DC power source V_DC provided by the power factor corrector PFC can first pass through the surge suppression circuit CR_SU and then be stored in the bus capacitor Cbus.

Therefore, after the circuit boards CB5,CB6,CB7 of the power factor corrector PFC in FIG. 26C and FIG. 26D are assembled, the circuit boards CB5,CB6,CB7 of the power factor corrector PFC are connected through the second power copper bar BR_P2 to form a closed loop. Similarly, in order to separate the high and low voltages of the power supply PSU, avoid high-voltage noise from affecting low-voltage small signal transmission, and rationally use the vertical space inside the power supply PSU, the second power copper bar BR_P2 is arranged in the upper space inside the power supply unit PSU for overlapping circuit boards CB5,CB6,CB7 of the power factor corrector PFC. Therefore, the high-power second power copper bar BR_P2 can be prevented from affecting or interfering with the low-voltage control signals on each circuit board CB5,CB6, CB7 and/or the first main circuit board CB_M1.

It is similar to FIG. 3D and FIG. 3E, the large power input/output of the power factor corrector PFC relies on the first main circuit board CB_M1 below and the second power copper bar BR_P2 above. Therefore, the signal routing configuration of the power factor corrector PFC can be relatively far away from the location of large power input/output to prevent signal transmission from being affected by coupling of large currents. In addition, since the power switches S1-S6 of the power factor corrector PFC can use third-generation semiconductor components such as wide bandgap (WBG) and are used in high-frequency switching (such as but not limited to 300 kHz), it is necessary to use a signal transmission method that suppresses noise to avoid noise interference. Therefore, the drive circuits of the power switches S1-S4 disclosed in this disclosure still use the principle of overlapping magnetic flux cancellation between the upper and lower layers of the sixth circuit board CB6. The drive circuits of power switches S5-S6 still use the principle of overlapping magnetic flux cancellation between the upper and lower layers of the seventh circuit board CB7 to respectively reduce the parasitic inductance on the paths of the sixth circuit board CB6 and the seventh circuit board CB7. Therefore, high-frequency noise can be offset and noise interference can be reduced under high-speed switching conditions. Since the principle and detailed features of using upper and lower stacked magnetic flux cancellation are similar to those in FIG. 3D and FIG. 3E, and will not be described again here.

F. Electromagnetic Interference Suppression Circuit and Socket Module

Figure 27:
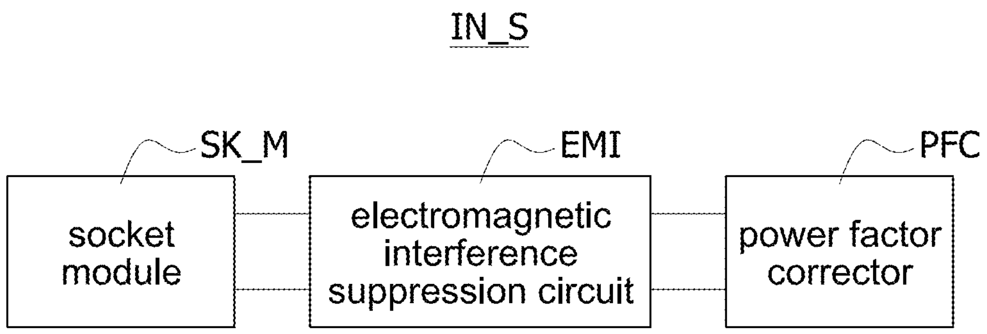
FIG. 27 is a circuit diagram of the input structure of the power supply of the present disclosure.

Please refer to FIG. 27, which shows a circuit diagram of the input structure of the power supply of the present disclosure, and also refer to FIG. 1 and FIG. 2. The input structure IN_S of the power supply PSU includes a socket module SK_M and an electromagnetic interference suppression circuit EMI. The socket module SK_M includes socket components, fuses, and may also include other filter circuits (such as but not limited to Y capacitors). The electromagnetic interference suppression circuit EMI includes filter circuits such as X capacitors, Y capacitors, and common mode inductors. For the convenience of explanation, these capacitors and inductors are collectively referred to as filter capacitors and filter inductors.

Figure 28A:
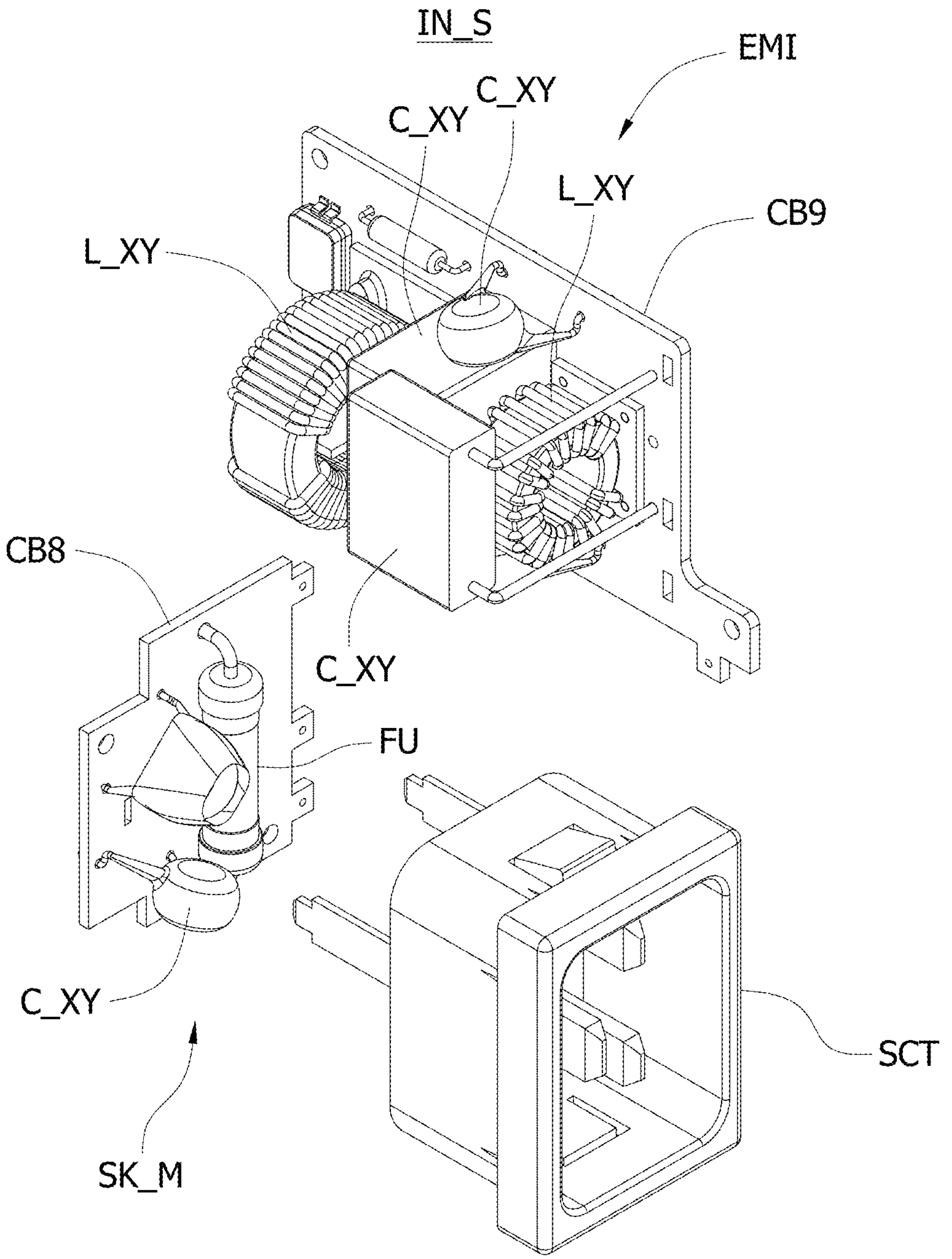
FIG. 28A is a three-dimensional exploded view of the input structure of the present disclosure.
Figure 28B:
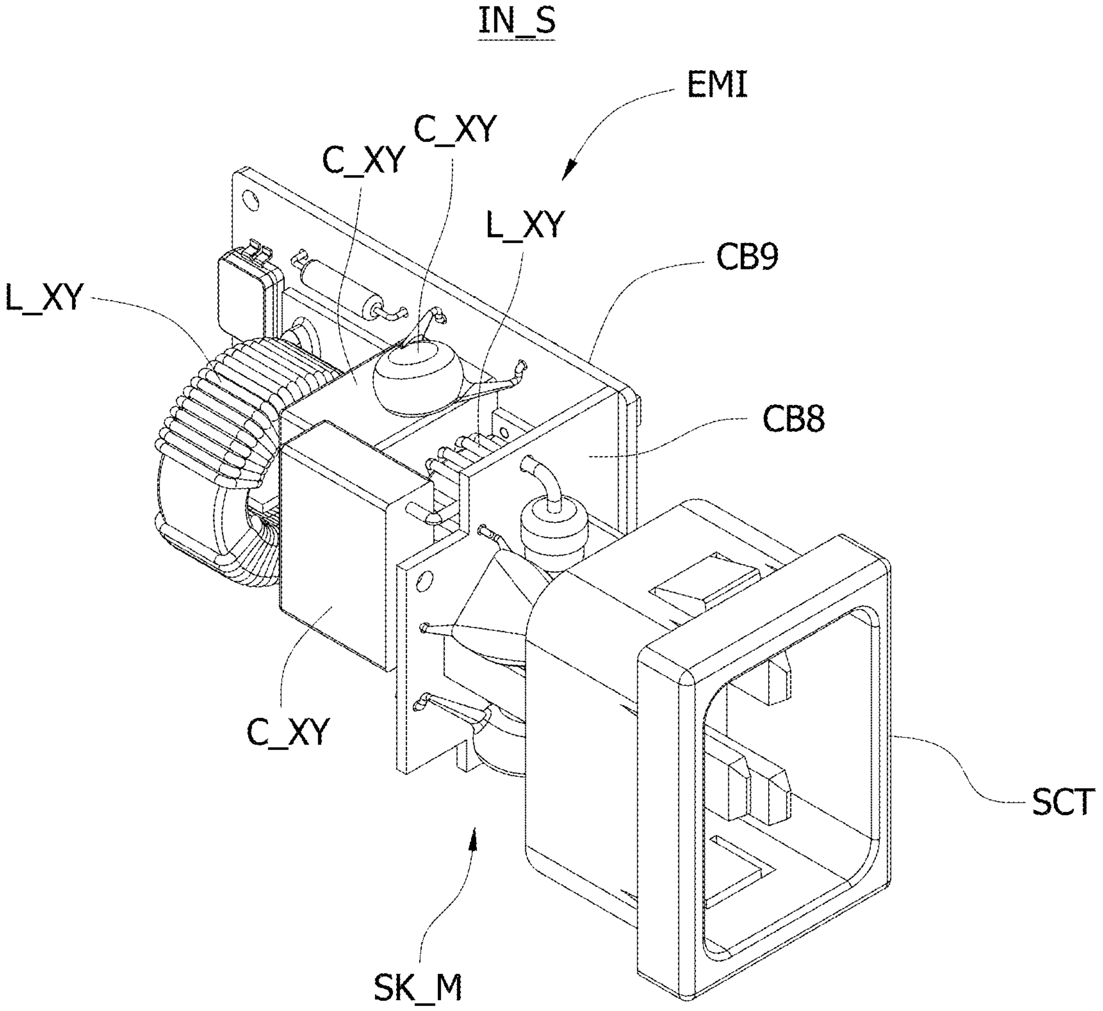
FIG. 28B is a three-dimensional assembled view of the input structure of the present disclosure.
Figure 28C:
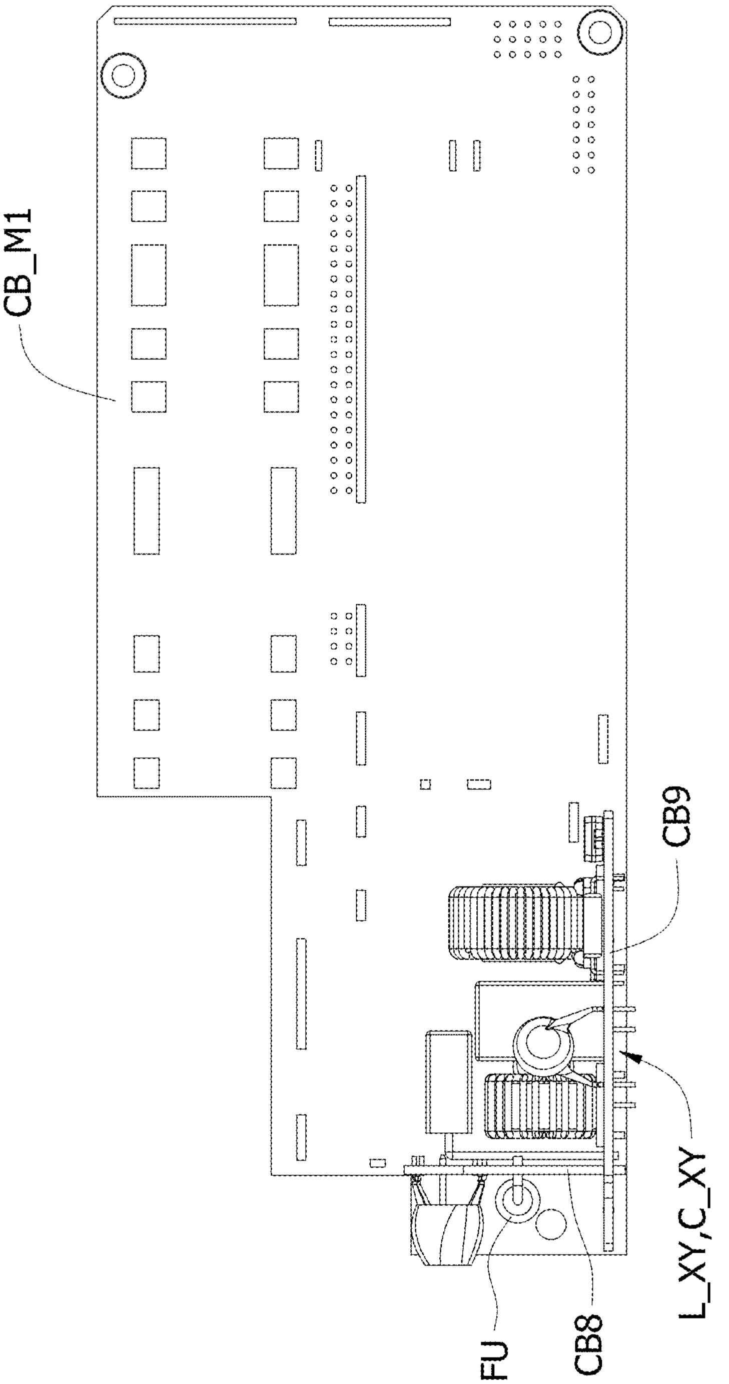
FIG. 28C is a top plan view of the input structure of the present disclosure plugged into the first main circuit board.

Please refer to FIG. 28A, which shows is a three-dimensional exploded view of the input structure of the present disclosure; please refer to FIG. 28B, which shows a three-dimensional assembled view of the input structure of the present disclosure; please refer to FIG. 28C, which shows a top plan view of the input structure of the present disclosure plugged into the first main circuit board, and also refer to FIG. 27. The input structure IN_S is plugged into the first main circuit board CB_M1 with the power conversion function, and the input structure IN_S includes the socket part SCT, an eighth circuit board CB8 and a ninth circuit board CB9. The socket part SCT may be coupled to a plug (not shown in the figure) and the live wire and the ground wire of the plug, and receives the AC power source V_AC provided by the live wire and the ground wire. The eighth circuit board CB8 is plugged into the socket part SCT, and the eighth circuit board CB8 is plugged into the ninth circuit board CB9. The ninth circuit board CB9 forms the electromagnetic interference suppression circuit EMI to suppress electromagnetic interference of the AC power source V_AC. In FIG. 28C, the eighth circuit board CB8 and the ninth circuit board CB9 are plugged into the first main circuit board CB_M1, so that the eighth circuit board CB8, the ninth circuit board CB9, and the first main circuit board CB_M1 form a three-dimensional vertical structure. The three-dimensional vertical structure refers to a structure in which the eighth circuit board CB8 and the ninth circuit board CB9 are vertical in any one of the X, Y, and Z directions.

Therefore, the socket part SCT is connected to the eighth circuit board CB8, and the eighth circuit board CB8 is connected to the electromagnetic interference suppression circuit EMI to replace the flying wires so as to increase the vertical layout space of the electromagnetic interference suppression circuit EMI, thereby increasing the power density of the input structure IN_S. In particular, the length and width of the eighth circuit board CB8 can correspond to (that is, be substantially equal to) the length and width of the socket part SCT, so that the base of the socket part SCT can be accommodated in the second accommodation SA2 of the casing CH, and the eighth circuit board CB8 can reasonably utilize the size of the base of the socket part SCT to increase the power density. In particular, in order to increase the power density, the socket module SK_M also uses the base of the socket part SCT to be inserted behind the eighth circuit board CB8, and the remaining space of the eighth circuit board CB8 is used to configure the fuse FU and other filter circuits (such as but not Limited to Y capacitance) to increase power density.

On the other hand, the ninth circuit board CB9 may be configured with at least one filter inductor L_XY and at least one filter capacitor C_XY to form an electromagnetic interference suppression circuit EMI. The height of the filter inductor L_XY and the filter capacitor C_XY is less than or equal to the height of the eighth circuit board CB8, and the width of the filter inductor L_XY and the filter capacitor C_XY is less than or equal to the width of the ninth circuit board CB9. Specifically, the height of the eighth circuit board CB8 refers to the specific height from the side of the eighth circuit board CB8 away from the ninth circuit board CB9 to the ninth circuit board CB9 after the eighth circuit board CB8 is vertically connected to the ninth circuit board CB9. Similarly, the width of the ninth circuit board CB9 refers to the specific width from one side of the ninth circuit board CB9 away from the first main circuit board CB_M1 to the other side after the ninth circuit board CB9 is vertically plugged into the first main circuit board CB_M1. The volume formed by this specific height and specific width can just accommodate the larger filter inductor L_XY and filter capacitor C_XY, and also avoids that after the input structure IN_S is placed in the power supply PSU, the filter inductor L_XY or the filter capacitor C_XY protrudes and blocks the installation of other modules (i.e., the power factor corrector PFC and the surge suppression circuit CR_SU). In particular, the power factor corrector PFC may include an input structure IN_S to integrate the input structure IN_S into the power factor corrector PFC. In addition, the input structure IN_S can also be an independent modular circuit.

In FIG. 2, FIG. 13A to FIG. 14B, and FIG. 24 to FIG. 26D, since the first circuit board CB1 of the DC conversion module CR_DC is vertically inserted into the first main circuit board CB_M1, and the first circuit board CB1 is configured with the first switch bridge arm SA1_M and the rectification switches SR1,SR2; the sixth circuit board CB6 and the seventh circuit board CB7 of the power factor corrector PFC are also vertically inserted into the first main circuit board CB_M1, and the sixth circuit board CB6 and the seventh circuit board CB7 are respectively configured with a plurality of power switches S1-S4 and the rectification bridge arm SA_SR, the power supply PSU of the present disclosure centrally arranges the main heating components on the second side (i.e., above the axis X in FIG. 2). Therefore, by disposing the fan FN on the second side, the fan FN can easily dissipate heat to the first switch arm SA1_M, the rectification switches SR1,SR2, the power switches S1-S4 and the rectification arm SA_SR.

Specifically, since the first circuit board CB1, the sixth circuit board CB6 and the seventh circuit board CB7 are all vertically inserted into the first main circuit board CB_M1, by adjusting the circuit design, the first circuit board CB1, the sixth circuit board CB6, and the seventh circuit board CB7 may be arranged vertically with the fan FN, and each circuit board CB1, CB6, and CB7 may be arranged in parallel. Therefore, the second accommodation space SA2 may be located in the space above the axis X to form an air channel, and each circuit board CB1,CB6,CB7 is parallel to the air channel. Therefore, the fan FN can guide the airflow to the air channel formed by the respective circuit boards CB1,CB6,CB7 to dissipate heat to the first switch arm SA1_M, the rectification switches SR1,SR2, the power switches S1-S4, and the rectification arm SA_SR. On the other hand, the power supply PSU can also adjust the circuit design to keep the circuit boards CB1,CB6,CB7 in a staggered arrangement to increase the heat dissipation efficiency of the fan FN.

Accordingly, whether it is the power factor corrector PFC, the isolated conversion module CR_M, or the DC conversion module CR_DC of the power supply PSU of the present disclosure, they all use the upper space inside the power supply PSU for large power transmission, while small power signal transmission is carried out using a circuit board plugged into the first main circuit board CB_M1. Therefore, the large power and the small power of the power supply PSU can be completely separated. Therefore, the limited space can be fully utilized and the parasitic inductance on the path can be reduced, so that it is easy to achieve the principle of overlapping magnetic flux cancellation between the upper and lower layers on the wiring, and under high-frequency switching conditions, high-frequency noise can be suppressed and noise interference can be significantly reduced.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A direct-current (DC) conversion module comprising:
 a first main circuit board comprising a first plug port and a second plug port, and
 two first circuit boards respectively plugged into the first plug port and the second plug port, and each of the two first circuit boards comprising:
  a first primary-side circuit comprising a first switch bridge arm an inductor trace and an inductor core, and the inductor core sleeved on the inductor trace to serve as a resonant inductor,
  a first secondary-side circuit, and
  a first transformer comprising a first primary-side trace, a first secondary-side trace, and a first iron core, and the first iron core sleeved on the first primary-side trace and the first secondary-side trace to serve as the first transformer, and
 a first controller coupled to the first switch bridge arm, and configured to provide a plurality of first control signals to control the first switch bridge arm,
 wherein a phase difference between the first control signals is 180 degrees, and the two first circuit boards are coupled to each other through the first plug port and the second plug port to form an interleaved DC conversion module, and
 wherein the first primary-side circuit of each of the two first circuit boards are a half-bridge structure, the inductor traces of the first circuit boards and the first primary-side traces form a series-connected structure through the first main circuit board, and the first primary-side circuit of each of the two first circuit boards form a parallel-connected structure through the first main circuit board.

2. The DC conversion module as claimed in claim 1, wherein each of the two first circuit boards further comprises:
 a first power input terminal, and the first power input terminal of each of the two first circuit boards respectively forming on first side of each of the two first circuit boards and second side opposite to the first side of each of the two first circuit boards, and
 a first power output terminal, and the first power output terminal of each of the two first circuit board forming on the first side or the second side, and the first power output terminal of each of the two first circuit boards respectively plugged into the first plug port and the second plug port,
 wherein the first power input terminal is coupled to the first switch bridge arm, and the first power output terminal is coupled to the first secondary-side circuit.

3. The DC conversion module as claimed in claim 2, wherein the first power input terminal of each of the two first circuit boards comprises:
 a positive input terminal forming on the first side or the second side, and
 a negative input terminal forming on one side opposite to the positive input terminal,
 wherein one of the positive input terminal and the negative input terminal is coupled to a bus capacitor through a first power copper bus, and the other one of the positive input terminal and the negative input terminal is coupled to the bus capacitor through the first main circuit board.

4. The DC conversion module as claimed in claim 2, wherein the first power output terminal of each of the two first circuit boards comprises:
 a plurality of positive output terminals forming on the first side or the second side, and
 a plurality of negative output terminals forming on the same side as the positive output terminals,
 wherein the positive output terminals and the negative output terminals are correspondingly plugged into the first plug port or the second plug port to form a parallel-connected structure of the first secondary-side circuits of the first circuit boards.

5. The DC conversion module as claimed in claim 4, wherein the positive output terminals and the negative output terminals are staggered configuration.

6. The DC conversion module as claimed in claim 4, wherein the DC conversion module further comprises:

a first copper bar disposed on the first main circuit board, and the first copper bar comprising a plurality of first terminals, and the first terminals configured to be plugged by the positive output terminals, and a second copper bar disposed on the first main circuit board, and the second copper bar comprising a plurality of second terminals, and the second terminals configured to be plugged by the negative output terminals, wherein the first terminals and the second terminals correspondingly form the first plug port or the second plug port, and the first terminals and the second terminals are staggered configuration.

7. The DC conversion module as claimed in claim 6, wherein the first copper bar comprises:

a first copper bar segment comprising a plurality of first extension segments, and the first extension segments respectively forming the first terminals, wherein the second copper bar comprises:

a second copper bar segment comprising a plurality of second extension segments, and the second extension segments respectively forming the second terminals.

8. The DC conversion module as claimed in claim 6, wherein the first terminals and the second terminals respectively form a recess, and the recesses are configured to respectively accommodate the positive output terminals and the negative output terminals.

9. The DC conversion module as claimed in claim 6, wherein the recesses on the same side of the first copper bar segment and the second copper bar segment are arranged in a line to be plugged by the first power output terminal of each of the first power input terminals with a plate-like structure.

10. The DC conversion module as claimed in claim 6, wherein the shapes of the first copper bar segment and the second copper bar segment are the same, and one of the first copper bar segment and the second copper bar segment is stacked on the other one of the first copper bar segment and the second copper bar segment.

11. The DC conversion module as claimed in claim 6, wherein the DC conversion module further comprising:

an output port forming a golden finger structure, and the golden finger structure comprising a positive connection terminal and a negative connection terminal, wherein the positive connection terminal is coupled to the first copper bar and the negative connection terminal is coupled to the second copper bar.

12. The DC conversion module as claimed in claim 11, wherein the golden finger structure further comprises:

an auxiliary terminal arranged on one side segment of the golden finger structure, and configured to provide a signal or an auxiliary power source, wherein the positive connection terminal and the negative connection terminal are respectively arranged on a middle segment and the other side segment of the golden finger structure.

13. The DC conversion module as claimed in claim 11, wherein the first copper bar further comprises:

a first high segment arranged to be farther away from the first main circuit board than the first copper bar segment, wherein the second copper bar further comprise:

a second high segment arranged to be farther away from the first main circuit board than the second copper bar segment, wherein the first main circuit board comprises:

a fixing part configured to firmly fix the output port, and the first high segment and the second high segment configured to provide a position limiting to the output port through a specific stacked structure.

14. The DC conversion module as claimed in claim 13, wherein the first high segment and the first copper bar segment are integrally formed, and the second high segment and the second copper bar segment are integrally formed.

* * * * *